(12) United States Patent
Parker

(10) Patent No.: US 7,435,956 B2
(45) Date of Patent: Oct. 14, 2008

(54) APPARATUS AND METHOD FOR INSPECTION AND TESTING OF FLAT PANEL DISPLAY SUBSTRATES

(75) Inventor: N. William Parker, Pleasanton, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 191 days.

(21) Appl. No.: 11/225,376

(22) Filed: Sep. 12, 2005

(65) Prior Publication Data

US 2006/0145087 A1 Jul. 6, 2006

Related U.S. Application Data

(63) Continuation-in-part of application No. 11/093,000, filed on Mar. 28, 2005, now Pat. No. 7,227,142.

(60) Provisional application No. 60/608,609, filed on Sep. 10, 2004.

(51) Int. Cl.
*H01J 37/28* (2006.01)
*H01J 37/147* (2006.01)

(52) U.S. Cl. .............. 250/310; 250/398; 250/492.2

(58) Field of Classification Search ............... None
See application file for complete search history.

(56) References Cited

U.S. PATENT DOCUMENTS

| | | | | |
|---|---|---|---|---|
| 4,342,949 A * | 8/1982 | Harte et al. | ................... | 315/409 |
| 4,742,234 A | 5/1988 | Feldman et al. | | |
| 4,902,898 A | 2/1990 | Jones et al. | | |
| 5,276,330 A * | 1/1994 | Gesley | ................... | 250/396 R |
| 5,430,292 A | 7/1995 | Honjo et al. | | |
| 5,466,940 A * | 11/1995 | Litman et al. | ................ | 250/397 |
| 5,608,218 A | 3/1997 | Sato et al. | | |
| 5,644,132 A | 7/1997 | Litman et al. | | |
| 5,982,190 A | 11/1999 | Toro-Lira | | |
| 6,075,245 A | 6/2000 | Toro-Lira | | |
| 6,734,428 B2 | 5/2004 | Parker et al. | | |
| 6,777,675 B2 | 8/2004 | Parker et al. | | |
| 6,797,953 B2 * | 9/2004 | Gerlach et al. | ............... | 250/310 |
| 6,844,550 B1 | 1/2005 | Yin et al. | | |
| 6,878,936 B2 | 4/2005 | Kienzle et al. | | |
| 6,943,351 B2 | 9/2005 | Parker | | |
| 6,977,375 B2 | 12/2005 | Yin et al. | | |
| 2005/0001165 A1 | 1/2005 | Parker et al. | | |

OTHER PUBLICATIONS

Reimer, L., Scanning Electron Microscopy, 2nd ed., Springer-Verlag, 1998, ISBN: 3-540-63976-4,pp. 147-153.

* cited by examiner

*Primary Examiner*—Jack I Berman
(74) *Attorney, Agent, or Firm*—David H. Jaffer; Pillsbury Winthrop Shaw Pittman LLP

(57) ABSTRACT

A charged particle optical system for testing, imaging or inspecting substrates comprises: a charged particle optical assembly configured to produce a line of charged particle beams equally spaced along a main scan axis, each beam being deflectable through a large angle along the main scan axis; and linear detector optics aligned along the main scan axis. The detector optics includes a linear secondary electron detector, a field free tube, voltage contrast plates and a linear backscattered electron detector. The large beam deflection is achieved using an electrostatic deflector for which the exit aperture is larger than the entrance aperture. One embodiment of the deflector includes: two parallel plates with chamfered inner surfaces disposed perpendicularly to the main scan axis; and a multiplicity of electrodes positioned peripherally in the gap between the plates, the electrodes being configured to maintain a uniform electric field transverse to the main scan axis.

28 Claims, 38 Drawing Sheets

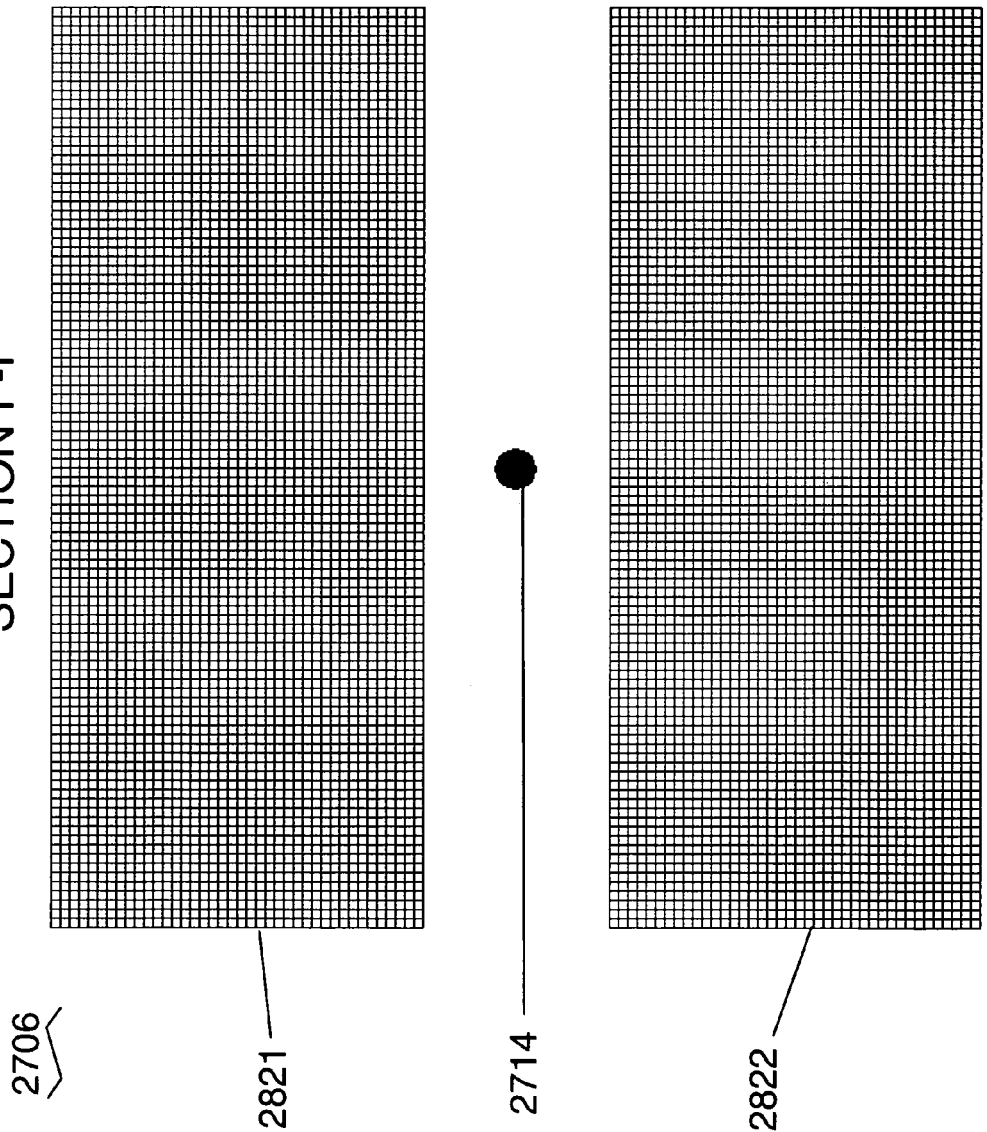

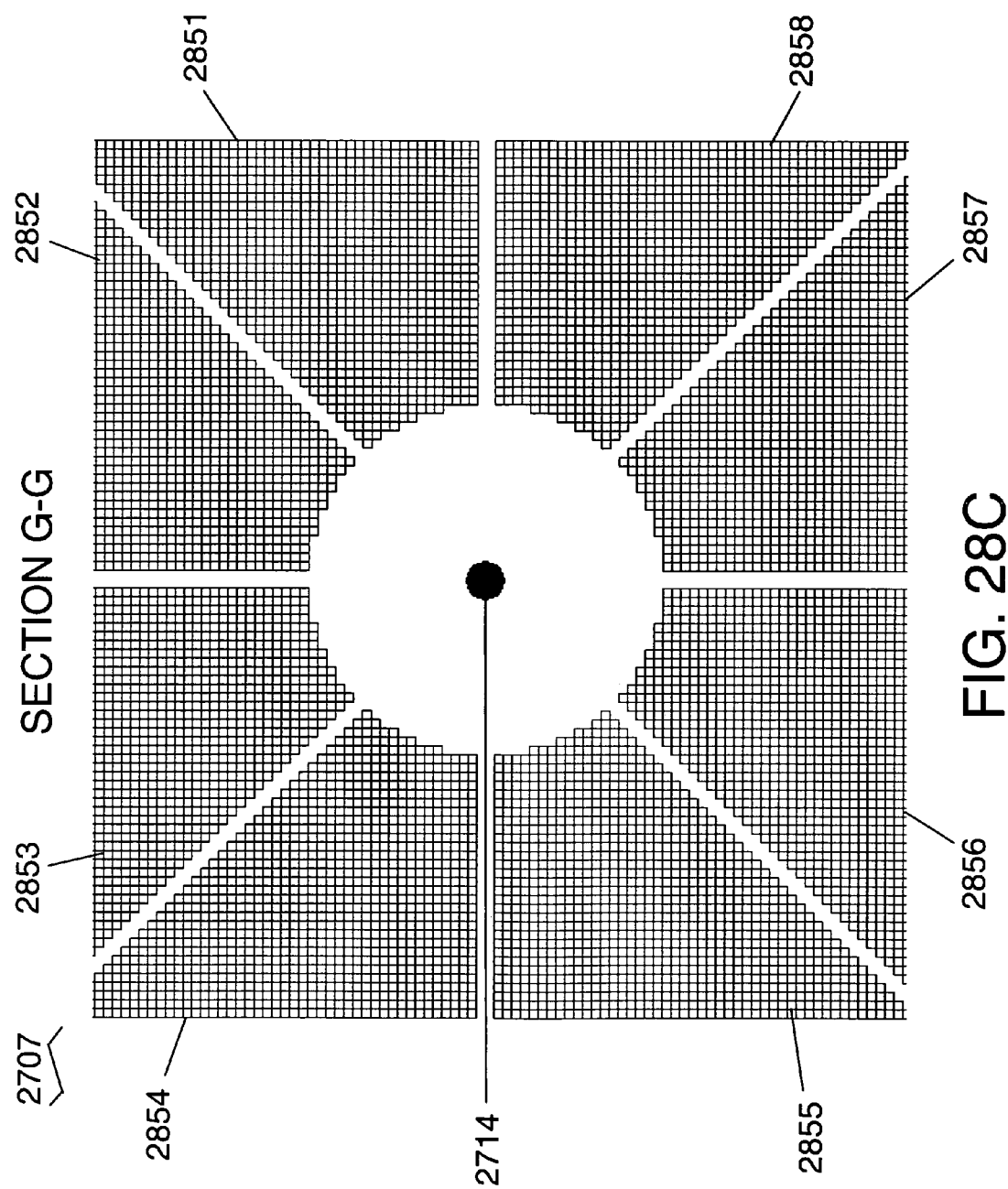

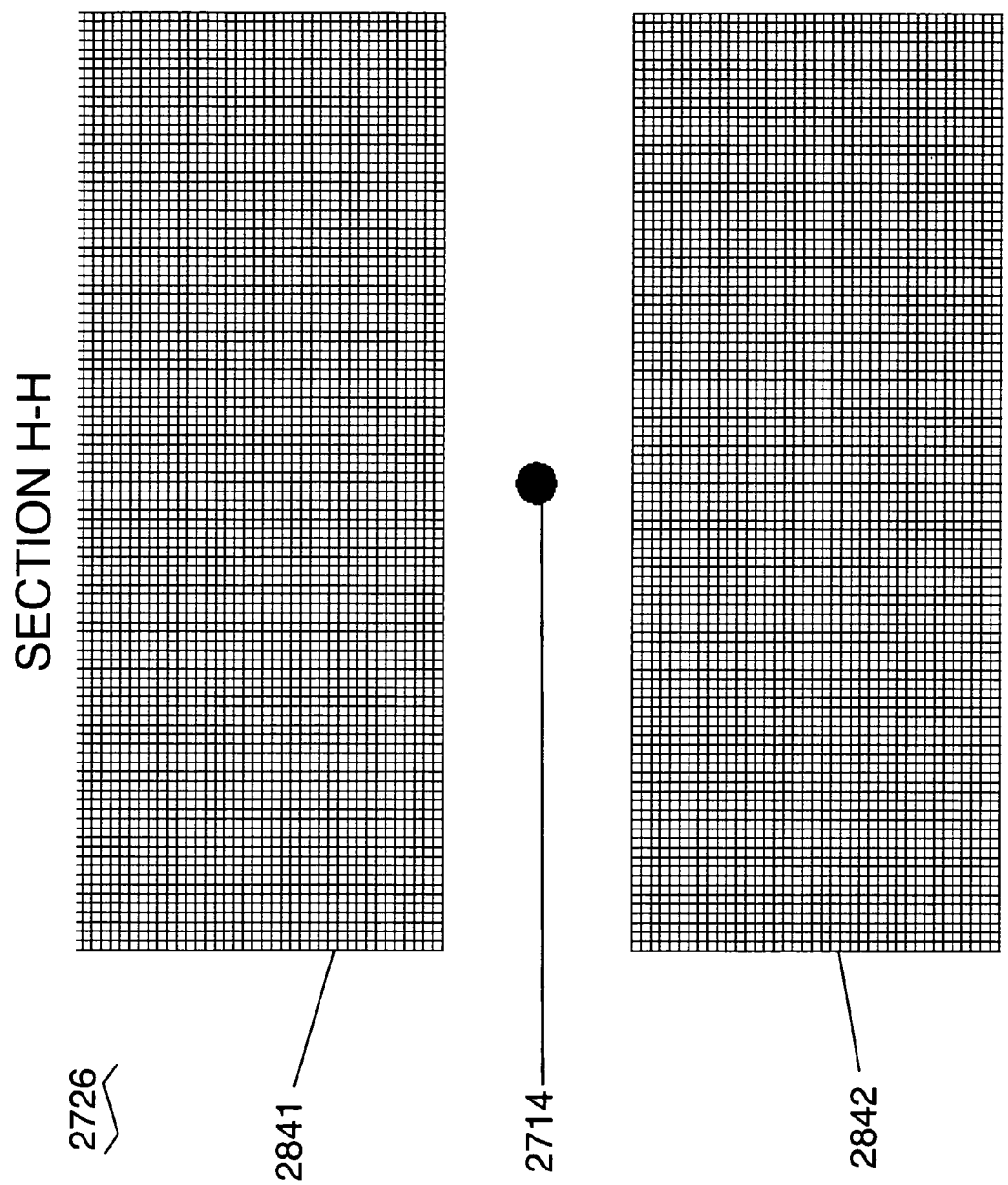

APPARATUS AND METHOD FOR INSPECTION AND TESTING OF FLAT PANEL DISPLAY SUBSTRATES

CROSS-REFERENCE TO RELATED APPLICATIONS

This application claims the benefit of U.S. Provisional Application Ser. No. 60/608,609 filed Sep. 10, 2004 and U.S. application Ser. No. 11/093,000 filed Mar. 28, 2005, both incorporated by reference herein.

BACKGROUND OF THE INVENTION

1. Field of the Invention

This invention relates to the field of electron optics, and in particular to electron beam testing of large substrates such as flat panel display substrates.

2. Description of the Related Art

The use of electron beams to inspect and electrically test flat panel display substrates is an established technique. The different testing strategies may be characterized by the method of obtaining the test signal from each pixel in the display: mechanical probe testing; electron-beam probe testing; and voltage imaging.

Mechanical probe testing of a flat panel display substrate is illustrated in FIG. 1. During manufacture, all the signal lines 110 on the display substrate are connected together to one or more signal line shorting bars 106. Similarly, all the gate lines 112 are connected together to one or more gate line shorting bars 108. To connect the mechanical probe testing system to shorting bar 106, a mechanical probe 105 physically contacts the signal line shorting bar 106 and also is connected to the system ground, as shown. A second mechanical probe 107 connects to the gate line shorting bar 108 and is also connected to voltage supply 114. Pixel electrode 103 is connected to the control transistor 111 by line 109 and to an electrometer 104 by means of support arm 101 and a mechanical probe 102. The voltage on the pixel electrode 103 is measured by the electrometer 104. The physical probe 102 supplies a testing current to the pixel electrode 103 and hence to the control transistor 111. Testing of the pixel electrode 103 and control transistor 111 is then performed by monitoring the electrical response to the charging current using the electrometer 104. Capacitor 113 is formed by the overlap between the gate electrode of the control transistor 111 and the pixel electrode 103. Typical measurements made include the following: absence/presence of shorting between neighboring pixel electrodes, breaks or shorts in the connections to the control transistor 111, excessive leakage currents due to too-low isolation resistance in the pixel electrode 103. The signature of a properly-functioning pixel drive circuit is characterized, as well as the signatures resulting from various pixel malfunctions, such as shorted or open lines, degraded insulating regions within the pixel element, neighboring pixel elements shorted together, etc. Thus mechanical probe testing allows identification of various pixel defects.

Electron-beam probe testing is illustrated in FIG. 2 and is similar to mechanical probe testing, described above, except the third mechanical probe 102 (shown in FIG. 1) has been replaced by an electron beam 120 which supplies the charging current to the pixel element 103. Secondary electrons 121 emitted from the pixel electrode 103 are collected by detector 122 to form a voltage contrast signal (similar to the signal generated by electrometer 104 in FIG. 1). The many advantages of electron-beam probe testing over mechanical probe testing are: no-contact and thus no risk of contact damage; faster selection between pixel elements to test; and the opportunity for fast rechecking of all pixels failing a first-pass testing procedure. The electron beam 120 is generated by an electron optical column; there are some examples in the prior art of testing systems with multiple columns (typically 2-4), each column producing a single electron beam.

Voltage imaging is illustrated in FIG. 3, where all the pixels in display substrate 150 are being inspected in parallel. Light 156 from light source 155 illuminates a splitter mirror 153. Reflected light 157 off the upper surface of the splitter mirror 153 illuminates the under surface of an electro-optic modulator 152. An optional interface card 151 may be interposed between the display substrate 150 and the upper surface of the electro-optic modulator 152 to improve the coupling of the voltages on the display substrate 150 to the electro-optic modulator 152. Due to the electro-optic interaction of the voltages on the display substrate 150 with the modulator 152, the reflectivity of light 157 off the lower surface of the modulator 152 is affected. Light 158 represents that fraction of light 157 which is not reflected off the splitter 153, instead passing downwards through the beam splitter 153 to be collected by a CCD camera 154, which is coupled to display electronics (not shown) to generate a voltage image of the display substrate 150. A significant disadvantage of this method is the need to fabricate a new modulator 152 for each new display design.

All three of the flat panel display substrate testing systems and methods described above suffer from throughput limitations which will only get worse as the size of display substrates continues to increase. There is a need for flat panel display substrate testing systems and methods that have higher throughput and that are more readily scalable to larger substrates.

SUMMARY OF THE INVENTION

The present invention provides a multiple column charged particle beam system for the inspection, imaging or testing of a variety of substrates, including but not limited to flat panel display substrates. A charged particle optical apparatus for generating a plurality of electron beams with full-width half-maximum (FWHM) diameters in the μm diameter range, each capable of being vectored over distances exceeding 125 mm along one axis is disclosed. One advantage of this apparatus is the ability to image the full width of a flat panel display substrate by means of secondary electrons collected with high voltage contrast. Another advantage of the apparatus is enhanced throughput, which is roughly proportional to the number of beams which can simultaneously inspect the substrate. The present invention is easily scalable to any width substrate and to larger numbers of beams, thereby achieving extendibility to future generations of display substrates. Each of the plurality of electron beams is scanned independently of the others, enabling a two-step inspection process to be performed. In step (1), the beams are vectored in a serpentine pattern (for example, pattern 311 in FIG. 5B) across the substrate surface, sequentially inspecting pixel elements 310 for proper electrical performance. In step (2), those pixel elements demonstrating non-ideal electrical characteristics during step (1) are reinspected at higher spatial resolutions in a raster-scanned imaging mode, or retested over a longer time for electrical performance. Steps (1) and (2) may be performed alternately on successive pixels, successive scan lines or in other alternating sequences.

According to aspects of the invention, a charged particle optical system for testing, imaging or inspecting substrates, comprises: a charged particle optical assembly configured to produce a line of equally spaced charged particle beams, the line being along a main scan axis, each beam being focused on a specimen plane and deflectable through a large angle along the main scan axis; linear detector optics aligned along the main scan axis, the detector optics being positioned between the optical assembly and the specimen plane, the detector optics including: a linear secondary electron detector and a field free tube configured to shield the charged particle beams from the electric field associated with the secondary electron detector. The detector optics may also include voltage contrast plates with an aperture aligned along the main scan axis and a linear backscattered electron detector.

According to further aspects of the invention the large angle deflection of the charged particle beams is achieved by an electrostatic deflector for each beam, where the exit aperture of the deflector has a larger area than the entrance aperture. In a first embodiment the deflector has a conically shaped interior surface. In a second embodiment the deflector comprises: two parallel plates with chamfered inner surfaces disposed perpendicularly to the main scan axis; and a multiplicity of electrodes positioned peripherally in the gap between the plates, the electrodes being configured to maintain a uniform electric field transverse to the main scan axis.

Further aspects of elements of the charged particle optical assembly of the invention are detailed below.

Beam-Defining Aperture—the apparatus disclosed in the first embodiment herein employs a 25 µm diameter beam-defining aperture (BDA) 505 at the exit of the electron gun. This aperture has two functions: (1) it serves to control the beam current and beam diameter at the substrate by restricting the electron trajectories transmitted to the substrate to correspond to half-angles subtended at the tip over ranges varying from 0.0°-0.8° to 0.0°-1.4°, and (2) it serves as a very low transmittance pumping barrier between the electron gun vacuum chamber and the accelerating region vacuum chamber, allowing the electron gun vacuum chamber to maintain a considerably (>100×) better vacuum than that in the accelerating region vacuum chamber.

Blanking System—the blanking system employs a design for the blanking electrodes 721 and 722 in FIG. 9B which minimizes induced astigmatism in the beam 514 and simultaneously minimizes the capacitance between the two blanking electrodes 721 and 722, thereby maximizing blanking speed. A two-electrode blanker 506 is used with a crossover 701 formed at the center of the blanker 506 by the source lens. Since the BDA 505 is at the exit of the gun (ahead of the blanker 506), the beam current at the blanker is minimized, thereby reducing both the Loeffler and Boersch space-charge effects due to electron-electron interactions at the crossover.

Alignment Deflector—after the blanker, an electrostatic octupole (electrodes 751-758 in FIG. 9E) is positioned for use in aligning the beam emerging from the gun with the main lens. The alignment deflector 507 can image the blanking and pumping aperture 509, facilitating alignment.

Accelerating Region—following the alignment deflector, the beam is linearly accelerated from 568 eV up to 6000 eV in the accelerating region 213.

Blanking and Pumping Aperture—at the exit from the accelerating region, a 60 µm diameter blanking and pumping aperture (BPA) 509 is located, having two functions: (1) it is the blanking aperture, onto which the beam is directed by the blanker to turn off the beam current at the substrate, and (2) it is a second very low transmittance pumping aperture allowing the accelerating region vacuum chamber to maintain a considerably (>100×) better vacuum than that in the lower column vacuum chamber.

Main Lens—to form Gaussian beams with FWHMs ranging from 2-10 µm diameter on the substrate surface across a wide range of positions off-axis (at least ±63 mm), the present invention employs a three-element main lens structure in which the beam is accelerated from 6000 eV up to 20 keV in energy, while simultaneously being focused on the substrate surface. As the beam is scanned across a >125 mm scan width, the lens excitation (voltage on main lens electrode #2 511) is changed to correct for curvature of field.

Main Deflector/Stigmator—the first embodiment of present invention employs a main deflector/stigmator 513 optimized for the requirement to deflect the patterned beam a large angle (>±12.5°) off-axis. The deflector design employs a single octupole (electrodes 801-808 in FIGS. 10A and 10B) with a cylindrical upper bore (where the beam is still near the axis) followed by an expanding conical bore where the beam is several mm off-axis. The excitation of the main deflector/stigmator elements 801-808 is a combination of a rotatable electrostatic dipole which deflects the beam and a rotatable electrostatic quadrupole which stigmates the beam during deflection.

Detector Optics—the detector optics are designed to facilitate a wide scan field in each column, enabling stitching of neighboring scans together to achieve 100% inspection across the width of the substrate. In the first embodiment of the present invention, secondary electrons are collected with ~42% efficiency in the absence of surface charging. With negative surface charging, the collection efficiency is enhanced up to >63% (at −4 V charging), while with positive charging, the collection efficiency is reduced to <21% (at +4 V charging). This variation in collection efficiency enables the electron beam to function as a contactless probe of surface voltage on the substrate. Coupled with mechanical motion of the substrate perpendicular to the array of columns, inspection and testing of 100% of the substrate area is possible.

Control System—the control system for the multicolumn optics accommodates a number of optical elements that are in common for all columns, and thus may be controlled by single controls, while other optical elements require individual controls, one for each column.

Novel aspects of the present invention include the following: (1) an electron optical column array structure integrated within one block to produce a large number of beams for use in inspection of flat panel display substrates or other large structures, where each beam is capable of scanning a wide field of view in one dimension and can stitch precisely with the neighboring beams, (2) a method of raising the inspection throughput by increasing the number of columns arrayed in the column assembly, while preserving the one block column structure, (3) an electron optical design enabling rapid electronic toggling between larger and smaller electron beams for two-pass inspection, (4) a secondary electron (SE) detector optics design enabling the accurate measurement of surface charging voltages by means of the modulation of the secondary electron collection efficiency at the SE detector, (5) an electron optical column design employing two small apertures, enabling a double-differential pumping scheme to preserve ultra-high vacuum in the source region, with several orders of magnitude lower vacuum in the lower column region, (6) a beam blanker design with (a) very low capacitance (thereby improving blanking speeds) and (b) entrance and exit faces preserving the cylindrical symmetry of the column (thereby reducing astigmatism), and (7) a graded vacuum seal at the interface between the column assembly and the substrate being inspected, thereby (a) eliminating the need to place the entire substrate within a high-vacuum chamber (which eliminates the need for high-vacuum loadlocks) and also (b) reducing substrate charging through the interaction of the substrate surface with the ambient gas. A second embodiment of the present invention disclosed herein employs an optical design with the following differences from the first embodiment:

1) The beam acceleration occurs within the electron gun, ahead of the blanker and aligner.
2) The beam crossover at the blanker is eliminated and the beam diameter is increased between the tip and the substrate.
3) The beam blanker is a double-deflection design, capable of conjugate blanking without the need for a crossover at the center of the blanker.
4) The blanker electrodes are simplified to parallel flat plates.
5) The stigmator is a separate optical element from the deflector.
6) The stigmator is a dodecapole, capable of correcting both first- and second-order astigmatism.
7) The deflector is optimized for a large deflection along one axis, consistent with the proposed serpentine beam scanning strategy.
8) The detector optics has two detectors, one solely for secondary electrons (SEs), and the other solely for backscattered electrons (BSEs).
9) The working distance below the column is increased to 20 mm.

The benefits of the second embodiment relative to the first embodiment of the present invention include:

1) Minimized space-charge scattering of the beam within the column, due to the absence of a crossover, the larger beam diameter and the higher beam energy in the column.
2) Improved immunity of the test signal to beam current fluctuations using the SE/BSE signal ratio.
3) Improved beam spot circularity with the ability to correct both first- and second order astigmatism.
4) Improved clearance between the column and the substrate to allow the use of a pallet assembly integrating connections to the shorting bars on the substrate upper surface.

The multi-column multi-beam technology embodied in the present invention provides a means for increasing throughput for next generation substrates (so-called "Gen-7") as well as future, even larger, substrates. In addition, the number of beams generated by the column assembly can be increased substantially with a relatively small increase in system complexity.

BRIEF DESCRIPTION OF THE FIGURES

FIG. 28B shows section F-F through upper blanker 2706 in FIG. 28A.

FIG. 28C shows section G-G through alignment deflector 2707 in FIG. 28A.

FIG. 28D shows section H-H through lower blanker 2726 in FIG. 28A.

DETAILED DESCRIPTION

The invention disclosed herein is a multiple column charged particle system for the inspection, imaging or testing of a variety of substrates, including but not limited to flat panel display substrates. The system can be optimized for use with either ion or electron beams. The optical components of the system are typically electrostatic elements which can be fabricated on a millimeter scale. This invention will be discussed in detail as optimized for electron beams and its implementation in the field of flat panel display substrate inspection and testing will be used as an illustrative example.

Figure 1:
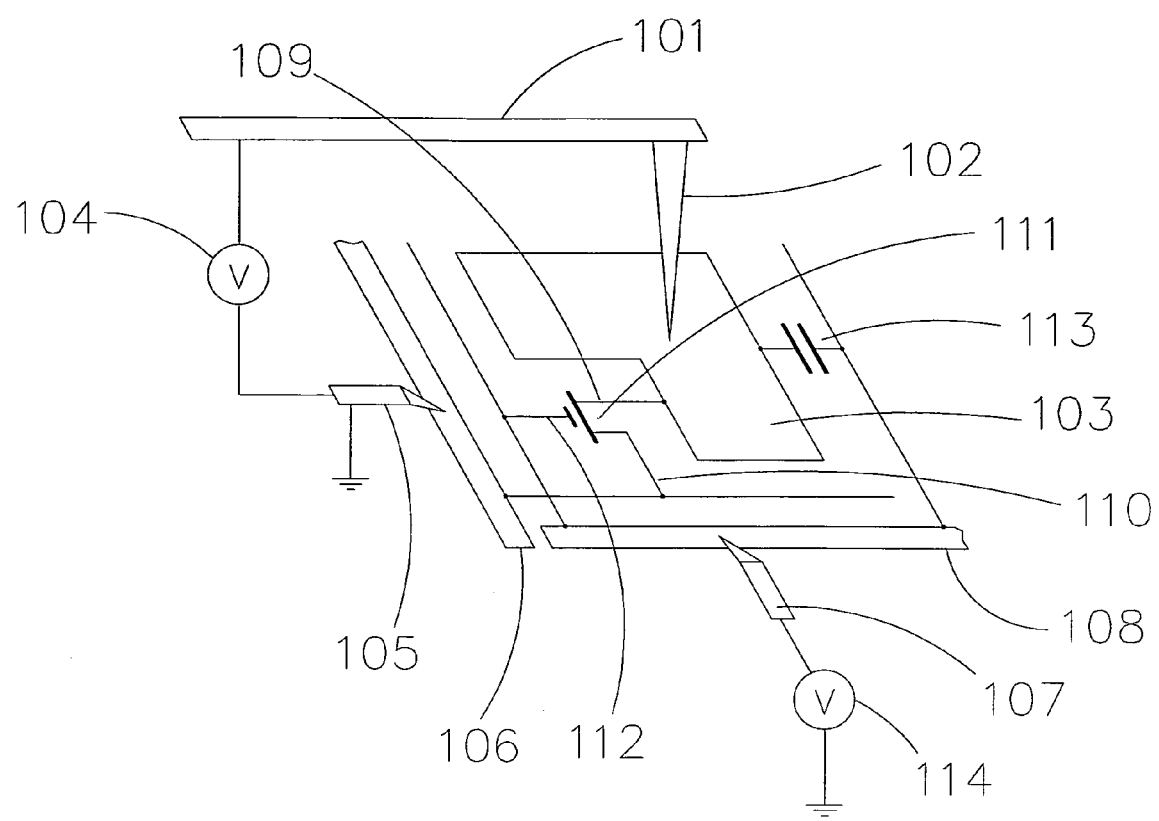
FIG. 1 shows an example of prior art for testing flat panel display substrates utilizing mechanical probing.
Figure 2:
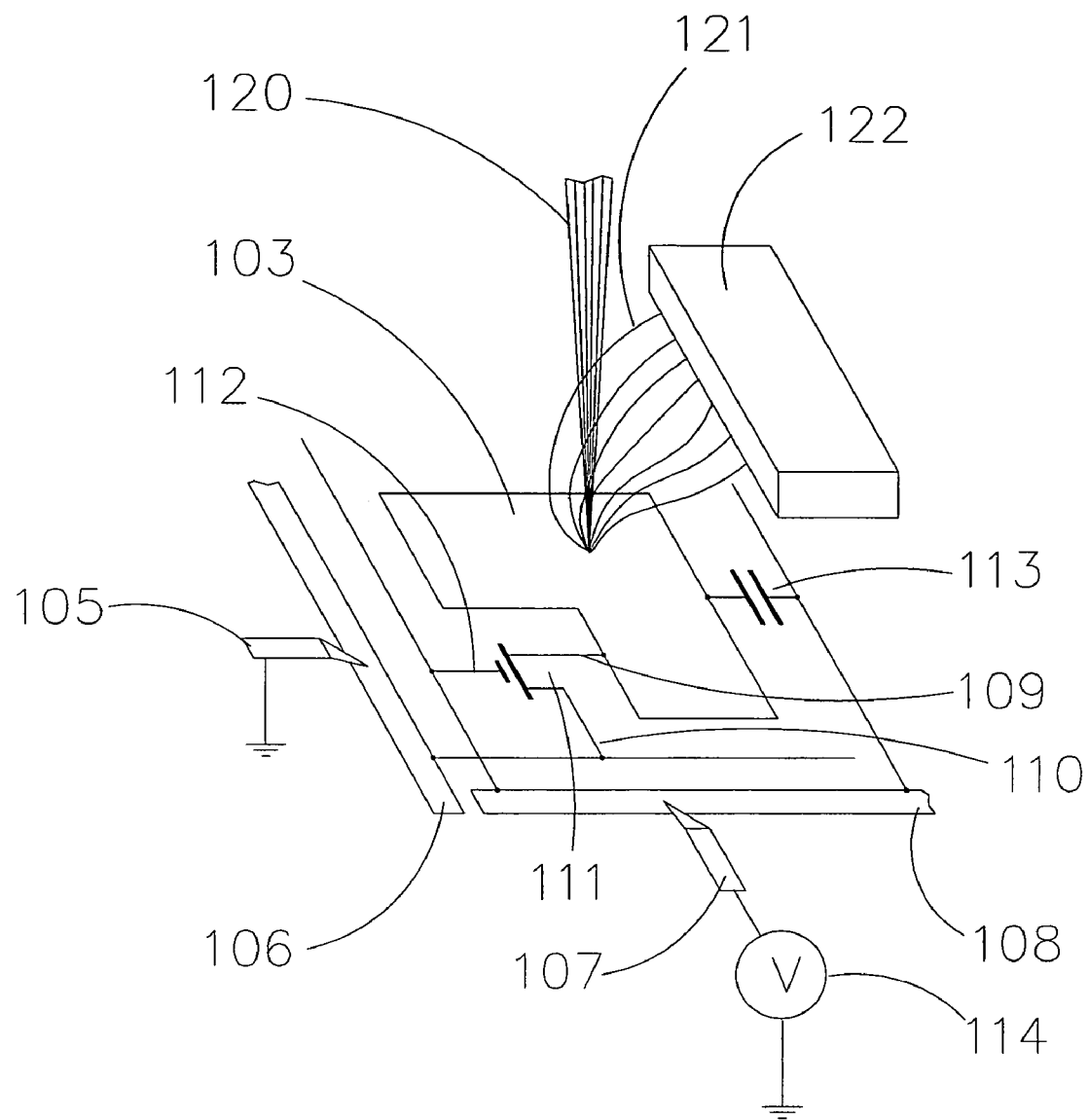
FIG. 2 shows an example of prior art for testing flat panel display substrates utilizing electron-beam probing.
Figure 3:
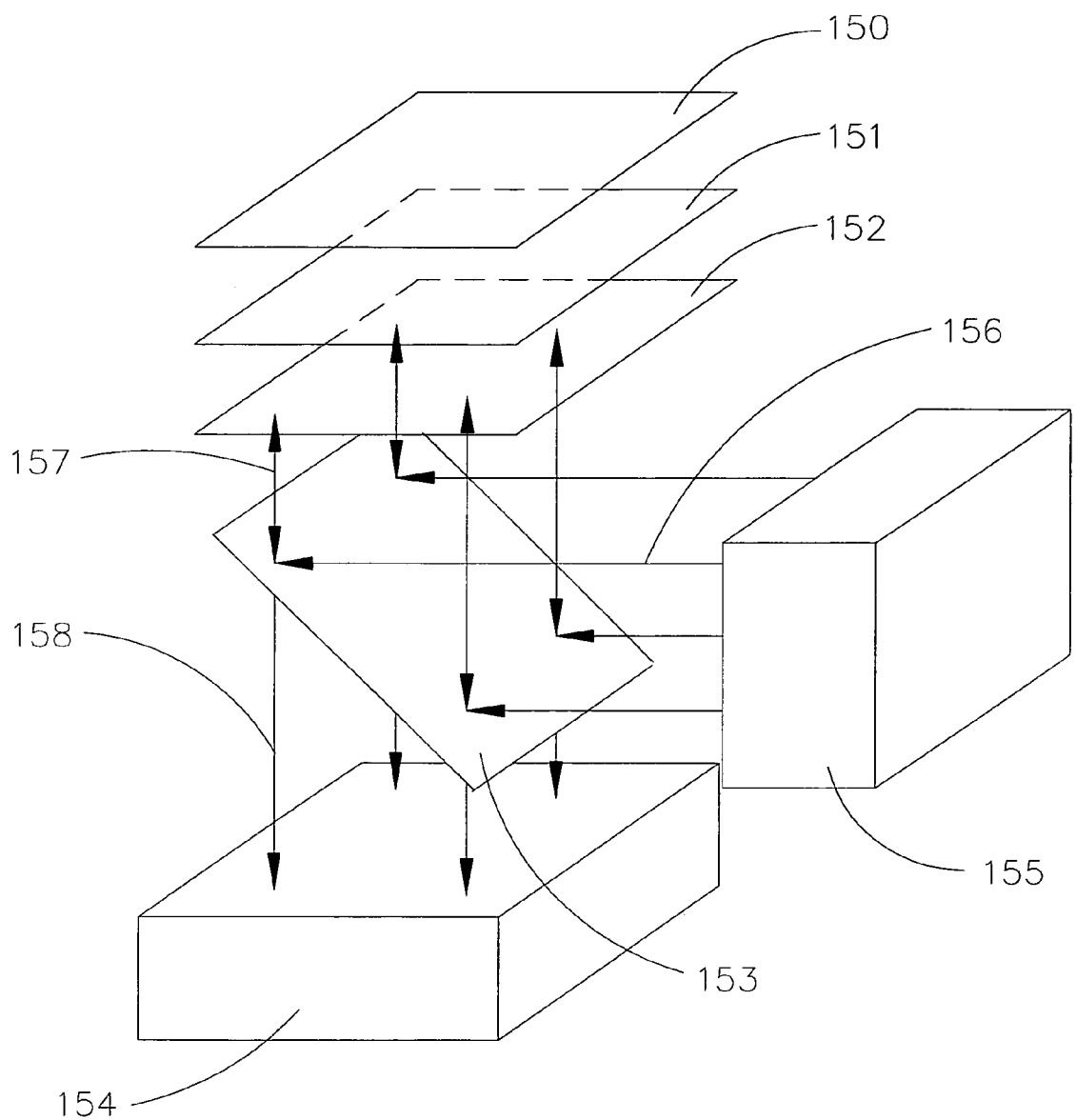
FIG. 3 shows an example of prior art for testing flat panel display substrates utilizing voltage imaging.

During the manufacture of flat panel displays, for many early steps the displays are part of a larger flat panel display substrate, typically containing six or more displays in progress. Although the geometries of the pixels in the display are far larger than the current state-of-the-art in semiconductor wafer fabrication, in a flat panel display, nearly every pixel must function correctly for acceptable performance. Seventh generation flat panel display substrates are very large (typically 1870 mm×2200 mm) with a number of large displays on each. All of the signal lines on each of the displays are connected to "shorting bars" which lead to the edge of the substrate. All of the gate lines are similarly connected. To test the individual pixels in the displays on the substrate, some method of introducing current into individual pixel elements is required, either mechanical or electrical (see FIGS. 1-3).

Figure 4A:
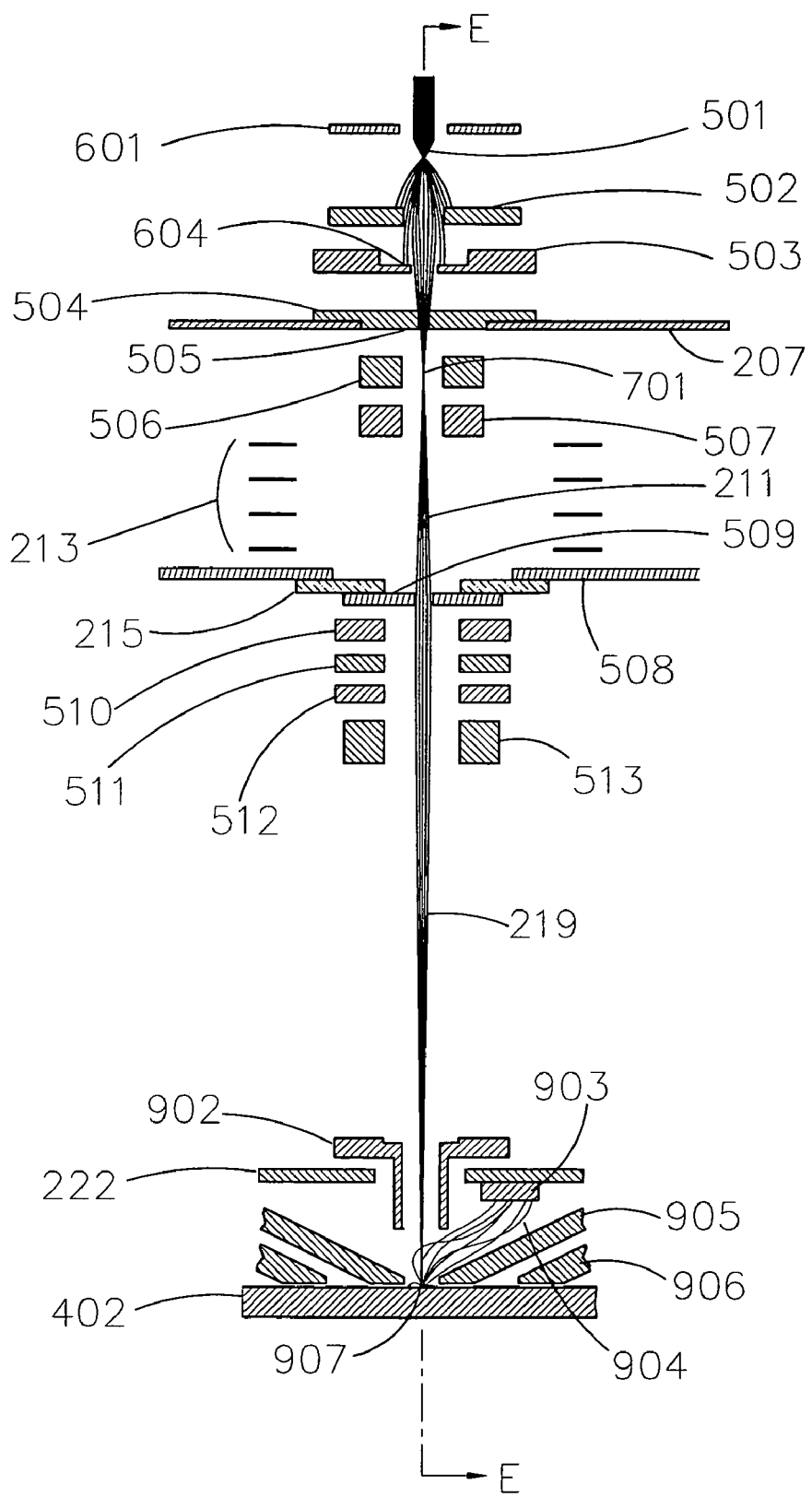
FIG. 4A shows a schematic cross-section of a first embodiment of an electron optical column assembly in a plane containing the optical axis of one column and perpendicular to the main scan axis.

FIG. 4A shows one of a multiplicity of columns which comprise the multiple column system of the invention. FIG. 4A shows a schematic cross-section of an electron optical column assembly in a plane containing the optical axis of one column and perpendicular to the main scan axis. Electrons are emitted by the source tip 501 under the influence of a high electric field generated by the voltage difference between the tip 501 and the extraction electrode 502, typically 2700-3400 V. The suppressor electrode 601 is typically biased negative relative to the tip 501 to suppress electron emission from the shank (upper cylindrical portion) of the tip 501, since this emission cannot be used to form the electron beam. The gun chamber is the vacuum enclosure containing the tip 501, suppressor 601, extraction electrode 502, source lens electrode 503, beam-limiting aperture (BLA) 604, and the upper surface of the source plate 504—the gun chamber is separately pumped from the accelerating region vacuum chamber (see below). The beam-defining aperture (BDA) 505 serves as a pumping aperture between the gun chamber and the accelerating region vacuum chamber. The source lens comprises the extraction electrode 502, the source lens electrode 503, the BLA 604, and the source plate 504. Depending on the voltage applied to the source lens electrode 503, the source lens will transmit rays through the BDA 505 with initial half-angles at the source tip 501 over ranges varying from 0.0°-0.8° to 0.0°-1.4°. The electron gun is mounted on gun mounting plate 207.

Electrons passing through the BDA 505 enter the beam blanker 506, where the beam 211 is focused to a crossover 701 by the source lens. In the column shown in FIG. 4A, the blanker 506 is inactivated, so the beam 211 is not deflected off the optical axis, and passes through the blanking and pumping aperture (BPA) 509 and into the main lens. The alignment deflector 507 is used to correct for any misalignments of the column by steering the beam 211 into the BPA 509. Between the alignment deflector 507 and the BPA 509 are a set of accel plates 213 which are biased with a linear voltage gradient, starting from the voltage on the alignment deflector 507 and increasing to the voltage on the BPA 509, thereby forming the accelerating region. The accelerating region is enclosed in the accelerating region vacuum chamber, which is separately pumped from the gun vacuum chamber and the lower vacuum chamber—the upper boundary of the accelerating region vacuum chamber is the BDA 505 and the lower boundary is the BPA 509. Both the BDA 505 and the BPA 509 have very low pumping speeds, allowing good vacuum separation between the various vacuum chambers. The BPA 509 is supported by insulator 215, which is attached to the BPA mounting plate 508.

The main lens comprises electrodes 510, 511, and 512, forming a focused spot 907 on the surface of substrate 402. The surface of the substrate 402 defines a specimen plane. The stigmator/deflector 513 deflects the beam 219 and corrects beam shape distortions caused by the beam deflection. The detector optics comprises the field-free tube 902, the detector 903, and the voltage contrast electrodes (VCEs) 905. The detector 903 is mounted on detector support 222. Secondary electrons 904 are emitted from the substrate surface 402 due to the interaction of the 20 keV primary beam 219 with the material in the substrate 402. A 4000 V bias relative to the substrate surface 402 is applied to the detector 903, causing the secondary electrons (SE) 904 to be attracted to the detector 903. The field-free tube (FFT) 902 is biased −10 V relative to the substrate 402, thus the secondary electrons 904 are repelled from the lower end of the FFT 902. The VCEs 905 are also biased −10 V relative to the substrate 402, thus secondary electrons 904 are repelled from the upper surfaces of the VCEs 905. The detector optics designs in U.S. Pat. No. 6,777,675 B2 and U.S. application Ser. No. 10/833,949, incorporated by reference herein, illustrate a similar detector optics design (this design is for a generally cylindrically symmetric detector optics).

Both the VCEs 905 and the pumpout plates 906 form part of the differentially-pumped interface between the column assembly and the substrate 402. Enclosed within the lower vacuum chamber are the following: the lower surfaces of the BPA 509, the BPA insulator 215 and the BPA mounting plate 508, main lens electrodes #1-3 510-512, the deflector/stigmator 513, the field-free tube (FFT) 902, the detector support 222, the SE detector 903, the upper surfaces of the voltage contrast electrodes (VCEs) 905, and the top surface of the substrate 402.

Figure 4B:
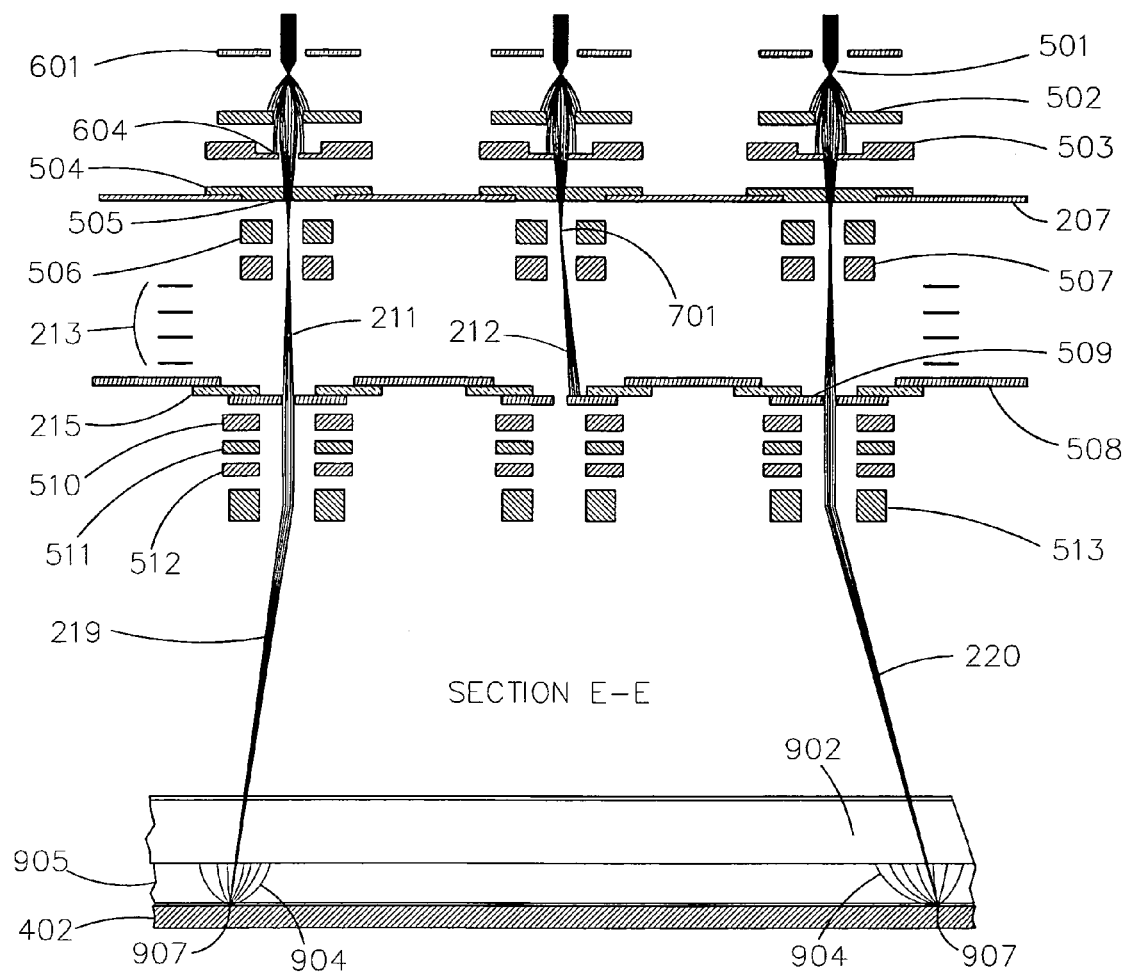
FIG. 4B shows a schematic cross-section of a first embodiment of an electron optical column assembly in a plane containing the optic axes of all columns and the main scan axis.

FIG. 4B shows a schematic cross-section (section E-E in FIG. 4A) of an electron optical column assembly in a plane containing the optic axes of all columns and the main scan axis. Three equally spaced columns are shown, however, in practice, a larger number (10 to >15) would be required to inspect the full width of a typical flat panel display substrate. The present invention is easily scalable to any width substrate and to larger numbers of beams, thereby achieving extendibility to future generations of display substrates. In the column on the left, the blanker 506 is inactivated, so the beam 211 is not deflected off the optical axis, and passes through the blanking and pumping aperture (BPA) 509 and into the main lens. In the center column, the blanker 506 is activated, causing beam 212 to be deflected off-axis by the blanker 506 and to strike the BPA 509. To enable conjugate blanking (i.e., no beam displacement at the substrate surface 402 during blanking or unblanking), a crossover 701 is formed by the source lens at the center of the blanker 506 as is familiar to those skilled in the art. Each BPA 509 can be separately connected to an imaging electrometer (not shown), which enables the BPAs 509 to be imaged by scanning the beam across them in a raster pattern generated by the alignment deflector 507. The deflector/stigmators 513 each operate independently of those in other columns, thus beam 219 is shown deflected to the left, while beam 220 is simultaneously deflected to the right.

The field-free tube 902, detector 903 and voltage contrast electrodes 905 extend over the full width of the electron beam scan (i.e., 125 mm) and thus can collect SEs no matter where the beams 219 and 220 have been deflected. The secondary electron detector 903 is typically divided into segments, each segment collecting secondary electrons for a corresponding electron beam. Furthermore, more than one secondary electron detector can be dedicated to each electron beam; in a preferred embodiment there are two secondary electron detectors for every electron beam. Another embodiment may include two linear secondary electron detectors arranged either side of the optical axis.

The lower vacuum chamber is located below the accelerating region vacuum chamber and contains the main lens, stigmator/deflector 513 and the detector optics. The only vacuum connection between the lower vacuum chamber and the accelerating region vacuum chamber is through the BPAs 509 which have very low pumping speeds due to the small aperture diameter, thereby allowing good vacuum separation between the accelerating region vacuum chamber and the lower vacuum chamber.

The column assembly shown in FIG. 4B contains a large number of parts in common to reduce cost and complexity and improve reliability and tool mean-time-to-repair (MTTR). Some of the common parts are electrostatic elements, such as accel plates 213, and others are structural elements, such as BPA mounting plate 508 and gun mounting plate 207. Details of a one-block column assembly design, with similar elements and design considerations, are found in U.S. Pat. Nos. 6,617,587 B2, 6,734,428 B2, 6,844,550 B1 and U.S. application Ser. Nos. 10/842,849 and 09/789,180, all incorporated by reference herein.

Figure 5A:
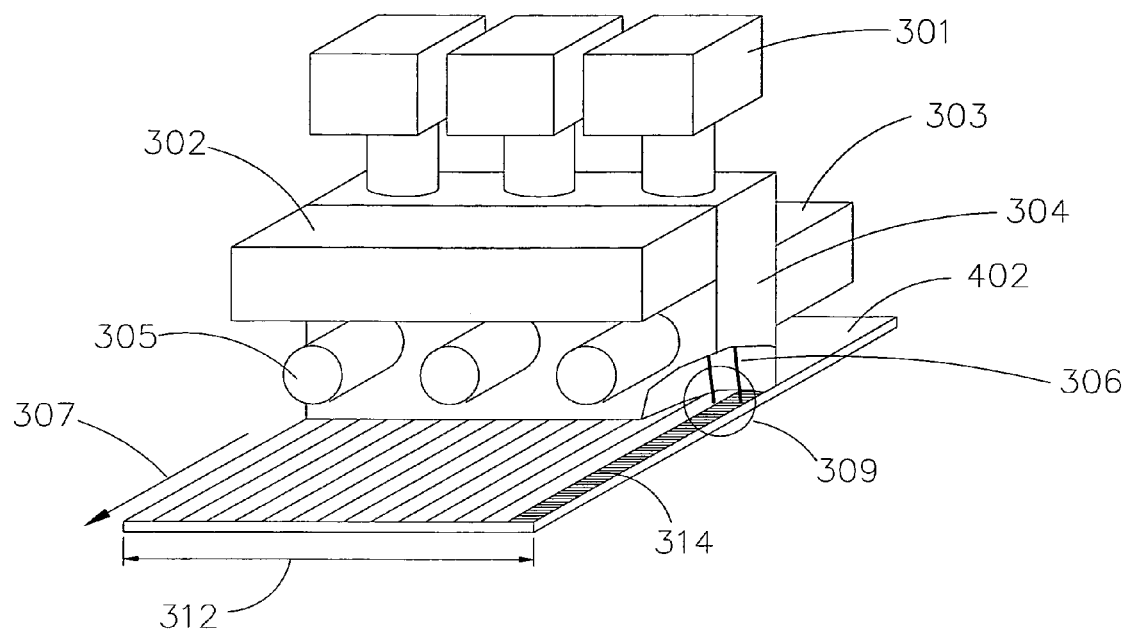
FIG. 5A shows a multi-beam multi-column testing system, indicating the methodology for flat panel display substrate inspection embodied in the present invention.

FIG. 5A shows the methodology for flat panel display substrate inspection embodied in the present invention. The column assembly vacuum housing 304 encloses the optical columns shown schematically in FIGS. 4A & 4B. The ultra-high vacuum (UHV) pumps 301 at the top pump the gun vacuum chamber. The only openings between the gun vacuum chamber and the accelerating region vacuum chamber are the multiplicity of 25 μm diameter beam-defining apertures 505. The pumping speed of a single 25 μm diameter BDA 505 is 0.000057 L/s—for 15 BDAs 505 across the column assembly, the net pumping speed is 0.00086 L/s. The control electronics are housed in enclosure 302. The control electronics also drives the blanker 506, alignment deflector 507 and the accelerator plates 213. Vacuum levels in the gun vacuum chamber should be below $5 \times 10^{-9}$ Torr.

The accelerating region vacuum chamber is pumped by high-vacuum (HV) pumps 305 to a vacuum level in the range of $10^{-5}$ to $10^{-8}$ Torr. The only openings between the accelerating region vacuum chamber and the lower vacuum chamber are the multiplicity of 60 μm diameter blanking and pumping apertures (BPAs) 509. The pumping speed of a single 60 μm diameter BPA is 0.00033 L/s—for 15 BPAs across the column assembly, the net pumping speed is 0.0049 L/s.

The lower vacuum chamber is pumped by HV pumps which are not visible in this view. Vacuum levels in the lower vacuum chamber are typically $10^{-3}$ to $10^{-6}$ Torr. Electronics for controlling the BPA electrometers (not shown), the main lens 510-512, deflector/stigmator 513, and the detector optics are contained in enclosure 303.

A cutaway at the right bottom of the column enclosure 304 shows two beams 306 being directed onto the surface of the substrate 402. In the embodiment shown, 15 beams each inspect a stripe 125 mm wide 313, for a total inspected width 312 of 15×125 mm=1875 mm which is greater than the 1870 mm width of a Generation 7 flat panel display substrate. The substrate 402 is moving in the direction of vector 307. The area 314 of the substrate 402 has already been inspected by the rightmost of the beams 306.

Figure 5B:
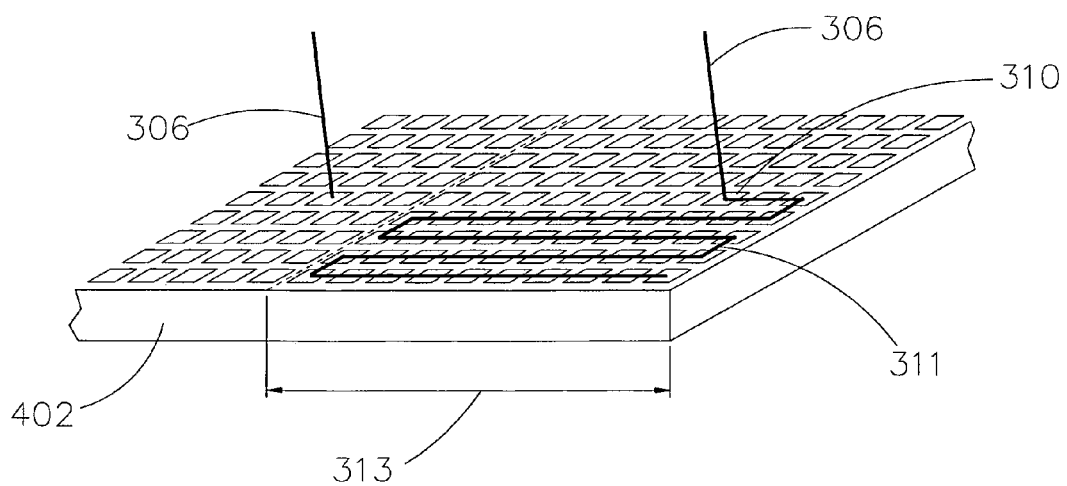
FIG. 5B is a close-up of the substrate in FIG. 5A showing individual pixels and indicating a serpentine scan of the electron beam.

FIG. 5B is a close-up of the area 309 at the far right of substrate 402 under the two beams 306. The rightmost beam 306 is shown being vectored back and forth across the width 313 of the stripe (this is along the main scan axis), stopping on each pixel element 310 for typically <10 μs. After a particular pixel element 310 has been tested, the beam is blanked by the blanker 506 (see FIG. 4A) and then vectored over to the next pixel element, where the beam 306 is stopped and then unblanked. The motion of the beam 306 is serpentine, as shown by trajectory 311.

Typically, flat panel displays are tested using a two-step procedure:
1) All pixels are tested for electrical functionality.
2) Those pixels found to have abnormal functionality are retested in a second pass to determine the degree and type of malfunction.

These steps may be alternated as the display is tested, either on a pixel-by-pixel basis, a line-by-line basis, or in some other alternating sequence. Usually only a very small fraction (<0.1%) of pixels fail the initial test and require retesting. In order to accomplish this two-step procedure, it is necessary to be able to vector the beam in the serpentine pattern (for step 1), and also to vector the beam back to any pixels requiring retest. This places demands on the speed and settling time of the deflectors and blankers. Furthermore, this testing procedure requires that each electron beam can be scanned independently of the others. The system of the invention is designed to enable such a two-step testing procedure.

Figure 5C:
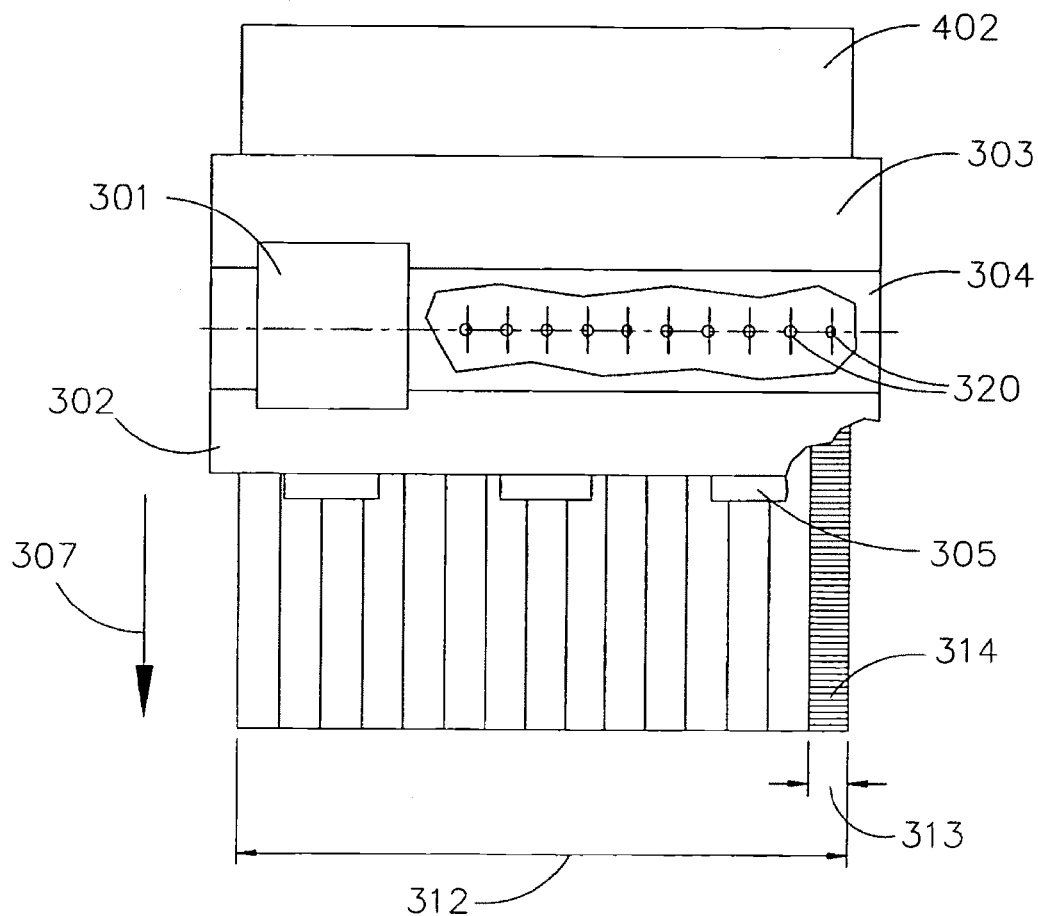
FIG. 5C is a schematic top view, with partial cutaway, of the testing system of FIG. 5A, showing the column assembly and associated pumps and electronics, as well as the substrate being inspected.

FIG. 5C is a schematic top view corresponding to FIG. 5A. A partial cutaway illustrates the inside of the column assembly, showing ten sources 320, spaced 125 mm apart.

Figure 5D:
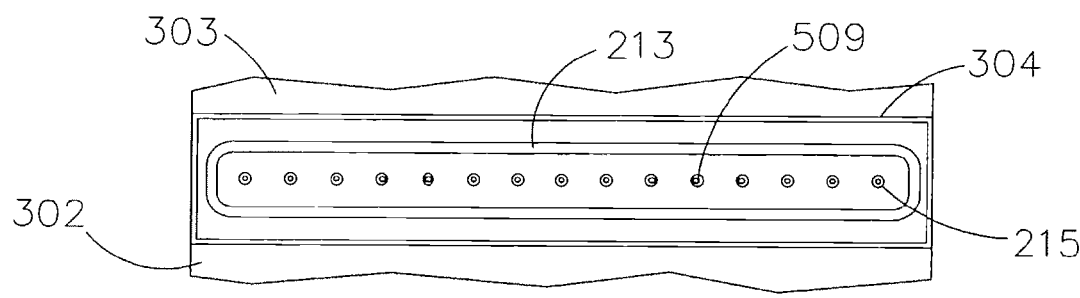
FIG. 5D is a schematic top view of the column assembly of the testing system of FIG. 5A with the top of the column enclosure 304 cut away.

FIG. 5D is a schematic top view of the column assembly of the testing system of FIG. 5A, with the column enclosure 304 cut away. BPAs 509 and annular insulators 215 for fifteen electron beam columns are shown. The accel plates 213 are shown to have only one large aperture for all electron beam columns.

Figure 6:
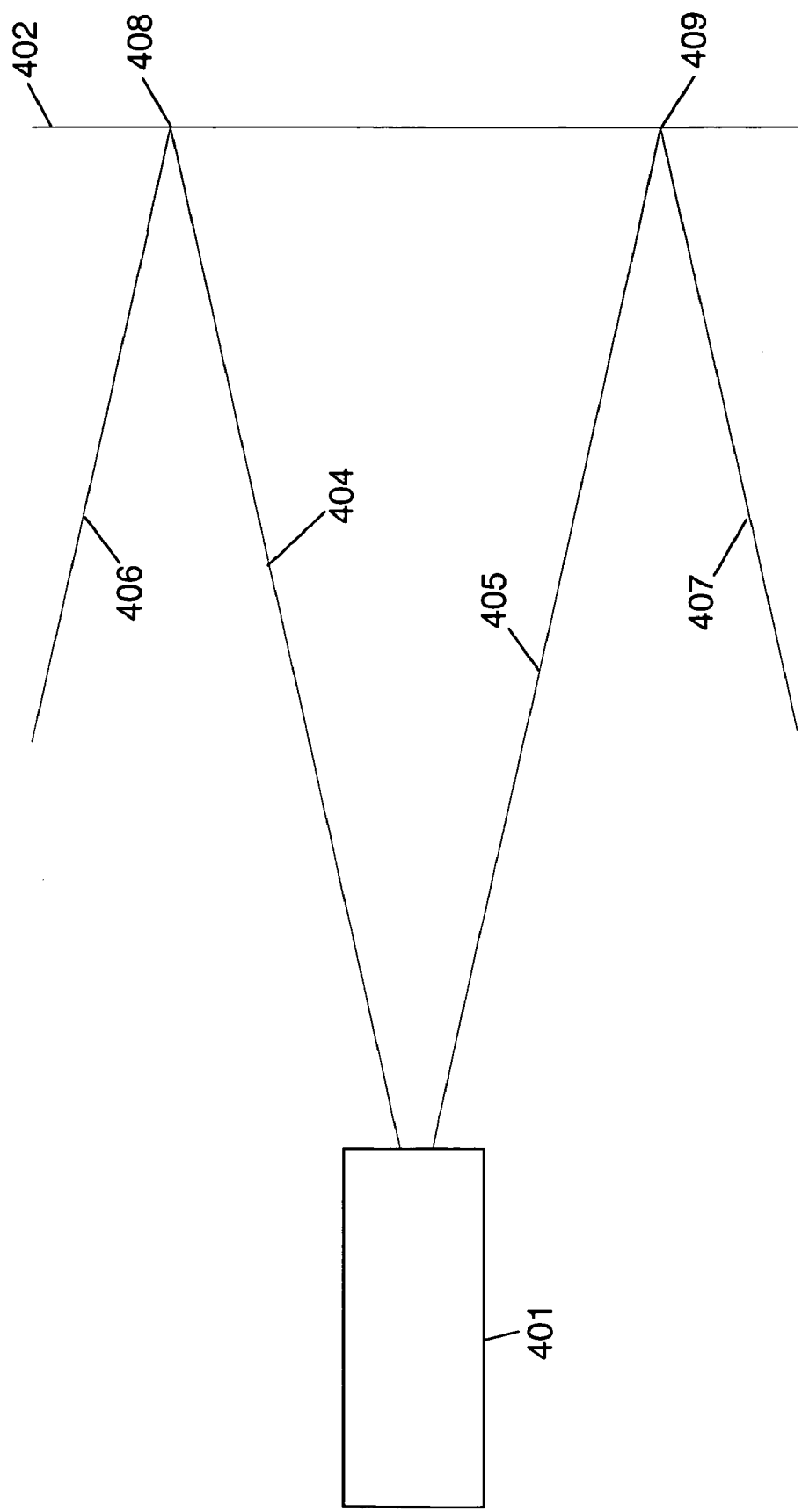
FIG. 6 shows a schematic cross-section of a first embodiment of an electron optical column assembly in a plane containing the optical axis and the main scan axis, illustrating the 125 mm scan field and the stitching together of beams from neighboring columns.

FIG. 6 shows a schematic cross-section of a first embodiment of an electron optical column assembly in a plane containing the optical axis and the main scan axis, illustrating the 125 mm scan field (along the direction of the main scan axis) and the stitching together of scan fields from two neighboring columns. The upper optics assembly 401 is shown generating two beams, 404 and 405—in actual operation, only one of these beams would be present at any one time. Both beams 404 and 405 are shown here together to illustrate the wide scan field obtained with the present invention. The width of the scan field is determined by: (1) the width of the substrate to be inspected, and (2) the desired number of beams to be produced by the column assembly, which is determined by the tradeoff between increased cost (more beams) and lowered throughput (fewer beams). Clearly, the required scan field is then determined by:

Required Scan Width=[substrate width]/[number of columns]

A generation 7 flat panel display substrate has the dimensions 1870 mm×2200 mm—we will assume the column array extends across the smaller dimension of the substrate. If 15 beams are to be used for inspection, then Required Scan Width=1870/15=124.67 mm→125 mm.

To achieve 100% inspection and testing across the full width 312 (see FIG. 5A) of substrate 402, it is necessary to stitch together beams from neighboring columns. For example, beams 404 and 406 overlap at point 408, while beams 405 and 407 overlap at point 409. Points 408 and 409 are separated by the width of the electron beam scan of a single column, in this case, 125 mm. The detector optics is not shown in this figure.

Figure 7:
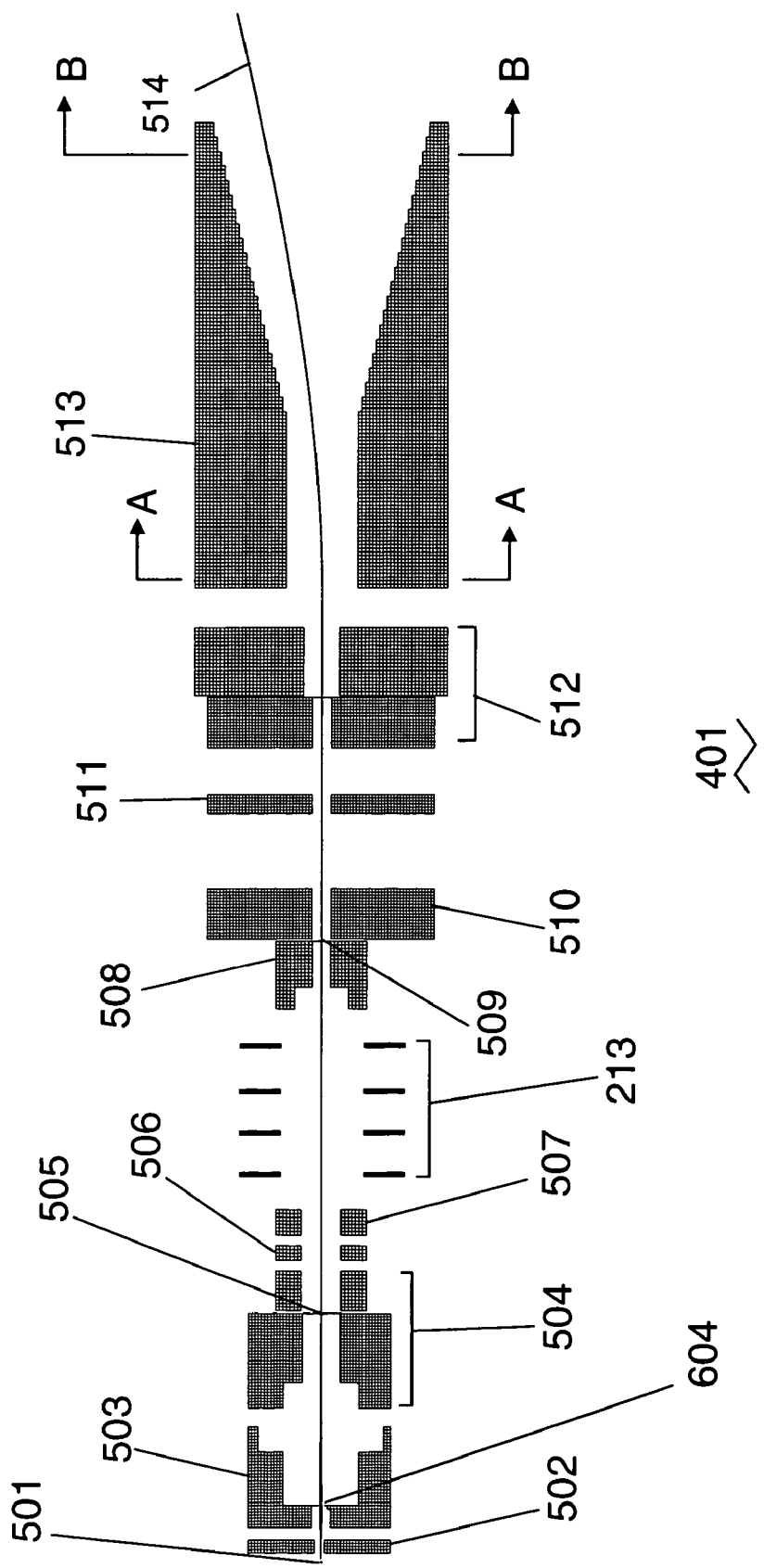
FIG. 7 shows a cross-section of a first embodiment of the upper column optics of an electron optical column assembly in a plane containing the optical axis and the main scan axis.

FIG. 7 shows a cross-section of a first embodiment of the upper column optics 401 in a plane containing the optical axis and the main scan axis. The upper column optics 401 is shown to scale. The overall length from the source tip 501 to the exit surface of the deflector/stigmator 513 is 81 mm. Shown in the figure are the following: the source tip 501, extraction electrode 502, source lens electrode 503, beam limiting aperture (BLA) 604, source plate 504, beam-defining aperture (BDA) 505, blanker 506, alignment deflector 507, the accelerating plates 213, the blanking and pumping aperture (BPA) 509, BPA mount 508, main lens electrode #1 510, main lens electrode #2 511, main lens electrode #3 512, deflector/stigmator 513, the position of cross-sections A-A and B-B through the deflector/stigmator 513, and the deflected beam 514. The source tip 501 is typically tungsten with a coating of zirconium-oxide in the case of a Schottky emitter. Other potential source types include cold field emitters, $LaB_6$ emitters, or thermionic filaments. In the electron optics, the other electrodes are typically titanium alloy, stainless steel, or other high vacuum-compatible non-magnetic conducting materials. Insulators are preferably made from bakeable ceramic, such as alumina, silicon-carbide, silicon-nitride, etc. In the design of the column, it is important to assure that no supporting insulators for any of the optical elements 502-513 are visible to the beam 514 as it passes through the upper column optics 401, otherwise undesirable insulator charging may occur, affecting the beam trajectories or causing high voltage breakdown.

Figure 8A:
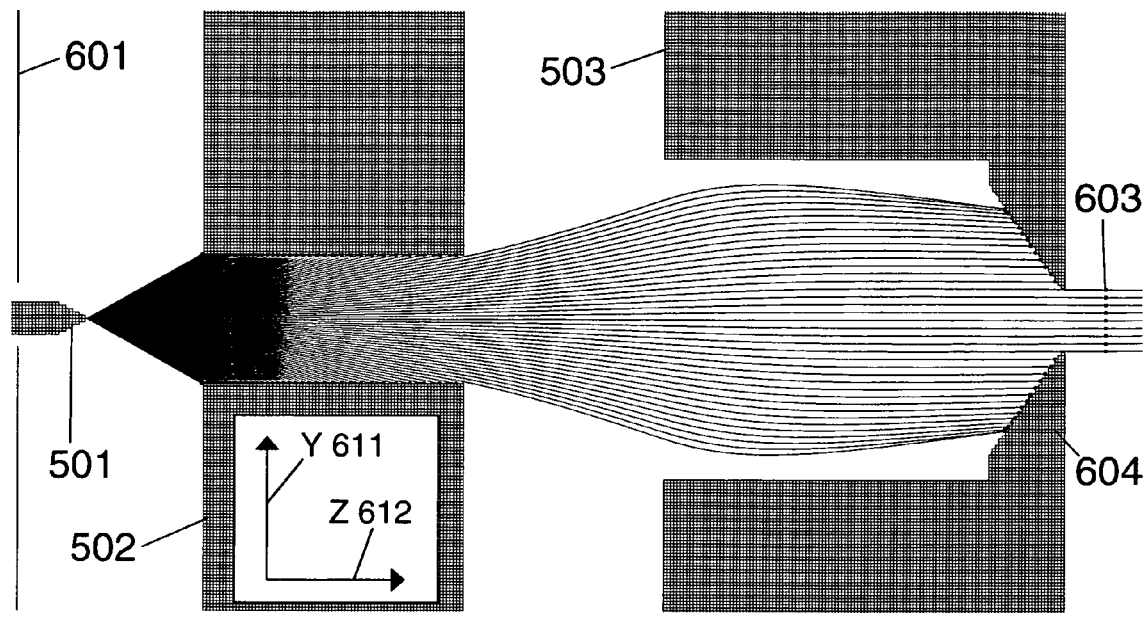
FIG. 8A shows a close-up of the source tip and gun optics of FIG. 7, including a representation of the electron beam as a set of rays.
Figure 8B:
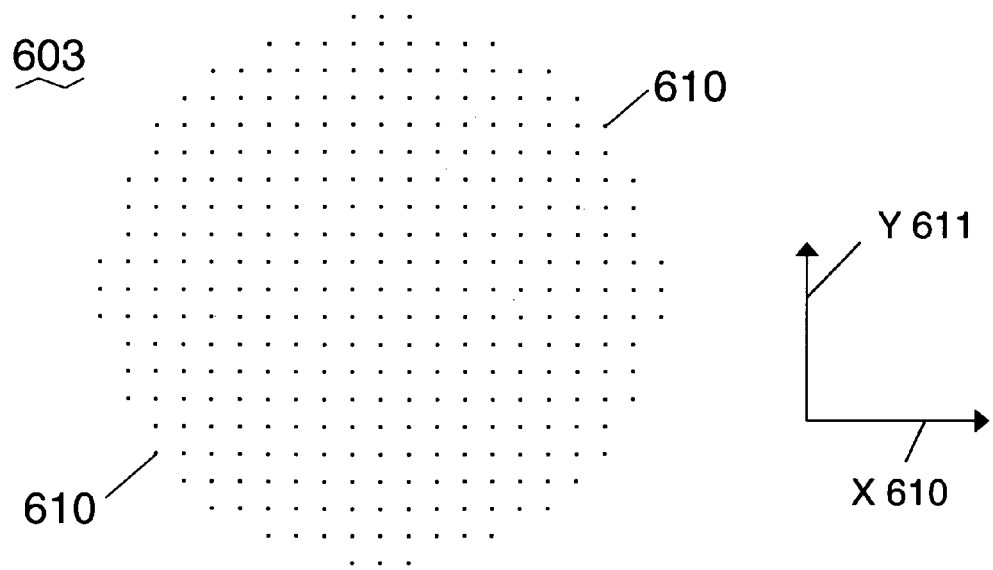
FIG. 8B shows an axial cross-sectional representation of the electron beam of FIG. 8A at the point where the beam emerges from the beam-limiting aperture 604.

FIGS. 8A and 8B are a pair of views of the rays leaving the source tip 501, showing how the initial distribution of rays is "laminar", i.e., the rays have a uniform distribution spreading out from the tip 501 without crossing over each other.

FIG. 8A is a close-up of the source tip and gun optics of FIG. 7. FIG. 8A shows source tip 501, suppressor 601, extraction electrode 502, source lens electrode 503, beam-limiting aperture (BLA) 604 and beam cross section 603 emerging from the BLA 604, corresponding to electrons emitted within a 2° half-angle at the source tip 501. Electrons are emitted by the source tip 501 under the influence of a high electric field generated by the voltage difference between the tip 501 and the extraction electrode 502, typically 2700-3400 V. Electrons which are emitted at half-angles >9° strike the extraction electrode 502, while electrons with half-angles between 2° and 9° strike the beam-limiting aperture (BLA) 604, which is mounted in the source lens electrode 503. Electrons with half-angles less than 2° pass through the BLA 604 and enter the source plate 504. A negative bias voltage (relative to the source tip 501) is applied to the suppressor 601 to reduce unwanted electron emission from the shank of the source tip 501. The optical axis is parallel to the Z-axis 612 and perpendicular to the Y-axis 611.

FIG. 8B shows an axial cross-section of the beam taken at location 603, including ray intercepts 610. The X-axis 610 and Y-axis 611 are both perpendicular to the Z-axis 612 in FIG. 8A. Each of the ray intercepts 610 can be seen to be evenly separated on a grid corresponding to the X-axis 610 and Y-axis 611. The rays in the electron beam preserve this laminar behavior almost all the way to the substrate surface 402.

The design method described herein for the electron optical column relies on the assumption that each ray represents a well-defined and equal amount of current. The calculation for this current is as follows, with reference to FIGS. 7, 8A and 8B:

$I_s$=source angular intensity over the emission solid angle used to illuminate the beam-defining aperture 505 (in this case 2.0°)—usually the angular intensity ranges from 100 μA/sr up to 1 mA/sr (in this example, $I_s$=200 μA/sr).

δ=angular increment between rays 610 along the X-axis 610 and Y-axis 611 (in this example, δ=0.2°).

ω=solid angle subtended by each ray 610, for δ=0.2°, =$[\delta(\pi/180°)]^2$=1.22×10$^{-5}$ sr $I_{ray\ 610}$=$I_s$ ω=(200 μA/sr) (1.22×10$^{-5}$ sr)=2.44 nA for each ray 610. FIG. 8B shows a total of 325 rays, giving a total beam 603 current illuminating the BDA 505 of 792 nA. Note that not all of this illuminating current actually passes through the BDA 505.

Implicit in this calculation is the assumption that the angular intensity is uniform over the angular range of emission used to generate the beam (comprising rays 610 in FIG. 8B) which then illuminates the BDA 505. In the example of a Schottky thermal field emitter, this assumption is valid, since typically the angular intensity is very uniform over the central (i.e., out to several degrees half-angle) part of the angular emission distribution. With electron sources for which this assumption is invalid, the method described herein for design of the BDA 505 could be modified to take into account different values for $I_{ray\ 610}$ depending on the initial angle of each ray 610 at the source tip 501.

Figure 9A:
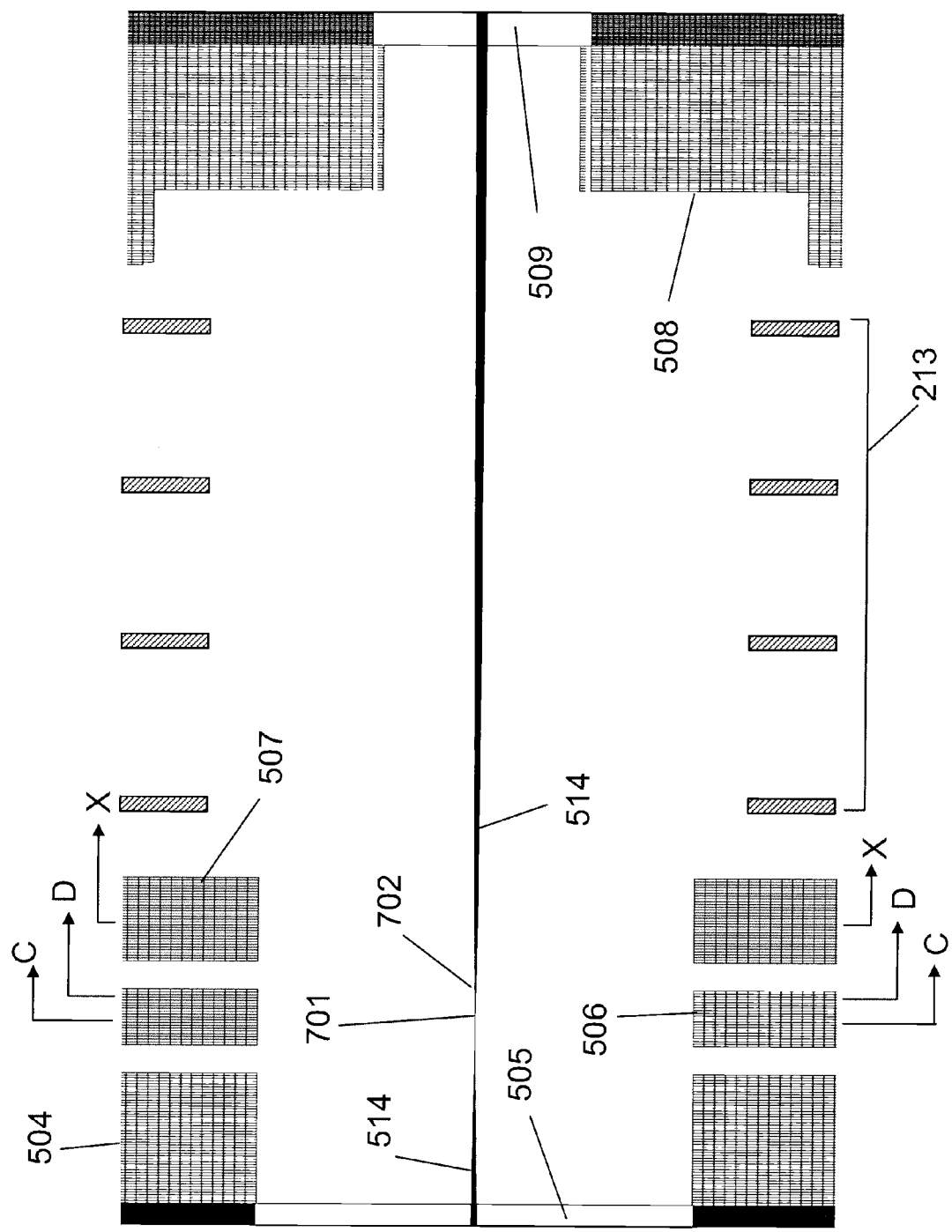
FIG. 9A shows a close-up of the column of FIG. 7 from the source plate 504 to the blanking and pumping aperture 509.

FIG. 9A shows a side cross-sectional view of the source plate 504, BDA 505, blanker 506, alignment deflector 507, accelerating plates 213, blanking and pumping aperture (BPA) 509 and BPA mount 508. The axis perpendicular to the beam 514 has been exaggerated in scale to show the beam profile more clearly. Three cross-sections are shown, C-C through the center of the blanker 506, D-D through the exit of the blanker 506, and X-X through the center of the alignment deflector 507. The beam profile shows the crossover 701 at the center (in section C-C) of blanker 506. The beam cross-section in section D-D intersects the beam 514 at point 702. Depending on the voltage applied to the source lens electrode 503, electrons with maximum initial half-angles from 0.8° to 1.4° will pass through the BDA 505, mounted in the source plate 504. Electrons passing through the BDA 505 enter the beam blanker 506.

Figure 9C:
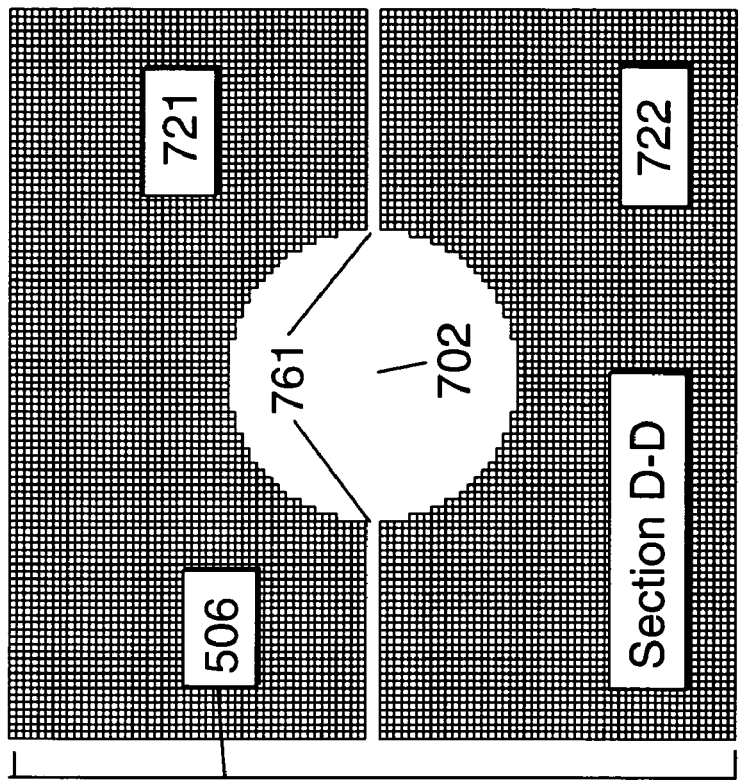
FIG. 9C shows section D-D through the exit plane of blanker 506 in FIG. 9A.
Figure 9B:
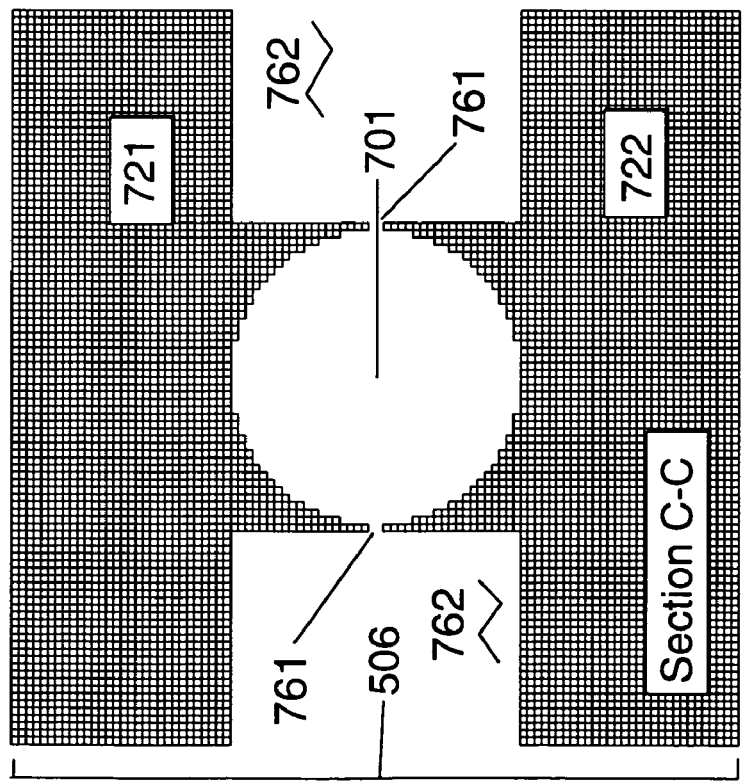
FIG. 9B shows section C-C through the mid-plane of blanker 506 in FIG. 9A.

FIG. 9B shows cross-sectional view C-C through the mid-plane of the blanker 506. The crossover 701 is at the center, equidistant between the two blanker electrodes 721 and 722. To avoid the introduction of astigmatism to the beam, the inner bores of the two blanker electrodes 721 and 722 are cylindrical, with a small gap 761 between electrodes 721 and 722 to minimize the perturbation of the cylindrical geometry. To achieve the highest possible blanking speeds (i.e., the highest possible voltage slew rates on the blanking electrodes 721 and 722), it is necessary to minimize the capacitance between electrodes 721 and 722. To accomplish this, while still maintaining the gaps 761 as small as possible, the radial width of the electrodes 721 and 722 at the gaps 761 is reduced by the introduction of the two rectangular cutouts 762 into the sides of electrodes 721 and 722.

FIG. 9C shows a cross-sectional view D-D through the exit plane of the blanker 506. To preserve a cylindrical electric field between the exit of the blanker 506 and the entrance to the alignment deflector 507, the two square cutouts 762 are not extended all the way to the ends of the blanker, thus the cross-sectional view here shows an optimized surface at the exit of the blanker 506, which nearly defines a flat equipotential surface with a circular hole as long as gaps 761 are small and the voltages on electrodes 721 and 722 are equal (as would be the case for no blanking). Similar considerations apply for the gap between the exit of the source plate 504 and the entrance to the blanker 506, thus a cross-section through the entrance of the blanker 506 looks like FIG. 9C as well.

Figure 9E:
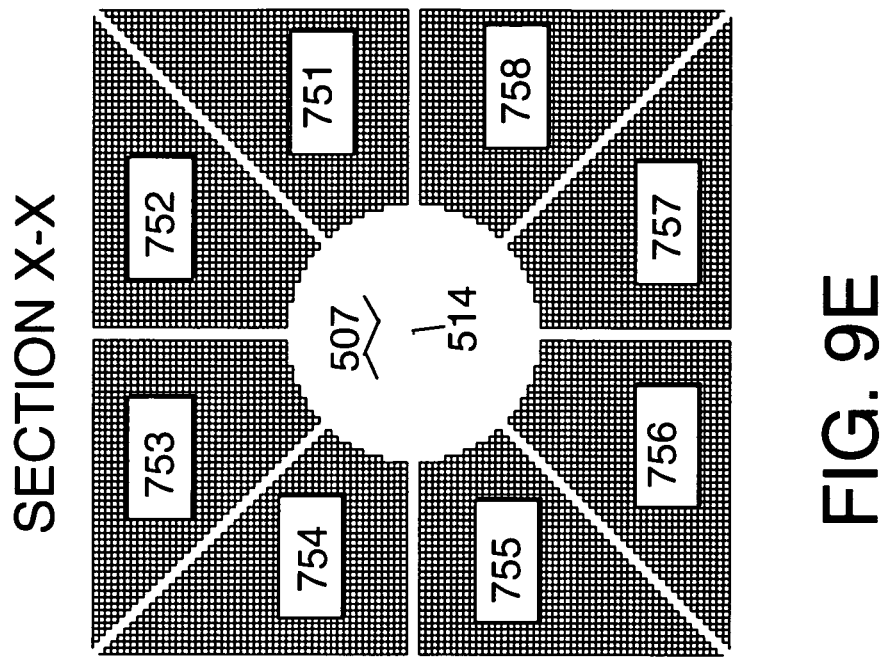
FIG. 9E shows section X-X through the mid-plane of the alignment deflector 507 in FIG. 9A.
Figure 9D:
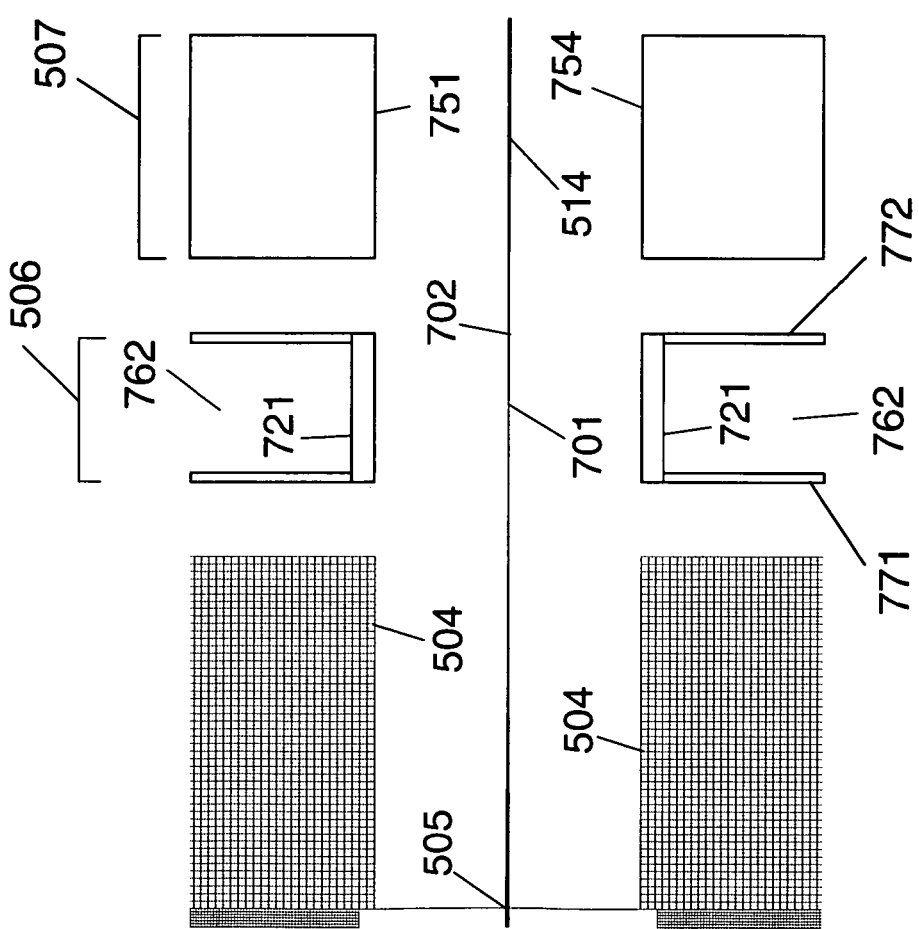
FIG. 9D shows a cross-sectional side view of the blanker 506 and the alignment deflector 507 in FIG. 9A in the plane containing the optical axis and the blanker gap 761.

FIG. 9D shows a cross-sectional view through a plane containing the optical axis and the gap 761 between the two electrodes 721 and 722 of the blanker 506. The surface area of the electrode 721 immediately adjacent to and facing electrode 722 (not shown) has been reduced by the two cutouts 762. This reduction in area greatly reduces the capacitance between electrodes 721 and 722, thereby increasing the maximum possible voltage slew rate for the circuits (not shown) needed to drive the blanking voltage. Electrode 722 is a mirror image of electrode 721, as indicated in FIGS. 9B and 9C. In general, the maximum slew rate is inversely proportional to the capacitance of the load being driven. The beam crossover 701 can be seen at the center of the blanker 506. Also shown are the entrance 771 and exit 772 faces of the blanker 506 as shown in FIG. 9C. When the blanker 506 is inactivated (i.e., it is not blanking the beam 514), the voltages on electrodes 721 and 722 are equal at 568 V relative to the source tip 501, and the electrostatic potential distribution between the source plate 504 and the blanker 506 will closely approximate a zero-field region, with only a small perturbation due to the gaps 761. Similarly, when the blanker 506 is inactivated, the electrostatic potential distribution between the blanker 506 and the alignment deflector 507 will approximate that which would occur if the blanker were replaced by a cylindrical electrode at 568 V relative to the source tip 501. In this embodiment, the bores of the source plate 504, blanker 506, and alignment deflector 507 are all 2 mm inner diameter. Since the plane of the figure passes through the gap between electrodes 751 and 758 and the gap between electrodes 754 and 755 in the alignment deflector 507 (referring to FIG. 9E), the faces of electrodes 751 and 754 are visible in FIG. 9D.

FIG. 9E is a cross-sectional view X-X through the mid-plane of the alignment deflector 507. The eight octupole electrodes 751-758 are shown, along with a cross-section of the beam 514. To deflect the beam 514 for alignment purposes, a rotatable electrostatic dipole excitation is applied to the electrodes 751-758. For example, to deflect the beam 514 to the right in FIG. 9E, Table I shows the voltages that could be applied to the alignment deflector electrodes 751-758:

TABLE I

Alignment Deflector Voltages (relative to source tip 501).

| Electrode Number in Alignment Deflector 507 | Voltage on Electrode |
|---|---|
| Electrode 751 | 568 + 10 |
| Electrode 752 | 568 + 10 ($\sqrt{2} - 1$) = 568 + 4.14214 |
| Electrode 753 | 568 − 10 ($\sqrt{2} - 1$) = 568 − 4.14214 |
| Electrode 754 | 568 − 10 |
| Electrode 755 | 568 − 10 |
| Electrode 756 | 568 − 10 ($\sqrt{2} - 1$) = 568 − 4.14214 |
| Electrode 757 | 568 + 10 ($\sqrt{2} - 1$) = 568 + 4.14214 |
| Electrode 758 | 568 + 10 |

The common mode voltage of 568 V relative to the source tip 501 is also shown. The deflection sensitivity of the alignment deflector 507 at the plane of the blanking and pumping aperture 509 is 14.5 μm/V.

Figure 10B:
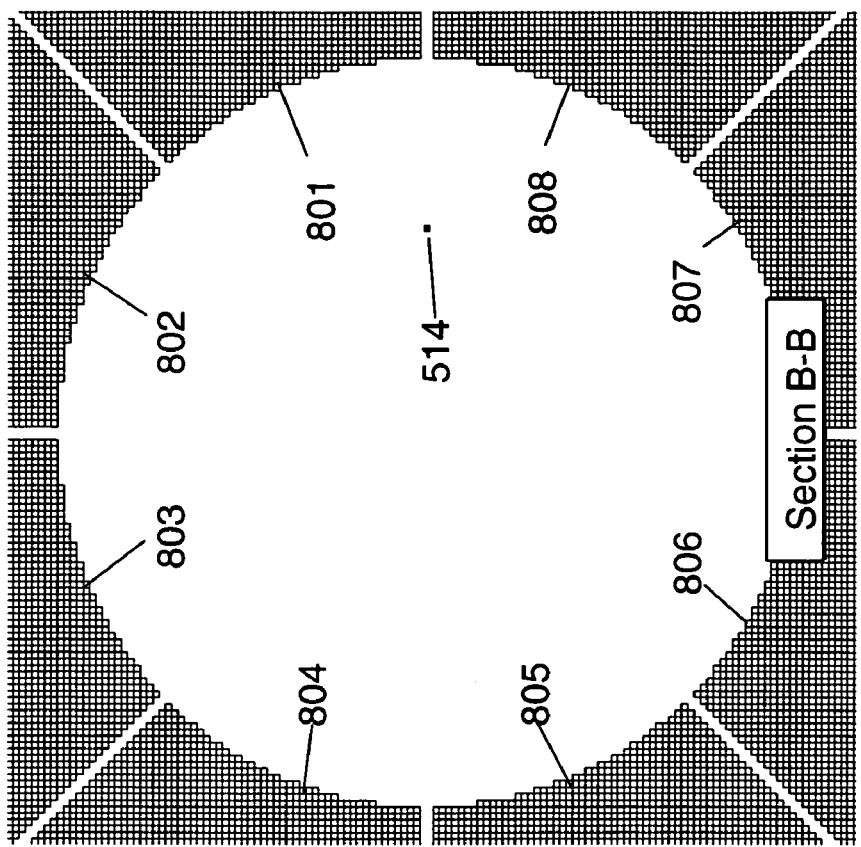
FIG. 10B shows section B-B through the exit region of the deflector/stigmator 513 of FIG. 7.
Figure 10A:
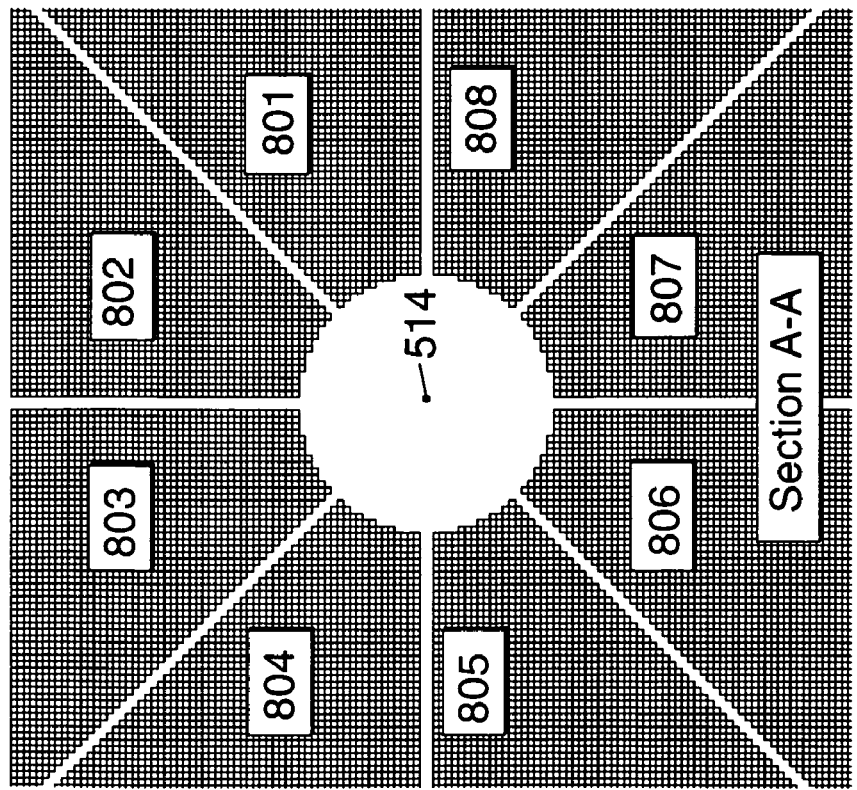
FIG. 10A shows section A-A through the entrance region of the deflector/stigmator 513 in FIG. 7.

FIG. 10A shows a cross-sectional view of a plane near the entrance (section A-A in FIG. 7) of the deflector/stigmator 513. The eight octupole electrodes 801-808 are shown arranged around the entrance aperture of the deflector, along with a cross-section of the beam 514. To deflect the beam 514, a rotatable electrostatic dipole excitation would be applied to electrodes 801-808, as described with reference to FIG. 17, below. To stigmate the beam 514 (i.e., to correct for astigmatism induced by deflecting the beam 514 off-axis), a rotatable electrostatic quadrupole excitation would be applied to electrodes 801-808, as described with reference to FIG. 16, below. In section A-A, the bore of the deflector/stigmator 513 is cylindrical with an inner diameter of 4 mm.

FIG. 10B shows a cross-sectional view of a plane near the exit (section B-B in FIG. 7) of the deflector/stigmator 513, where the inner diameter of the deflector has expanded conically to 12 mm. The eight octupole electrodes 801-808 are shown arranged around the exit aperture of the deflector, along with a cross-section of the beam 514 which has been deflected off the optical axis of the column.

Figure 11A:
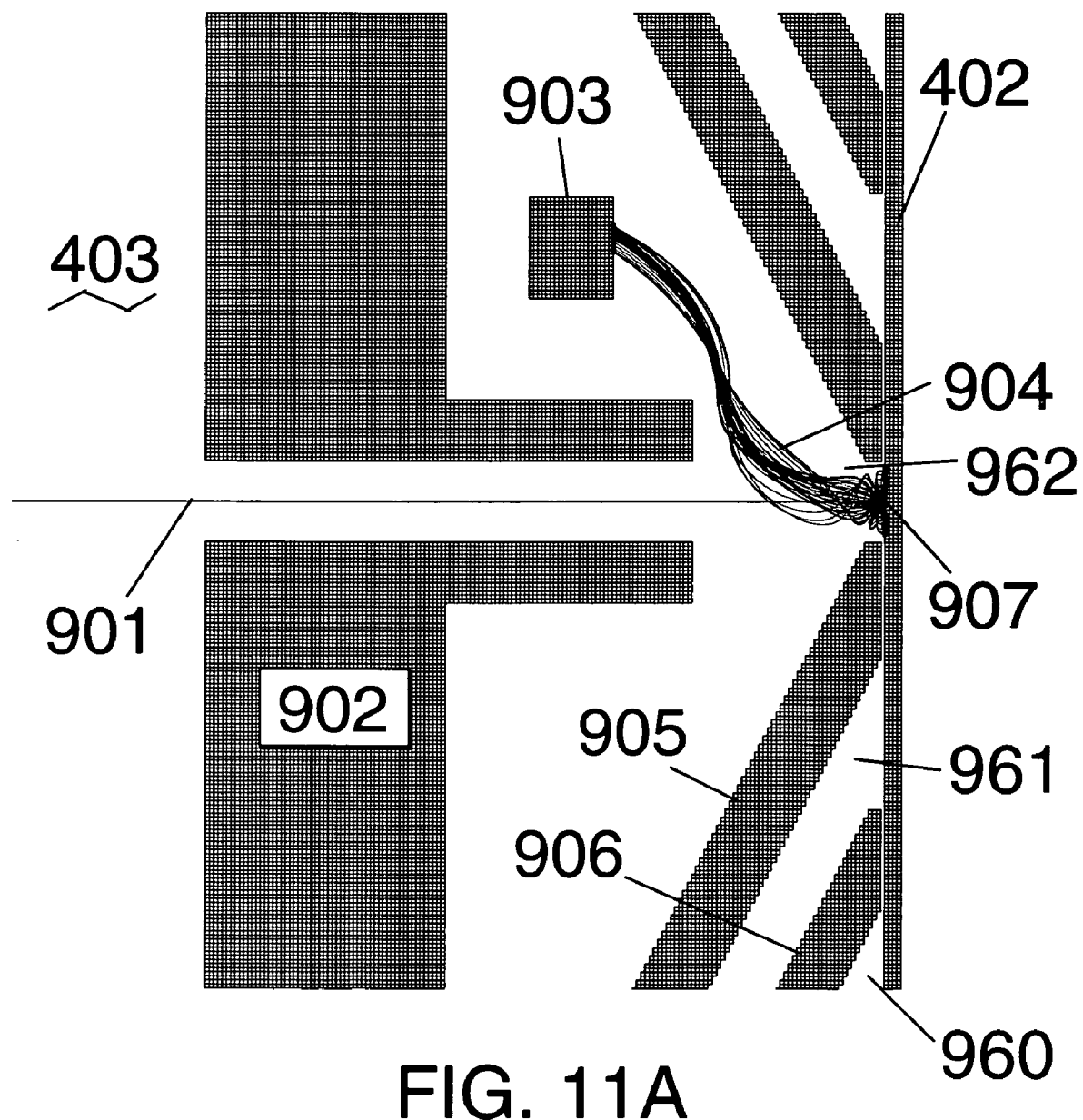
FIG. 11A is a cross-section of a first embodiment of the lower column in a plane containing the optical axis and perpendicular to the scan axis, showing collection of secondary electrons by the detector optics.

FIG. 11A is a side cross-sectional view in a plane containing the optical axis and perpendicular to the main scan axis.

Due to the impact of the primary beam 901 (at 20 keV energy) on the substrate surface 402 at point 907, secondary electrons 904 are emitted from point 907. The figure shows the collection of secondary electrons (SEs) 904 by the detector optics, comprising the following elements: the field-free tube (FFT) 902, the voltage contrast electrodes (VCEs) 905, and the SE detector 903. The FFT 902 has two functions: (1) to shield the primary beam 901 from the electric field induced by the bias voltage (typically +4000 V) on the SE detector 903, and (2) to repel the secondary electrons 904 emerging upwards from the substrate surface 402 so that they cannot go up the column and are instead largely collected by the SE detector 903. The VCEs 905 have three functions: (1) to repel the SEs 904 emerging from the substrate and reflecting off the FFT 902 and channel them towards the SE detector 903, (2) to form part of the outer wall of the lower column vacuum enclosure, and (3) to form the inner wall of the intermediate pumpout channel 961 in the graded vacuum seal between the column optics and the substrate 402. The FFT 902 and VCEs 905 are typically biased −10 V relative to the substrate 402, thus SEs emerging from point 907 with energies <10 eV cannot strike either the FFT 902 or the VCEs 905. The SE detector 903 is biased about +4000 V relative to the substrate 402, thus SEs emerging from point 907 are strongly attracted to the SE detector 903 as shown. The slot in the FFT 902 and the gap between the VCEs 905 are 2 mm wide in FIG. 11A, and extend the full width of the substrate 402 along an axis perpendicular to the plane of FIG. 11A. Pumpout plates 906 form one side of the intermediate pumpout channel 961 (the other side is formed by the VCEs 905). Pumpout channel 962 leads into the lower column vacuum enclosure. The gaps between the bottoms of the pumpout plates 906 and the substrate 402 must be kept small (typically <0.5 mm) to ensure adequate differential pumping. For the same reason, the gaps between the bottoms of the VCEs 905 and the substrate 402 must also be kept small.

Figure 11B:
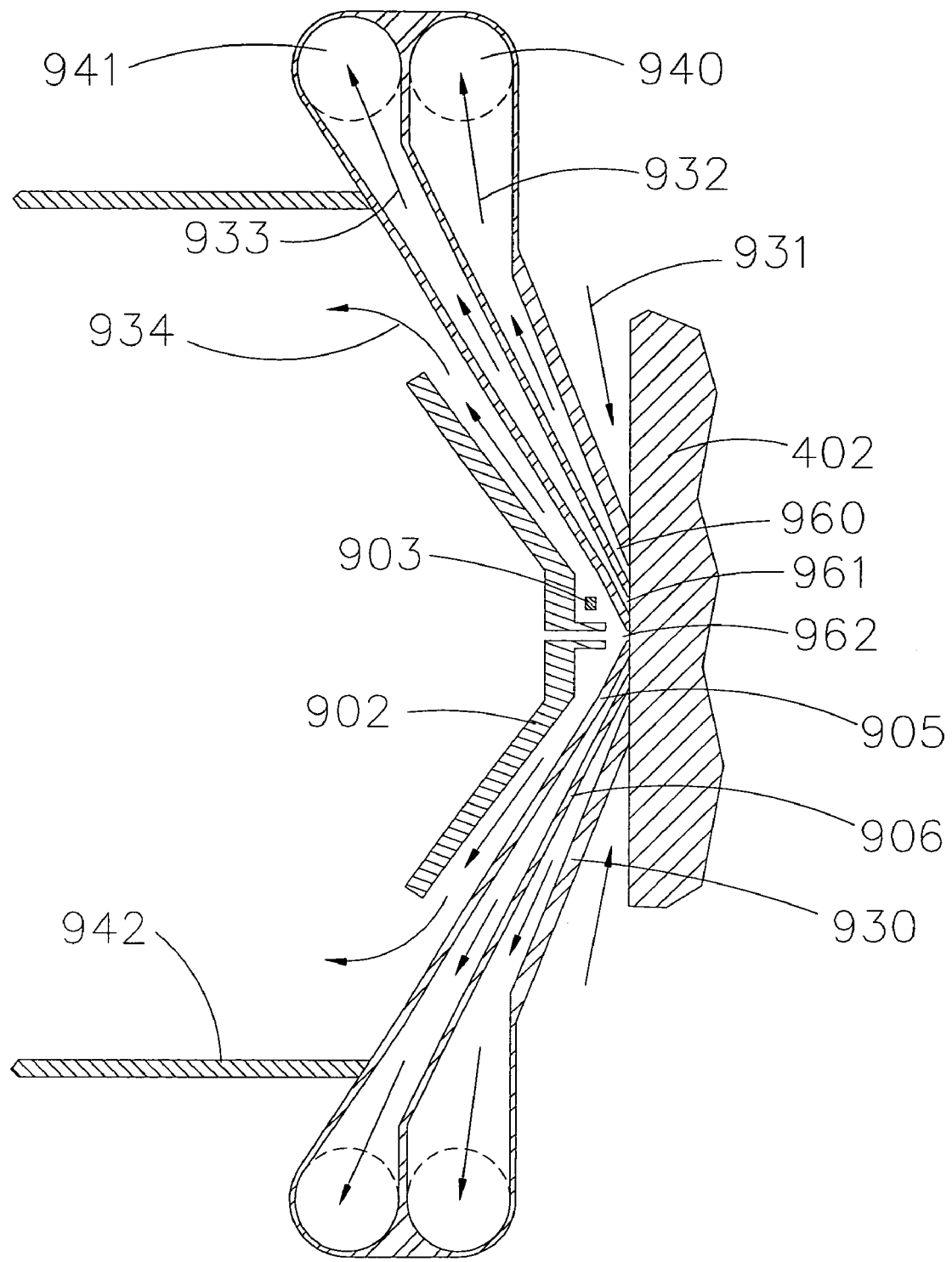
FIG. 11B is a cross-section of a schematic of a first embodiment of the lower column in a plane perpendicular to the scan axis, indicating air flow in the vacuum pumpout channels and adjacent to the surface of the substrate.

FIG. 11B is a cross-section of the lower column, illustrating the differential pumping concept. Outside of the pumpout plates 906 are a second set of pumpout plates 930 forming an outer pumpout channel 960. The exact number of pumpout channels is determined by: (1) the ultimate vacuum required in the lower column vacuum enclosure, (2) the minimum gap allowed between the bottoms of the VCEs 905, pumpout plates 906 and pumpout plates 930 and the substrate surface 402. For larger substrates, it is likely that the gap will necessarily be larger to accommodate irregularities in the flat panel display substrate surface. Gas 931 (typically either dry nitrogen or ambient air) is shown flowing towards the lower end of the column assembly. The great majority of the gas 932 is pumped out through channel 960, entering pumpout manifold 940 leading to a low vacuum pump (not shown). Most of the remaining gas 933 is pumped out through channel 961, entering pumpout manifold 941, leading to an intermediate-level vacuum pump. Any remaining gas will enter the lower vacuum chamber through the gap 962 between the inner edges of the two VCEs 905. The gas entering the lower vacuum chamber is pumped out by high vacuum pumps (not shown).

Figure 11C:
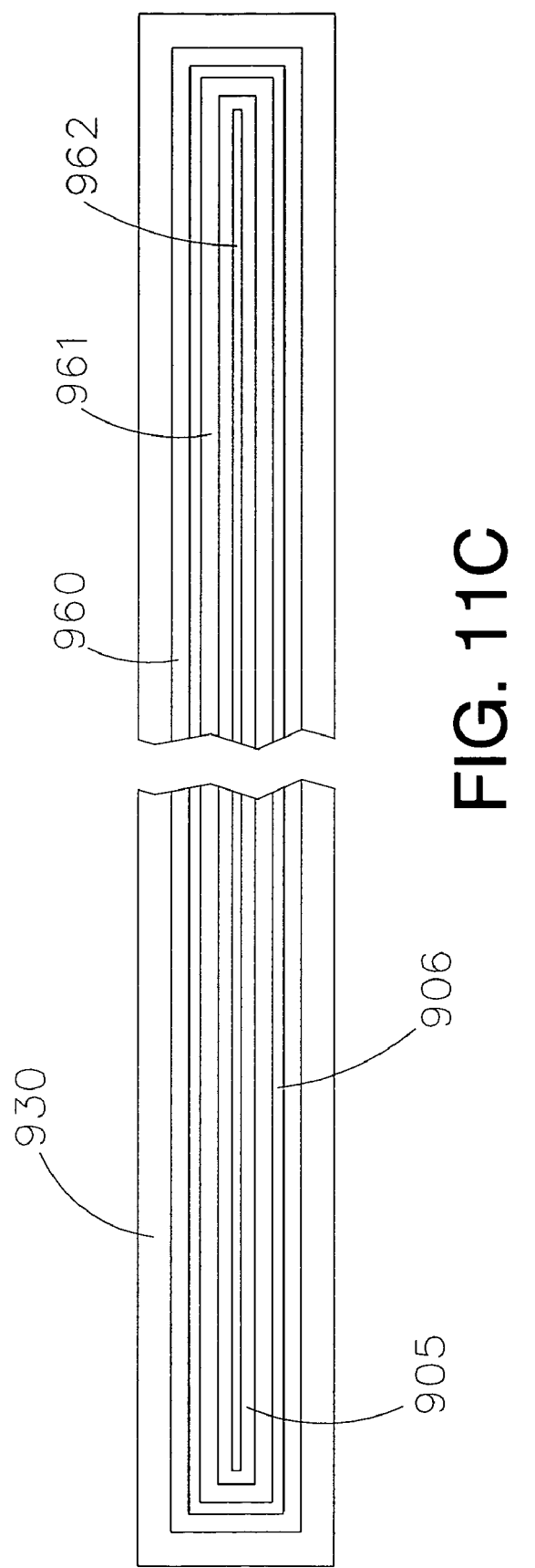
FIG. 11C is a bottom view of the vacuum pumpout channels, showing the end surfaces of the pumpout plates which are facing the substrate surface.

FIG. 11C shows a view of the bottom of the column assembly, looking up at the differential pumping openings 962, 961, and 960. The length of opening 962, through which the electron beams are scanned, must extend at least the full width of the substrate 402 to enable 100% substrate inspection in a single pass.

Figure 12:
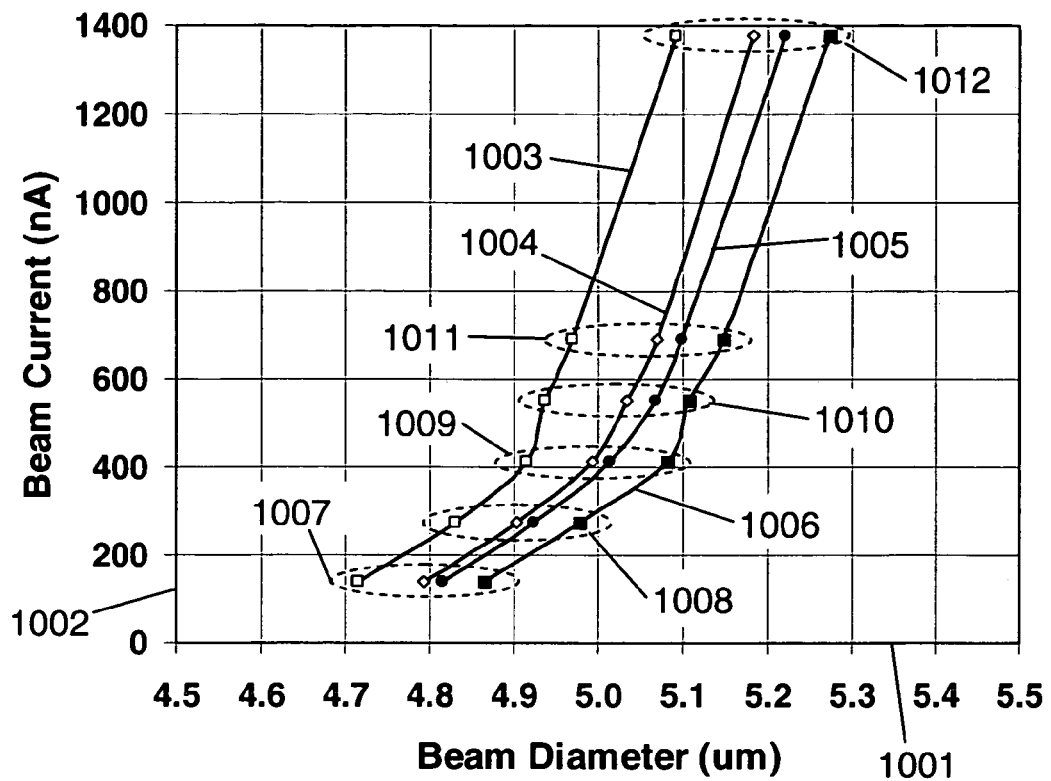
FIG. 12 shows a graph of the beam current against the beam diameter for various distances of the beam off axis.

FIG. 12 shows a graph of the beam current 1002 vs. FWHM beam diameter 1001 for various distances of the beam off axis for a half-angle at the source tip 501 of 1.2° and a voltage on the extraction electrode 502 of 2700 V relative to the source tip 501 (referring also to FIG. 8A). Curve 1003 corresponds to no deflection—the beam is centered on the optical axis, thus there are no off-axis aberrations and the beam has the smallest FWHM diameter. Curve 1004 corresponds to ⅓ of the maximum deflection, or about 21 mm off-axis. Curve 1005 corresponds to ⅔ of the maximum deflection, or about 42 mm off-axis. Curve 1006 corresponds to maximum deflection, 63 mm off-axis at the substrate 402 surface, giving a >125 mm scan width (see FIGS. 5A & 5B). As expected, as the beam is deflected further off-axis, the beam diameter increases slightly (typically <3.6%) due to off-axis aberrations. Without dynamic focus and astigmatism correction, this increase in FWHM beam diameter would be much larger. These calculations take into account the following contributions to the final beam size: (1) the virtual source size (20 nm×Magnification=~2 μm, where Magnification≈100×), (2) diffraction (typical contribution ~0.1 μm), (3) all orders of all geometrical aberrations, both on- and off-axis (spherical aberration, coma, astigmatism, and curvature of field), and (4) all orders of chromatic aberrations, both on- and off-axis (chromatic change in focal length and magnification). Aberration terms (1), (3) and (4) are combined as would occur in a real optical system (i.e., the ray tracing calculation plots the trajectories of individual electrons, simultaneously taking into account aberrations (1), (3) and (4) as each electron travels from the tip to the substrate). Term (2) is then combined quadratically with the combination of the other terms. The dynamic aberration corrections employed during off-axis imaging are: (1) dynamic variation of the focal length of the main lens 510-512 (see FIG. 15) to correct for curvature of field, and (2) dynamic variation of the quadrupole excitation of the deflector/stigmator 513 (see FIG. 16) to correct for astigmatism. Given the maximum scan deflection of 125 mm, and the minimum beam FWHM diameter of about 3 μm, the optics system can produce (125 mm)/(3 μm)>41000 pixels across the scan field. This number far exceeds any expected increase in display pixel elements across the width of future generations of flat panel display substrates.

In FIG. 12, points along the curves 1003-1006 correspond to various source emission angular intensities: 100 μA/sr (points 1007), 200 μA/sr (points 1008), 300 μA/sr (points 1009), 400 μA/sr (points 1010), 500 μA/sr (points 1011), and 1 mA/sr (points 1012). As the angular intensity increases from points 1007 to points 1012, the energy spread of the electrons being emitted by the source tip 501 gradually increases, leading to increased chromatic aberration and slight increases in the FWHM beam diameters (typically ~8.2% going from 100 μA/sr to 1 mA/sr) as shown in curves 1003-1006.

Figure 13:
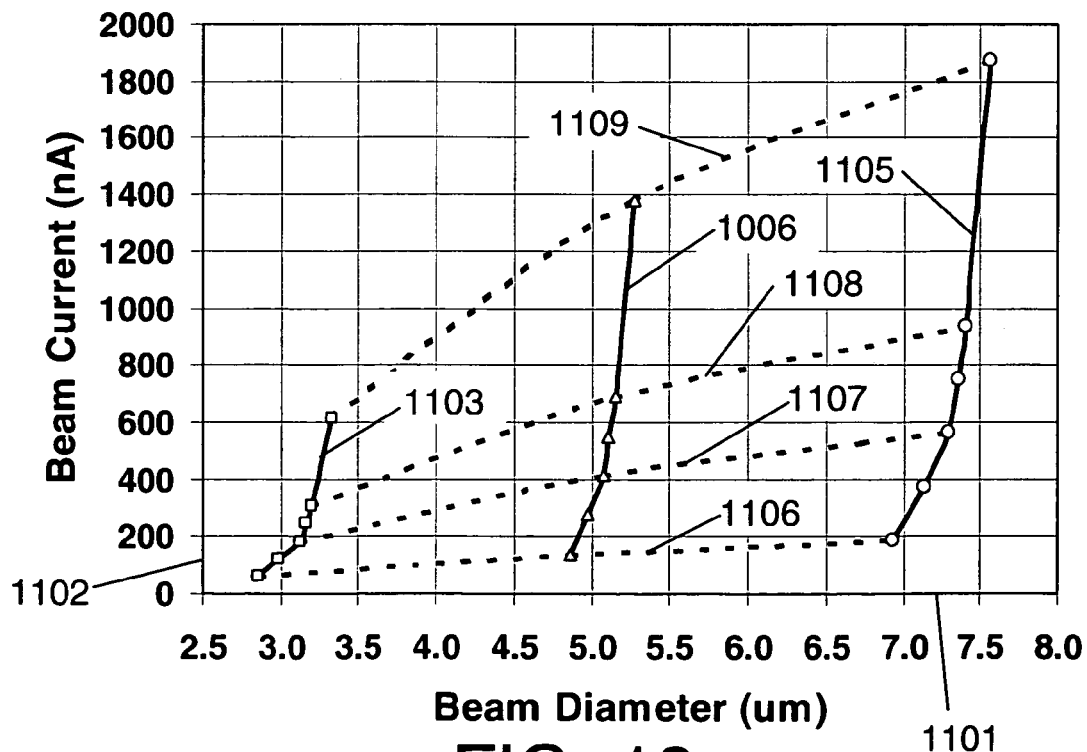
FIG. 13 shows a graph of the operating envelope of the system.

FIG. 13 is a graph of the operating envelope of the system, showing beam current 1102 vs. FWHM beam diameter 1101 (at the maximum deflection, 63 mm) for various voltage settings on the optics. Curve 1103 corresponds to the smallest beams, resulting from setting the source lens voltage to only permit the transmission of electrons leaving the source tip 501 with half-angles ≦0.8° to pass through the beam-defining aperture 505 (referring also to FIG. 4A). Curve 1006 is taken from FIG. 12, corresponding to an intermediate source lens setting, allowing electrons leaving the source tip 501 with half-angles ≦1.2° to pass through the beam-defining aperture 505. Curve 1105 corresponds to larger diameter beams, resulting from setting the source lens voltage to permit the transmission of electrons leaving the source tip 501 with half-angles ≦1.4° to pass through the beam-defining aperture 505. Curve 1106 corresponds to source emission angular intensities of 100 µA/sr. Similarly, curves 1107, 1108 and 1109, correspond to 300 µA/sr, 500 µA/sr, and 1 mA/sr, respectively.

In FIG. 13, as the maximum source half-angles are increased going from curve 1103, to curve 1006 and 1105, the source current is increased for a given source angular intensity, but the larger beam angles result in increased geometric and chromatic aberrations, thus increasing the FWHM beam diameters as shown. Any combination of FWHM beam diameter 1101 and beam current 1102 shown within the envelope bounded by curves 1103, 1109, 1105, and 1106 can be selected electrically within µs, thus the system can rapidly alternate between the larger beams (such as curves 1006 and 1105—appropriate for step 1 testing) and smaller beams (curve 1103—appropriate for step 2 defect review). This capability is important to assure that the two-step testing procedure has minimal effect on system throughput.

Figure 14:
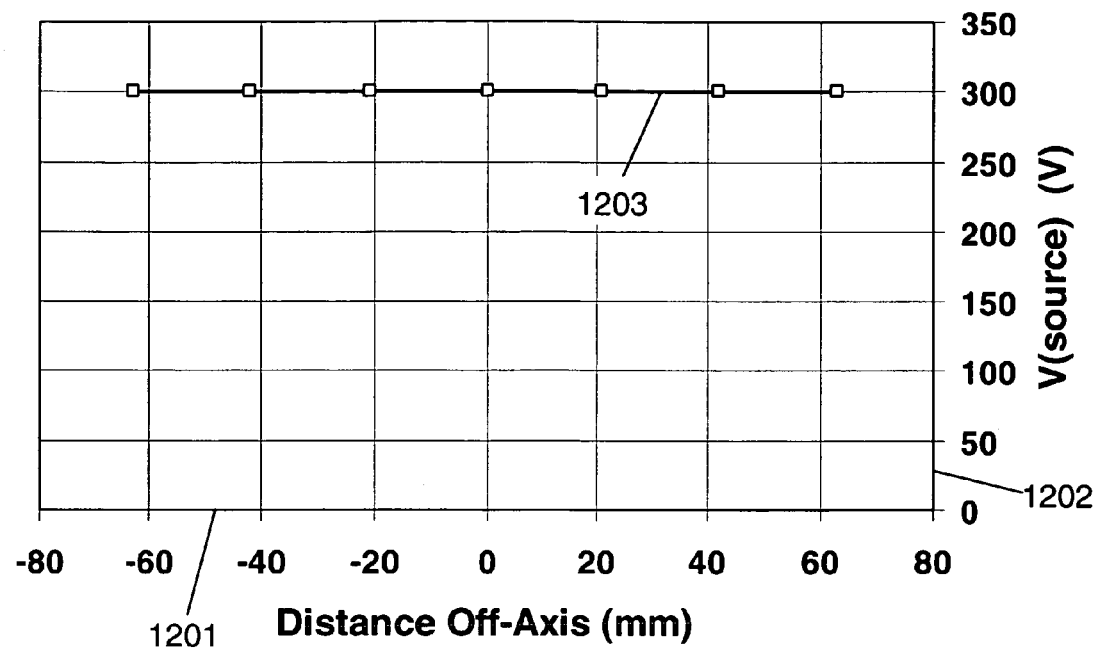
FIG. 14 shows a graph of the source lens voltage against the deflection distance off-axis.

FIG. 14 shows a graph of the source lens voltage 1202 against the deflection distance off-axis 1201, corresponding to a voltage of 2700 V on the extraction electrode 502 relative to the source tip 501 (also referring to FIG. 8A). As can be seen, the source lens voltage curve 1203 is kept constant, independent of the deflection distance 1201—this is done to reduce the number of dynamic optics voltages required during scanning. This graph corresponds to 1.2° half-angle at the source tip 501 (curve 1006 in FIGS. 12 and 13). The source lens voltages for other half-angles are shown in Table II, below (in all cases, the source lens voltages are constant for all distances off-axis).

Figure 15:
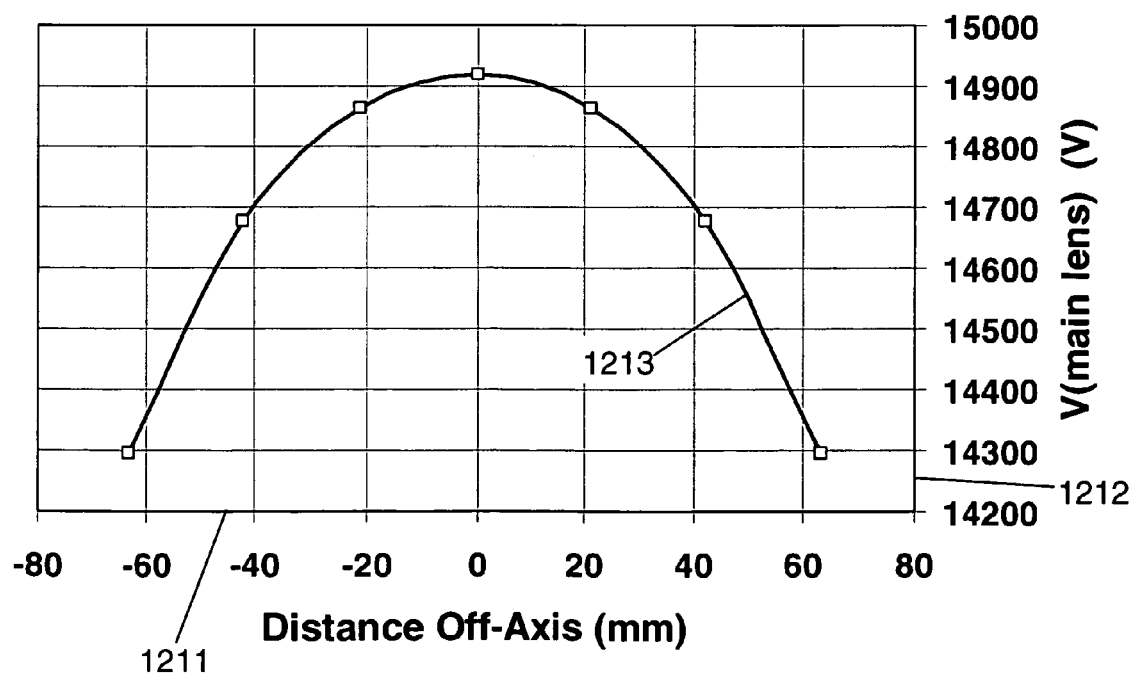
FIG. 15 shows a graph of the main lens voltage against the deflection distance off-axis.

FIG. 15 shows a graph of the main lens voltage 1212 against the deflection distance off-axis 1211, corresponding to a voltage of 2700 V on the extraction electrode 502 relative to the source tip 501 (also referring to FIG. 8A). As expected from the bi-lateral symmetry of the optics about a plane perpendicular to the main scan and containing the optical axis, the main lens voltage curve 1213 is also symmetrical about the optical axis. As the beam is deflected off-axis, the main lens voltage 1213 decreases roughly quadratically to correct for curvature of field. This graph corresponds to 1.2° half-angle at the source tip 501. For other half-angles, the main lens voltage curves would be very similar but with different peak values (on-axis), as shown in Table II.

TABLE II

Source Lens and Main Lens Voltages (relative to source tip 501) vs. Half-Angle at Source Tip (for a 2700 V Extraction Voltage).

| Half-Angle at Source Tip 501 | 0.8° | 1.2° | 1.4° |
|---|---|---|---|
| Voltage on Source Lens Electrode (on- and off-axis) 503 | 304.68 | 300 | 298.95 |
| Voltage on Main Lens Electrode #2 (on-axis) 511 | 17209 | 14295 | 12600 |

Figure 16:
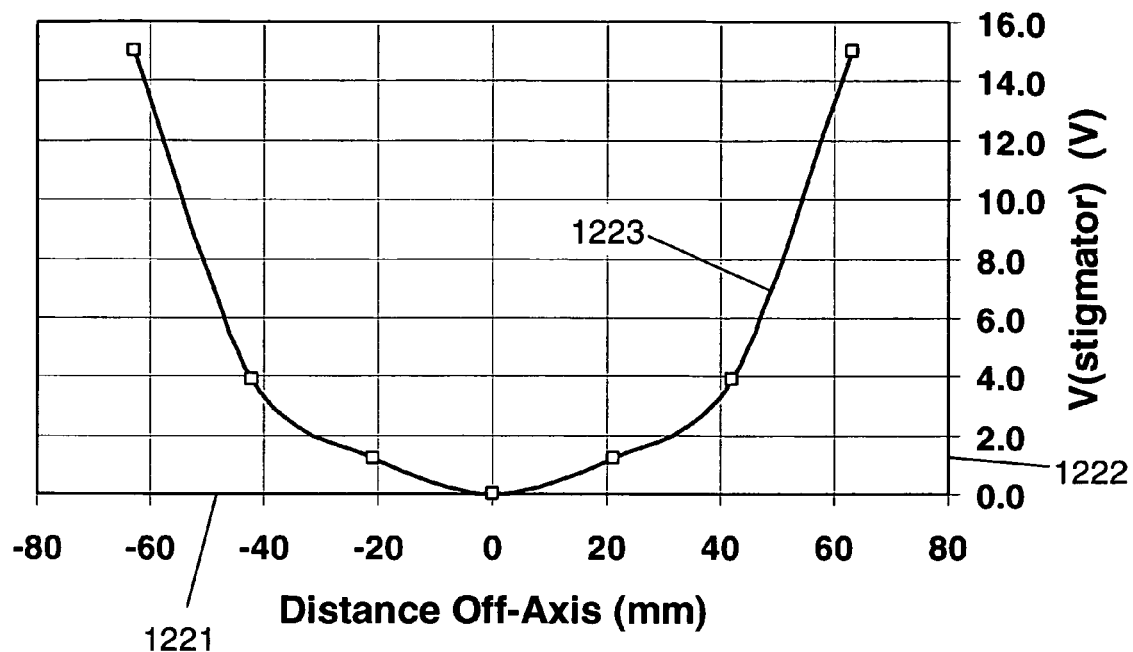
FIG. 16 shows a graph of the stigmator voltage against the deflection distance off-axis.

FIG. 16 shows a graph of the magnitude of the stigmation voltage 1222 against the deflection distance off-axis 1221. Voltage 1222 is applied to the eight electrodes 801-808 of the deflector/stigmator 513 with the polarities as shown in Table III for 63 mm maximum deflection. Again, as for FIG. 15, curve 1223 is symmetrical about the optical axis and is roughly quadratic with distance off-axis, corresponding to the expected quadratic increase in astigmatism. Curve 1223 is independent of the source extraction voltage and independent of the half-angle subtended at the source tip 501 which is transmitted through the BDA 505. (also referring to FIG. 4A).

TABLE III

Stigmation Voltages on the Deflector/Stigmator at Full Deflection (63 mm off-axis) [Note: 20000 V common-mode voltage relative to source tip 501 is not shown].

| Electrode Number | Electrode Voltage relative to common-mode. |
|---|---|
| 801 | +15 |
| 802 | −15 |
| 803 | −15 |
| 804 | +15 |
| 805 | +15 |
| 806 | −15 |
| 807 | −15 |
| 808 | +15 |

Figure 17:
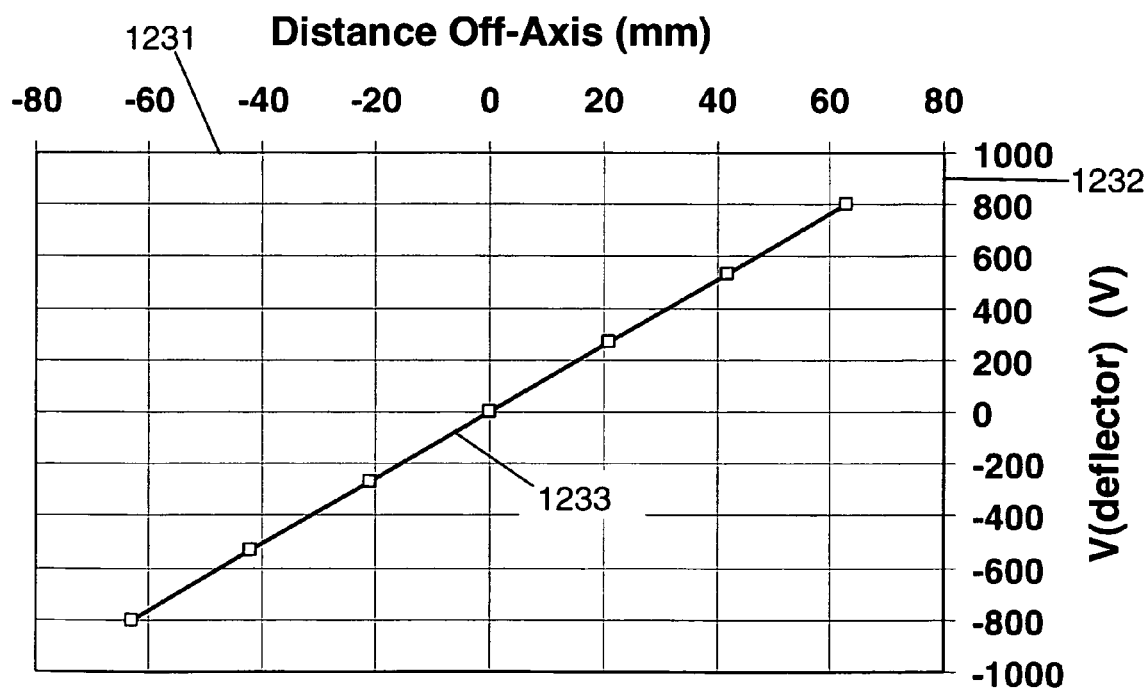
FIG. 17 shows a graph of the deflector voltage against the deflection distance off-axis.

FIG. 17 shows a graph of the magnitude of the deflection voltage 1232 against the deflection distance off-axis 1231. Curve 1233 is linear and asymmetrical through the optical axis, as expected—maximum deflection voltages on the deflector/stigmator 513 electrodes 801-808 are ±802 V (also referring to FIGS. 10A & 10B). This voltage is applied to the eight electrodes 801-808 of the deflector/stigmator 513 with the polarities as shown in Table IV. Curve 1233 is independent of the voltage source extraction voltage and is also independent of the half-angle subtended at the source tip 501 which is transmitted through the BDA 505 (also referring to FIG. 4A). The actual voltages on the deflector/stigmator 513 electrodes 801-808 are the sum of: (1) the stigmation voltages (FIG. 16 and Table III), (2) the deflection voltages (FIG. 17 and Table IV), and (3) the common-mode voltage of 20 kV relative to the source tip 501.

TABLE IV

Deflection Voltages (relative to the common-mode voltage) on the Deflector/Stigmator On-Axis and at ±Full Deflection (±63 mm) [Note: 20000 V common-mode voltage relative to source tip 501 is not shown].

| Electrode Number | Electrode Voltage At −63 mm relative to common mode | Electrode Voltage On-Axis relative to common mode | Electrode Voltage At +63 mm relative to common mode |
|---|---|---|---|
| 801 | −802 | 0 | +802 |
| 802 | −(√2 − 1) 802 = −332.2 | 0 | +(√2 − 1) 802 = +332.2 |
| 803 | +(√2 − 1) 802 = +332.2 | 0 | −(√2 − 1) 802 = −332.2 |
| 804 | +802 | 0 | −802 |
| 805 | +802 | 0 | −802 |
| 806 | +(√2 − 1) 802 = +332.2 | 0 | −(√2 − 1) 802 = −332.2 |
| 807 | −(√2 − 1) 802 = −332.2 | 0 | +(√2 − 1) 802 = +332.2 |
| 808 | −802 | 0 | +802 |

Figure 18:
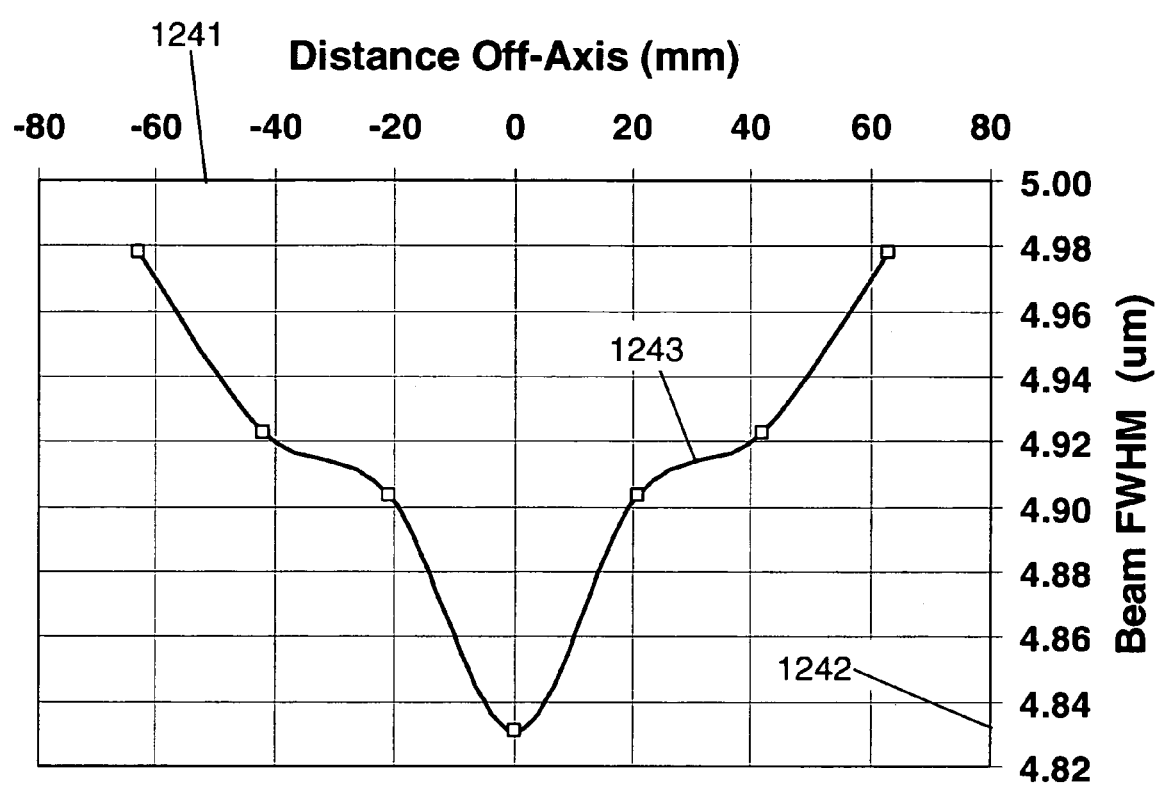
FIG. 18 shows a graph of the beam diameter against the deflection distance off-axis.

FIG. 18 shows a graph of the FWHM beam diameter 1242 against the deflection distance off-axis 1241, corresponding to: (1) a voltage of 2700 V on the extraction electrode 502 relative to the source tip 501, (2) a beam half-angle at the source tip 501 of 1.2°, and (3) a source angular intensity of 200 µA/sr (also referring to FIG. 8A). The total increase in beam FWHM diameter from the optical axis to maximum deflection is only ~3%, and is symmetrical about the optical axis, as expected.

Figure 19:
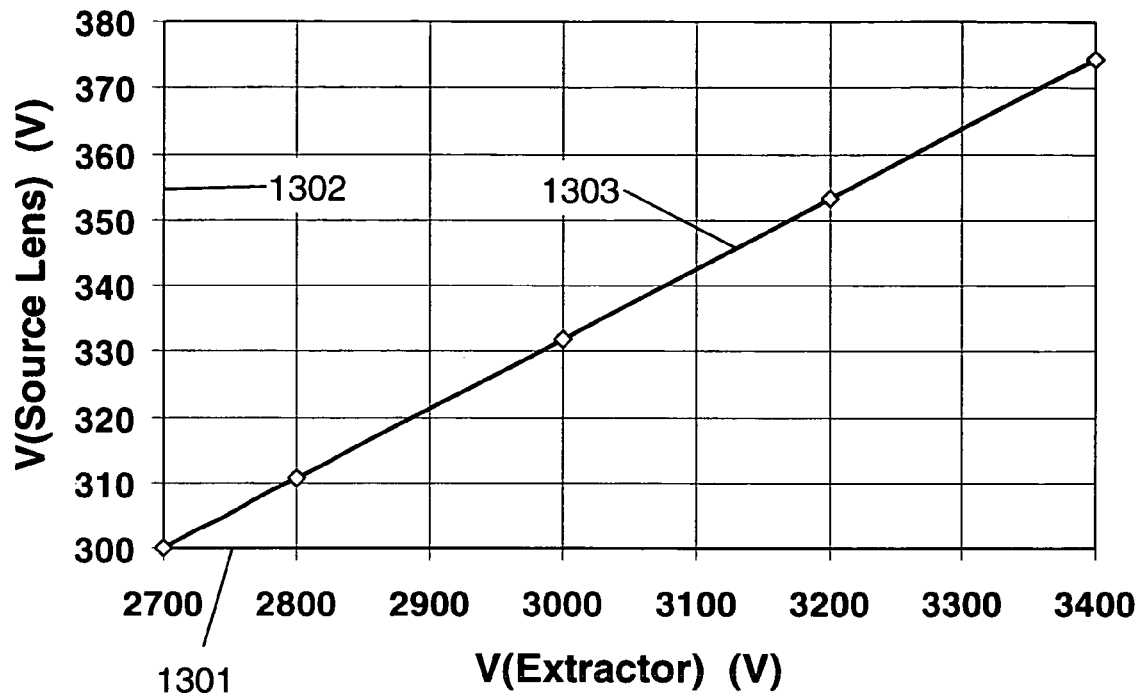
FIG. 19 shows a graph of the source lens voltage against the extractor voltage.

FIG. 19 shows a graph of the source lens voltage 1302 against the extractor voltage 1301, where both voltages 1301 and 1302 are measured relative to the source tip 501 (also referring to FIG. 8A). Due to variations in the sharpness of the source tips 501 and the distances between the source tips 501 and the extraction electrodes 502, there will be variations in the extraction voltages required to achieve the same emission angular intensities between columns. Curve 1303 is essentially a straight line, with values as shown in Table V. Table V corresponds to 1.2° half-angle at the source tip 501—similar values would apply for other half-angles ranging from 0.8° to 1.4°

Figure 20:
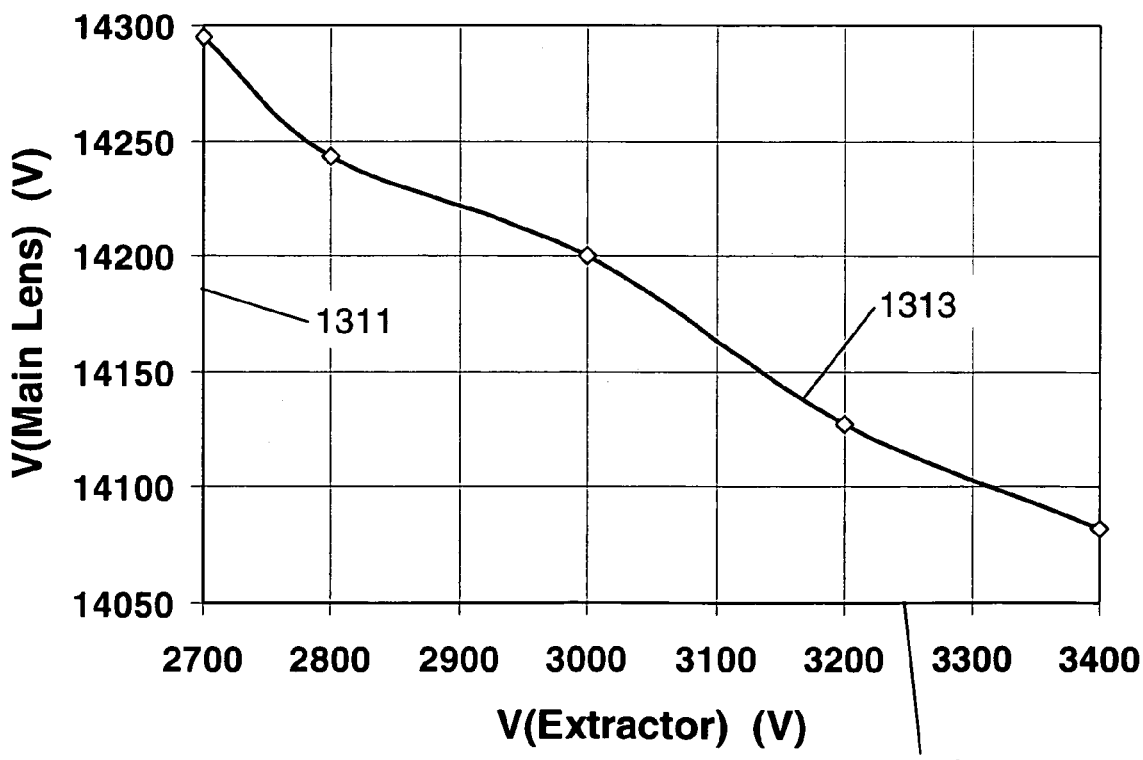
FIG. 20 shows a graph of the main lens voltage against the extractor voltage.

FIG. 20 shows a graph of the voltage 1311 on main lens electrode #2 511 against the extractor voltage 1312, corresponding to 1.2° half-angle at the source tip 501 (also referring to FIG. 8A). Values corresponding to 1.2° half-angle at the source tip 501 are shown in Table V—similar behavior of the curve would apply for other half-angles, ranging from 0.80 to 1.40 as shown in Table II.

TABLE V

Extraction Electrode, Source Lens Electrode and Main Lens Electrode #2 Voltages (relative to source tip 501).

| Voltage on Extraction Electrode 502 | Voltage on Source Lens Electrode 503 | Voltage on Main Lens Electrode #2 511 |
|---|---|---|
| 2700 | 300.0 | 14295 |
| 2800 | 310.6 | 14243 |
| 3000 | 331.9 | 14200 |
| 3200 | 353.2 | 14127 |
| 3400 | 374.5 | 14082 |

Figure 21:
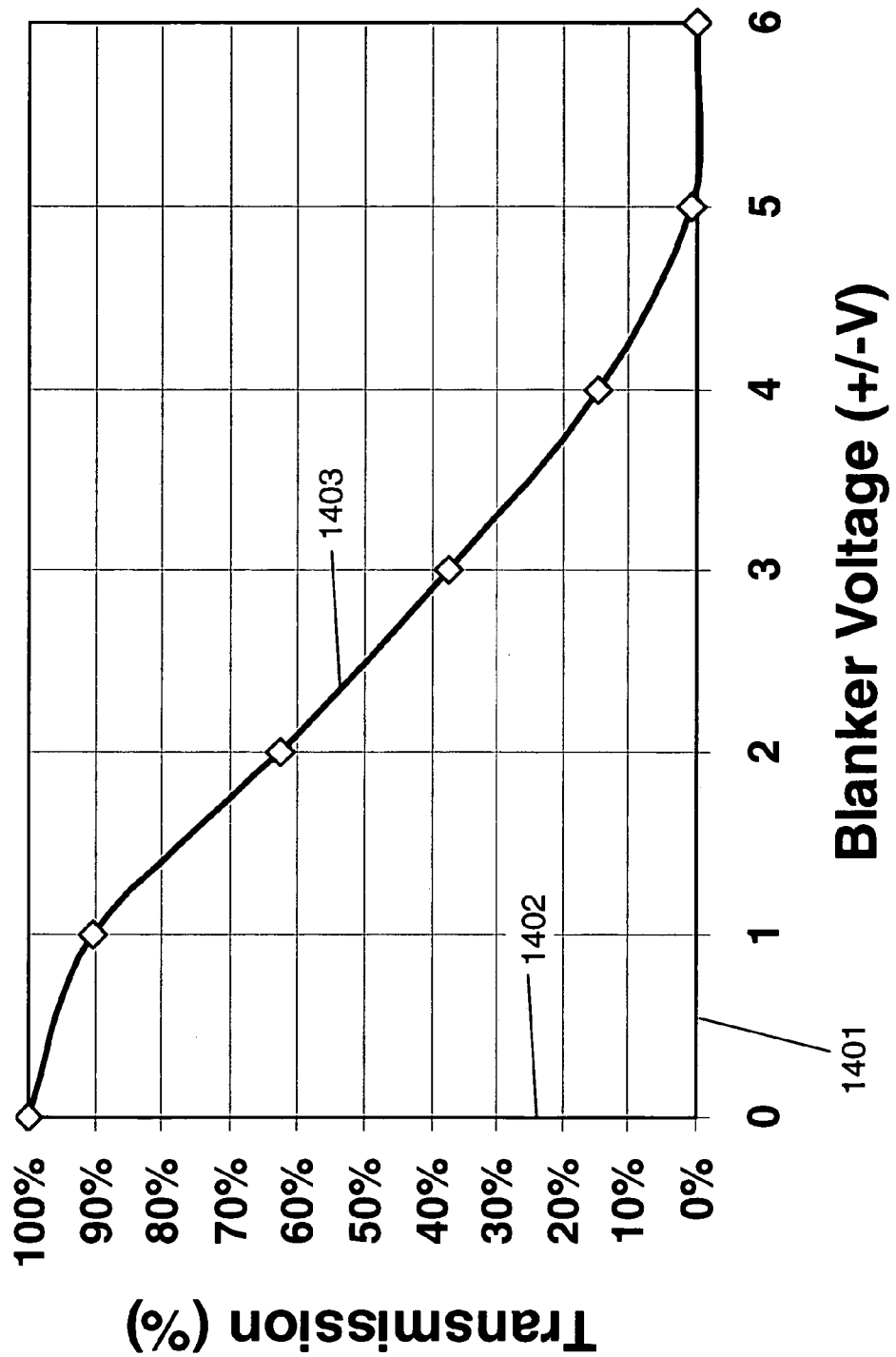
FIG. 21 shows a graph of the beam transmission to the substrate against the blanker voltage.

FIG. 21 shows a graph of the percent beam transmission 1402 to the substrate against the blanker voltage 1401. Curve 1403 shows the voltage that would be applied to one of the blanker electrodes, say 721—the other blanker electrode, 722, would then have a blanking voltage of equal magnitude and opposite polarity (also referring to FIGS. 9B, 9C & 9D). Both blanker electrodes 721 and 722 have a common-mode voltage of 568 V, onto which the blanking voltage is superimposed. As curve 1403 shows, only about 5 V is required to completely blank the beam—this allows blanking with ns precision since the blanker electrodes 721 and 722 have been designed with very low capacitance, as described above. Since the cross-over 701 is at the center of the blanker 506, blanking is conjugate, i.e., the beam does not move across the substrate surface 402 while the beam is being blanked.

Figure 22:
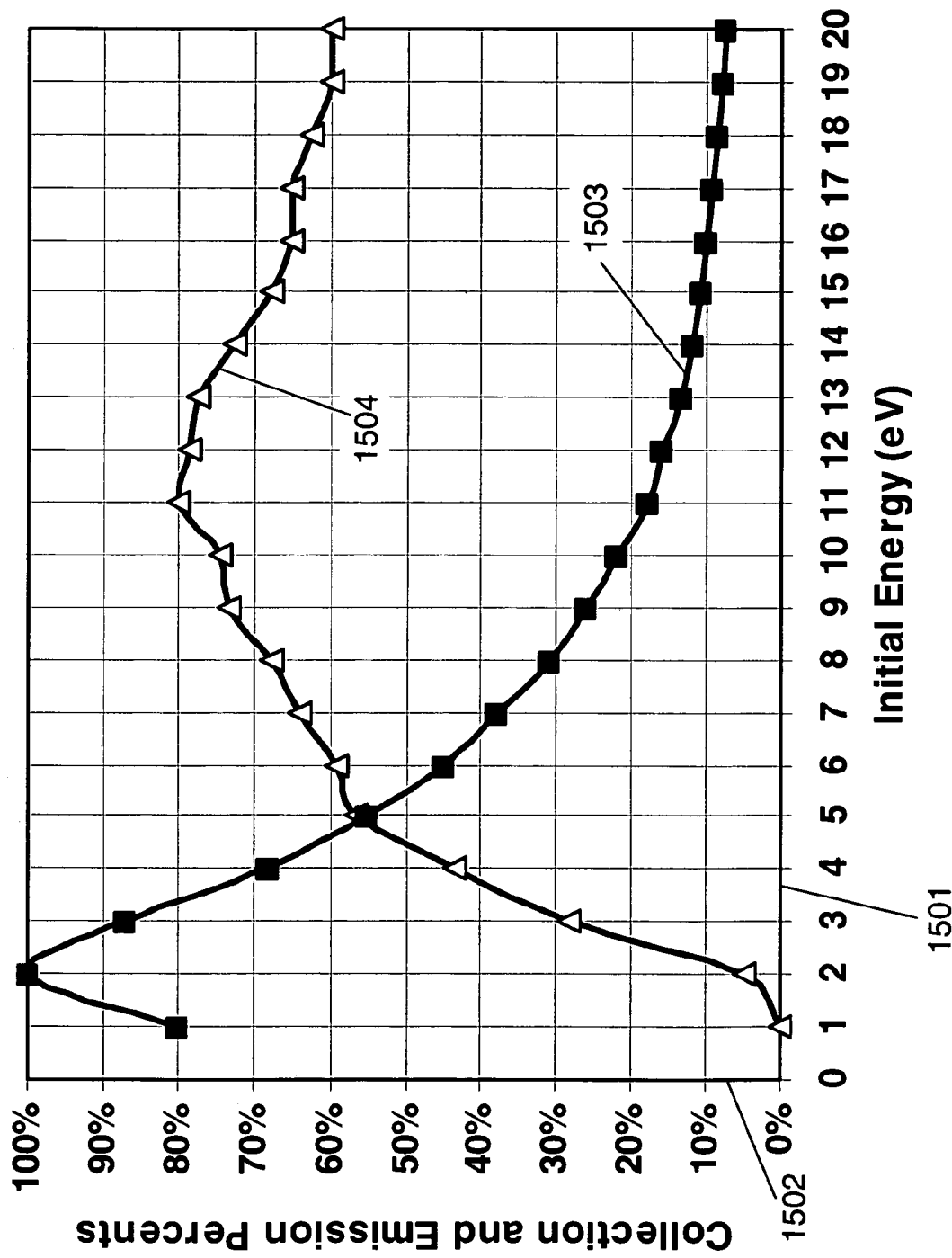
FIG. 22 shows a graph of the secondary electron collection efficiency and emission distribution against the initial secondary electron energy at the substrate.

FIG. 22 shows a graph of the secondary electron (SE) collection efficiency 1504 and SE emission distribution 1503 (both against the same axes 1502 and 1501). Curve 1503 is a function only of the material emitting the secondary electrons 904 from location 907 in FIG. 11A, and has a pronounced peak at 2 eV, with a rapid drop off towards 20 eV, which is taken as the cut-off for the calculations. Curve 1504 is a function only of the design of the detector optics assembly, comprising the field-free tube 902, the voltage contrast electrodes 905, and secondary electron detector 903, as well as the voltage on the substrate surface 402.

Figure 23:
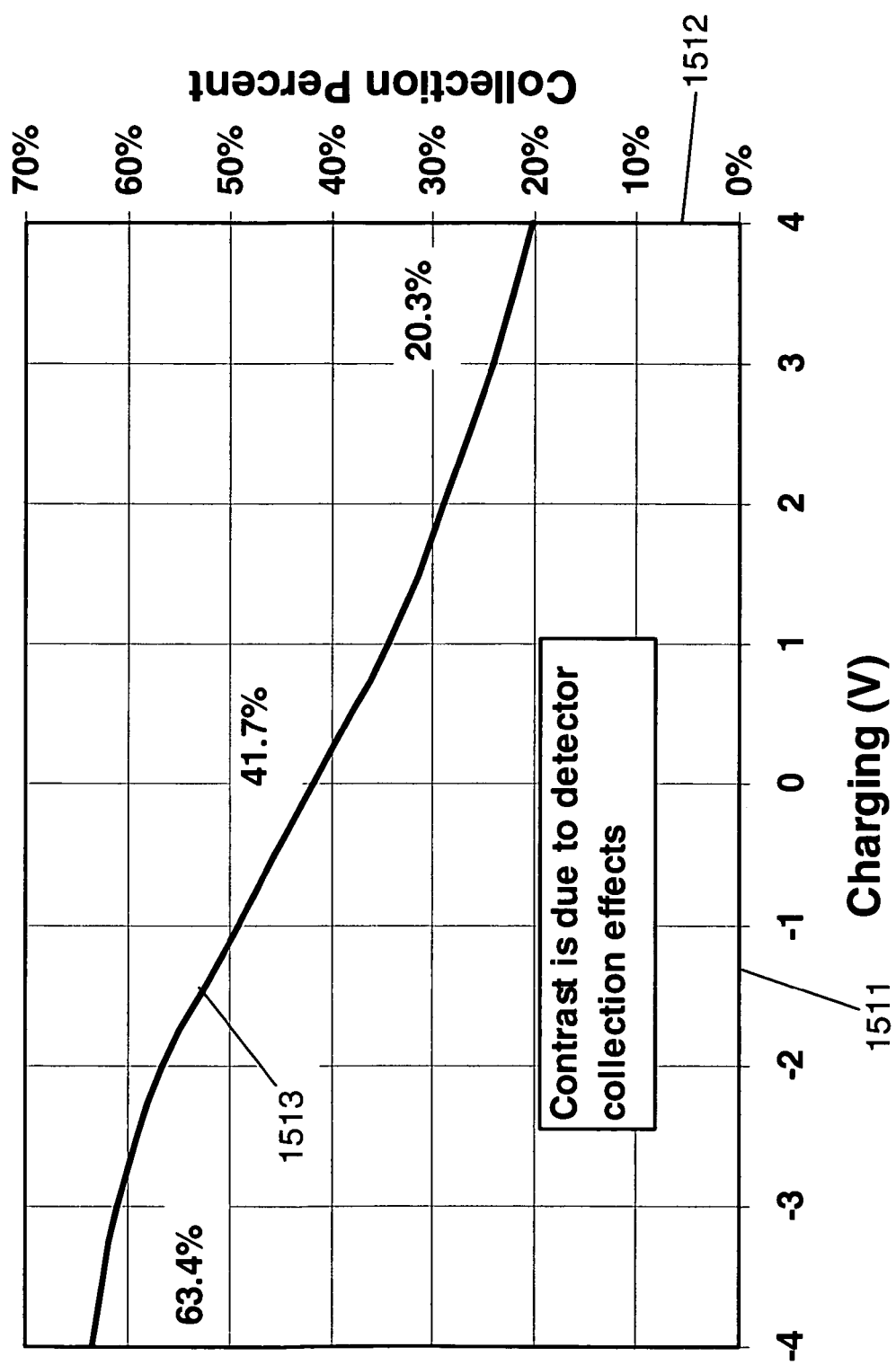
FIG. 23 shows a graph of the secondary electron collection percent against the charging voltage on the substrate.

FIG. 23 shows a graph of the secondary electron collection percent 1512 against the charging voltage 1511 on the substrate 402. Curve 1513 decreases monotonically and fairly linearly from −4 V charging (63.4% efficiency) to +4 V charging (20.3% efficiency). For no charging (0 V), the collection efficiency is 41.7%. The collection efficiency curve 1513 in FIG. 23 is calculated using the following formula:

$E_{init}$=initial secondary electron (SE) energy (1 to 20 eV, in steps of 1 eV)

$E_{charging}$=e[charging voltage at surface] (−4 to +4 eV, in steps of 1 eV)

$S(E_{init})$=emission distribution 1503 of SE (normalized to 100% at 2 eV)

$C(E)$=collection efficiency for SE, where $E=E_{init}-E_{charging}$
=0 for E<0 eV or E>20 eV
=curve 1504 for 0 eV≦E≦20 eV $P(E_{charging})$=collection percent 1513:

$$P(E_{charging}) = \sum_{E_{init}=0eV}^{E_{init}=20eV} S(E_{init})C(E_{init} - E_{charging})$$

Figure 24:
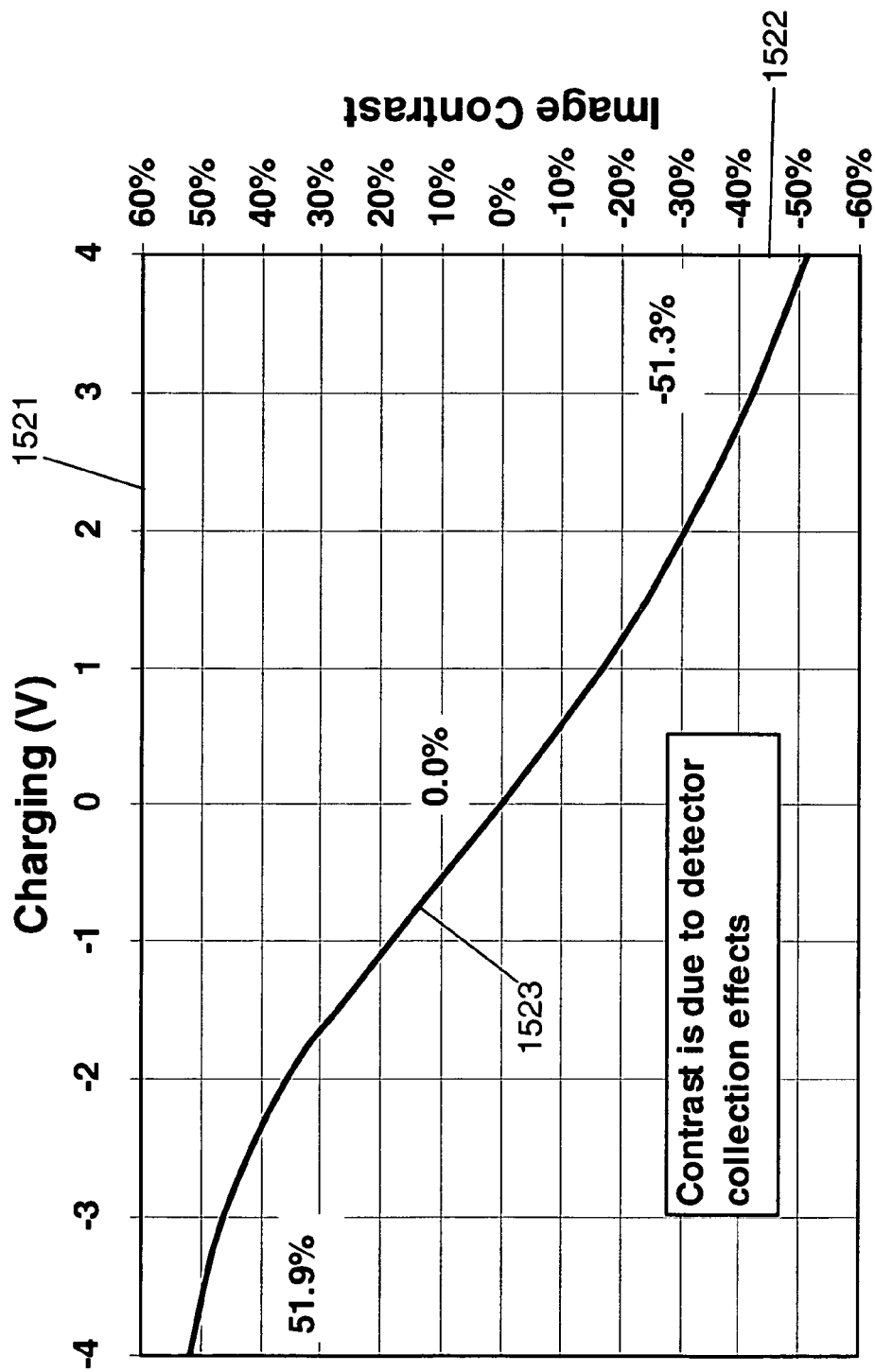
FIG. 24 shows a graph of the image contrast against the charging voltage on the substrate.

FIG. 24 shows a graph of the image contrast percent 1522 against the charging voltage 1521 on the substrate 402 (also referring to FIG. 11A). Image contrast corresponds to the relative imaging signal for a given amount of substrate charging compared with the imaging signal for no charging:

$I(V_{charging})$=signal intensity (with a charging voltage=$V_{charging}$)

$I(0)$=signal intensity with no charging (i.e., $V_{charging}$=0)

Relative Contrast $(V_{charging})=[I(V_{charging})-I(0)]/I(0)$

Curve 1523 has the same shape as curve 1513, but curve 1523 passes through the origin (0,0) of the graph. From FIG. 23, for −4 V charging (net accumulation of electrons), the collection efficiency is 63.4% (compared with 41.7% at 0 V), giving a relative contrast of:

Relative Contrast at −4 V=(63.4%−41.7%)/ 41.7%=51.9%

For +4 V charging (net deficit of electrons), the collection efficiency drops to 20.3%, giving a relative contrast of:

Relative Contrast at +4 V=(20.3%-41.7% )/[[96%]] 41.7%=−51.3%

Curves 1513 and 1523 correspond to the effects of changes in the detector optics collection efficiency—no account is taken of possible additional effects due to local topography on the substrate surface 402.

Figure 25:
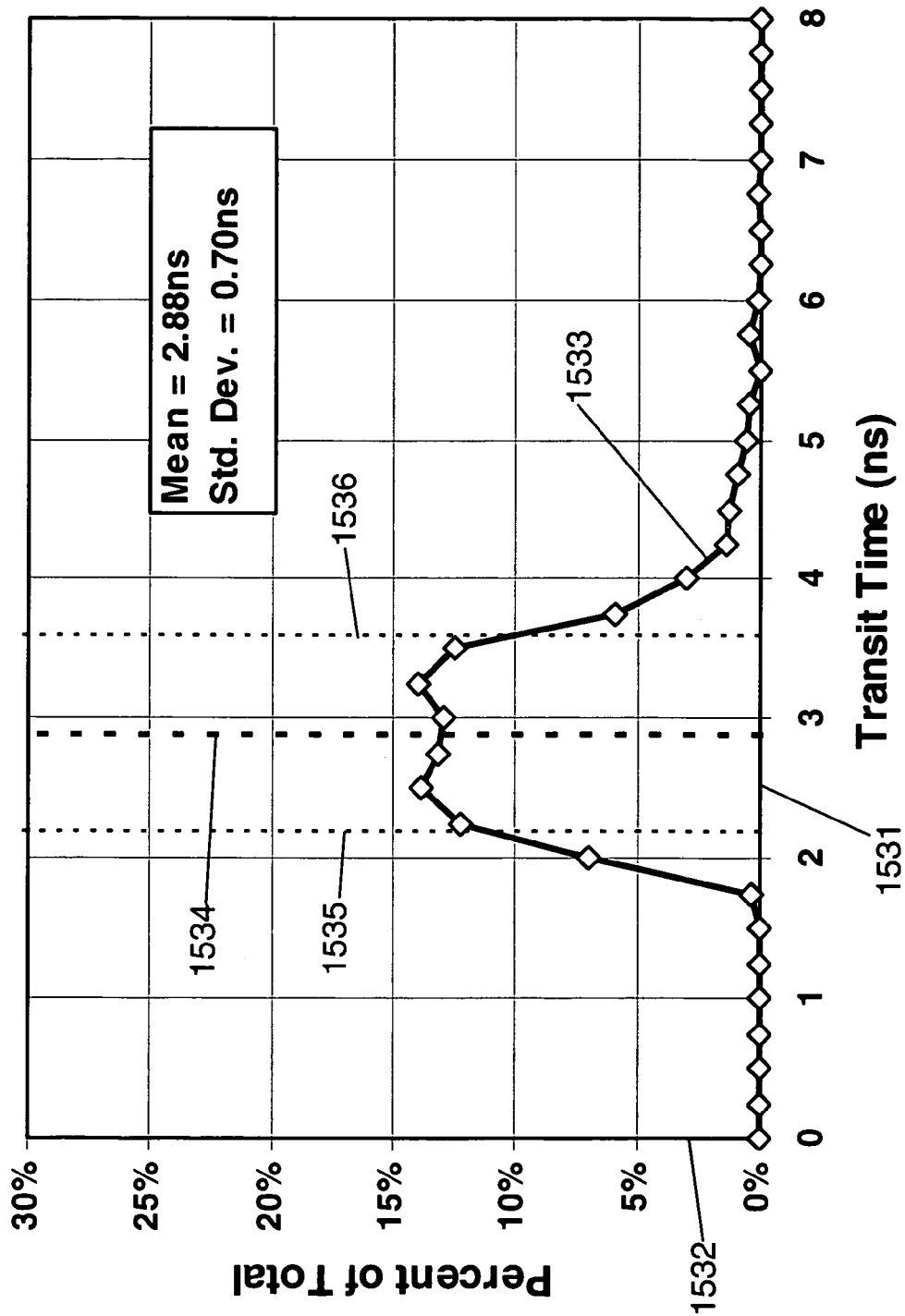
FIG. 25 shows a graph of the percent of total secondary electrons (SEs) arriving at the detector against the transit time of the SEs from the substrate surface to the detector.

FIG. 25 is a graph of the percent of total secondary electrons (SEs) 1532 arriving at the detector 903 against the transit time 1531 of the SE from the substrate surface 402 to the detector 903 (also referring to FIG. 11A). The mean transit time 1534 is 2.88 ns, with a standard deviation σ of 0.70 ns (−σ transit time is line 1535, +σ transit time is line 1536). Curve 1533 shows that essentially all the SEs arrive at the detector 903 within 2 to 4 ns of emission from the substrate surface 402. The limit on the maximum detector bandwidth imposed by the SE transit time is:

Maximum Bandwidth = 1 / (max time − min time)

= 1 / (4 ns − 2 ns) ≈ 500 MHz

For the demands of flat panel display substrate inspection and testing, 500 MHz is more than adequate, since sample times are typically several μs, and thus require bandwidths <1 MHz.

Table VI summarizes typical electrode voltages for the column in the case of an extraction voltage (voltage between the source tip 501 and the extraction electrode 502, referring to FIG. 8A) of 2700 V. Voltages are shown, relative to the source tip 501. For reasons of safety, it may be preferable to bias the substrate near ground, in which case the source tip would be biased near −20 kV. All the voltages given in tables I-VI would then be offset by the source tip 501 voltage.

TABLE VI

Electrode Voltages (with 2700 V Extraction Voltage) for the first embodiment of the present invention, as shown in FIG. 4A.

| Electrode Number | Half-Angle of 0.8° | Half-Angle of 1.2° | Half-Angle of 1.4° |
|---|---|---|---|
| Source Tip 501 | 0 | 0 | 0 |
| Extraction Electrode 502 | 2700 | 2700 | 2700 |
| Source Lens Electrode 503 | 304.68 | 300 | 298.95 |
| Source Mounting Plate 504, BDA 505, Blanker 506 C.M. and Alignment Deflector 507 C.M. | 568 | 568 | 568 |
| BPA Mount 508, BPA 509, Main Lens Electrode #1 510 | 6000 | 6000 | 6000 |
| Main Lens Electrode #2 511 with Beam On-Axis | 17563 | 14918 | 13917 |
| Main Lens Electrode #2 511 with Beam Off-Axis | 17209 | 14295 | 12600 |
| Main Lens Electrode #3 512, Deflector/Stigmator 513 C. M., FFT 902, VCEs 905, Pumpout Plates 906 and 930 | 20000 | 20000 | 20000 |
| Detector 903 | 24000 | 24000 | 24000 |
| Substrate 402 | 20010 | 20010 | 20010 |

FIGS. 26 through 31 illustrate a second embodiment of the present invention with the following differences from the first embodiment illustrated in FIGS. 4 through 25:

1) The cross-over at the beam blanker is eliminated.
2) The beam diameter is increased over the length of the column from the tip to the substrate.
3) A double-deflection beam blanker is used for which the beam crossover is effectively at the virtual electron source.
4) The beam is accelerated to 20 keV in the gun and remains at high energy all the way to the substrate.
5) The stigmation and deflection functions are performed by two separate optical elements, a stigmator and a deflector instead of being combined within a single stigmator/deflector element.
6) The stigmator is a dodecapole (12-electrode) optical element enabling the correction of both first-order and second-order astigmatisms.
7) The deflector is optimized for large deflection along the main scan axis using a rectangular cross-section requiring only four electrical connections, instead of the eight electrical connections required for the stigmator/deflector of the first embodiment.
8) The detector optics now has separate secondary electron (SE) and backscattered electron (BSE) detectors, generating simultaneous SE and BSE signals, and wherein the voltage control electrodes are configured to eliminate "cross-contamination" of secondary electrons in the BSE signal and backscattered electrons in the SE signal.
9) The working distance below the voltage control electrodes has been increased to 20 mm.

Advantages of the design of the second embodiment of the present invention relative to the first embodiment include the following:

1) The elimination of the beam cross-over, the larger beam diameter and the higher beam energy in the column combine to substantially reduce the effects of space-charge beam broadening on the focused spot size at the substrate.
2) The dodecapole stigmator is capable of correcting essentially all astigmatism induced in the beam by the large-angle deflection required to scan the beam over a >125 mm distance.
3) The ability to generate two simultaneous signals, one purely due to SEs and the other purely due to BSEs, enables the generation of a combined testing signal which is independent of the primary beam current and is a monotonically-varying function of the voltage on the substrate surface.

Disadvantages of the design of the second embodiment of the present invention relative to the first embodiment include the following:

1) The double-deflection beam blanker requires two sets of parallel plates, increasing the complexity of the column and the control electronics.
2) The electrodes of the dodecapole stigmator require 12 control voltages, increasing the electronics complexity.
3) The dual detectors require two sets of data acquisition electronics.

Figure 26:
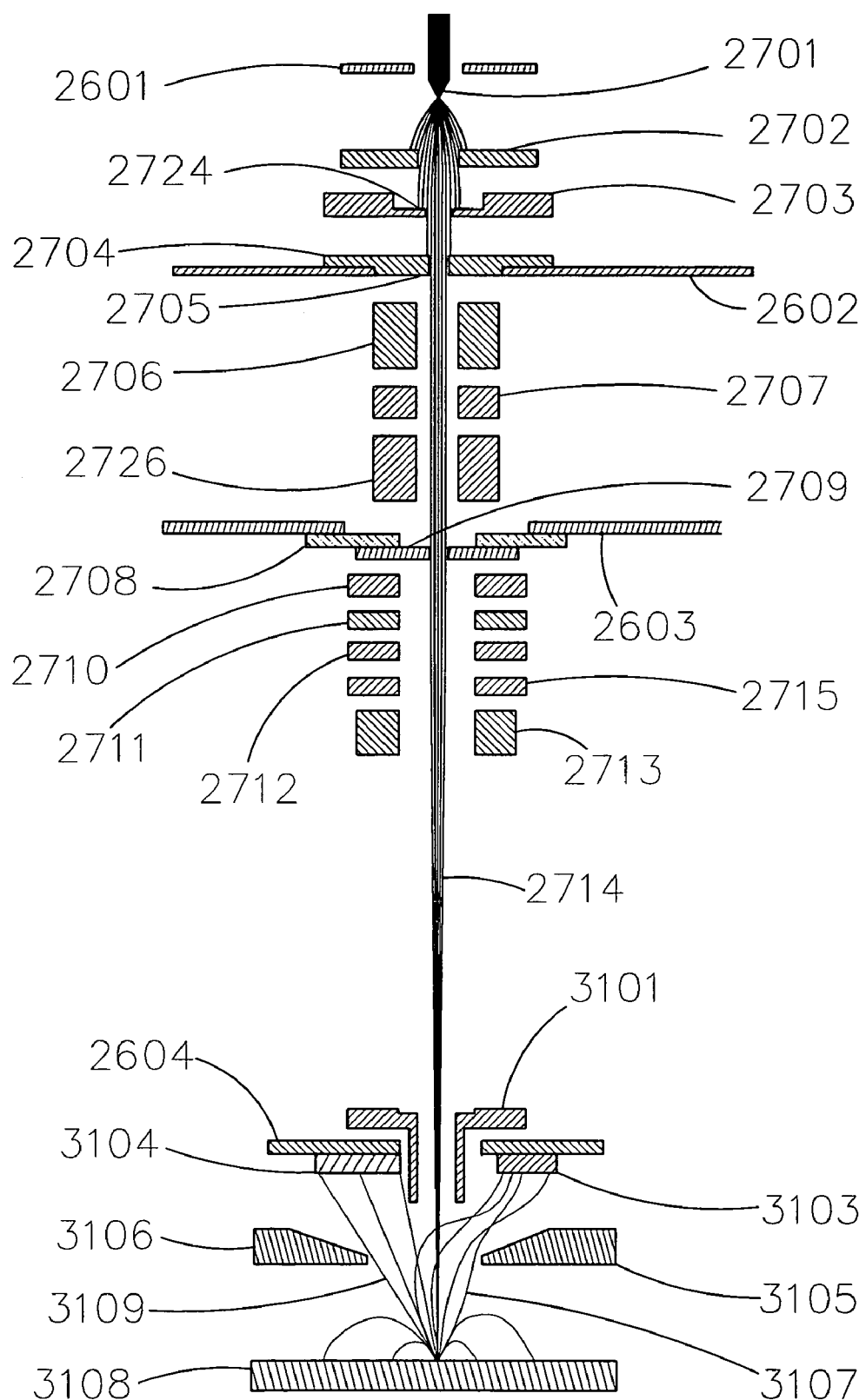
FIG. 26 shows a schematic cross-section of a second embodiment of an electron optical column assembly in a plane containing the optical axis of one column and perpendicular to the main scan axis.

FIG. 26 shows a schematic cross-section of a second embodiment of an electron optical column assembly in a plane containing the optical axis of one column and perpendicular to the main scan axis. Electrons are emitted by the source tip 2701 under the influence of a high electric field generated by the voltage difference between the tip 2701 and the extraction electrode 2702, typically 2700-3400 V. The suppressor electrode 2601 is typically biased negative relative to the tip 2701 to suppress electron emission from the shank (upper cylindrical portion) of the tip 2701, since this emission cannot be used to form the electron beam. The source lens comprises the extraction electrode 2702, the source lens electrode 2703, the beam-limiting aperture 2724, and the source plate 2704. Depending on the voltage applied to the source lens electrode 2703, the source lens will transmit rays through the BDA 2705 with initial half-angles at the source tip 2701 over ranges varying from 0.0°-0.8° to 0.0°-2.0°.

Electrons passing through the BDA 2705 enter the blanker/aligner assembly comprising the upper blanker 2706, alignment deflector 2707, and lower blanker 2726. In the column shown in FIG. 26, the blanker is inactivated, so the beam 2714 is not deflected off the optical axis, and passes through the blanking and pumping aperture (BPA) 2709 and into the main lens. The alignment deflector 2707 is used to correct for any misalignments of the column by steering the beam 2714 into the BPA 2709. The BPA 2709 is supported by insulator 2708, which is attached to the BPA mounting plate 2603.

The main lens comprises electrodes 2710, 2711, and 2712, forming a focused spot on the surface of substrate 3108. The stigmator 2715 corrects beam shape distortions caused by the beam deflection induced by deflector 2713. The detector optics comprises the field-free tube 3101, the SE detector 3103, the BSE detector 3104, and the voltage contrast electrodes (VCEs) 3105 and 3106. The detectors 3103 and 3104 are mounted on the detector support 2604. Secondary electrons 3107 and backscattered electrons 3109 are emitted from the substrate surface 3108 due to the interaction of the 20 keV primary beam 2714 with the material in the substrate 3108. A 4000 V bias relative to the substrate surface 3108 is applied to the SE detector 3103, causing secondary electrons (SEs) 3107 to be attracted to the SE detector 3103. A −61 V bias is applied to the BSE detector 3104 to prevent SEs (which have energies. <30 eV) from reaching the BSE detector 3104. The field-free tube (FFT) 3101 and the voltage control electrodes (VCEs) 3105 and 3106 are biased −31 V relative to the substrate 3108, thus the secondary electrons 3107 are repelled from the lower end of the FFT 3101 and from the upper and lower surfaces of the VCEs 3105 and 3106.

Figure 27:
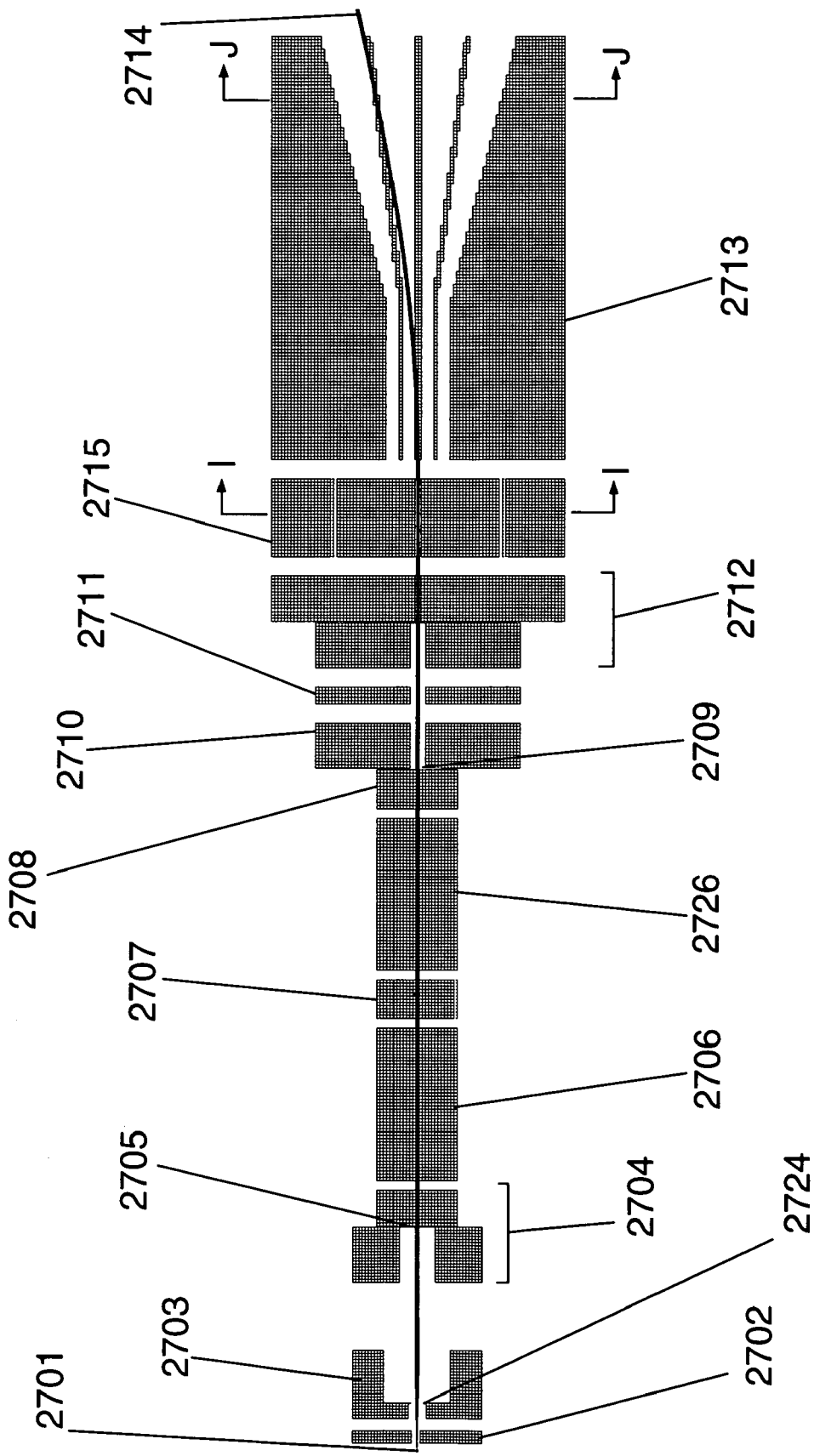
FIG. 27 shows a cross-section of a second embodiment of the upper column optics of an electron optical column assembly in a plane containing the optical axis and the main scan axis.

FIG. 27 is a cross-section of a second embodiment of the upper column in a plane containing the optical axis and the main scan axis. The upper column optics is shown to scale. The overall length from the source tip 2701 to the exit surface of the deflector 2713 is 87.2 mm. Shown in the figure are the following: the source tip 2701, extraction electrode 2702, source lens electrode 2703, beam limiting aperture (BLA) 2724, source plate 2704, beam-defining aperture 2705, upper blanker 2706, alignment deflector 2707, lower blanker 2726, the blanking and pumping aperture (BPA) 2709, BPA mount 2708, main lens electrode #1 2710, main lens electrode #2 2711, main lens electrode #3 2712, stigmator 2715, deflector 2713, cross-section I-I through the stigmator 2715, cross-section J-J through the deflector 2713, and the deflected beam 2714. Considerations for the choice of the source tip 2701 and the electrode materials and mounting insulators are the same as for the first embodiment of the present invention. The operation of the source tip 2701 and the source design method are also the same as for the first embodiment (refer to FIGS. 8A and 8B).

Figure 28A:
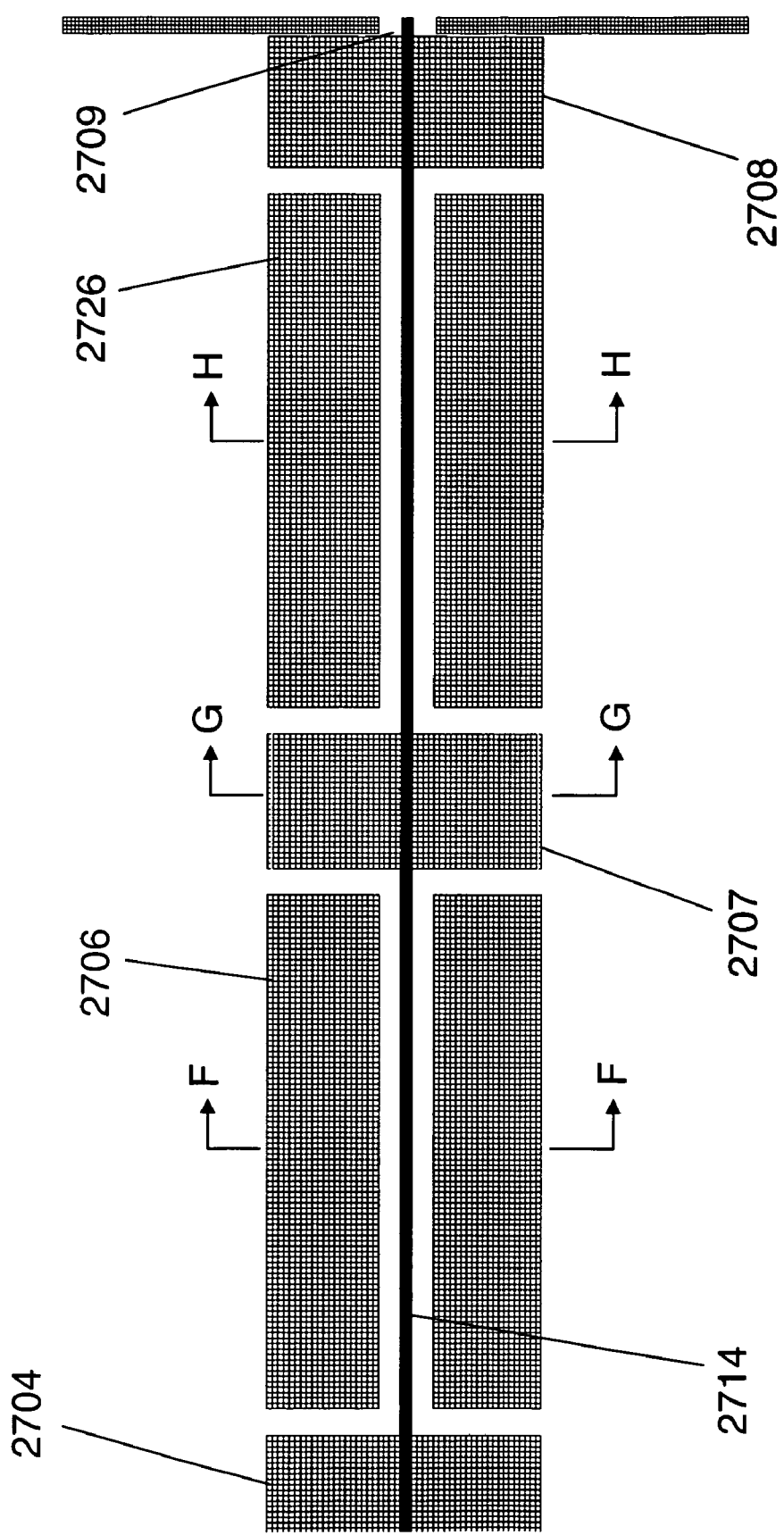
FIG. 28A shows a close-up of the column of FIG. 27 from the source plate 2704 to the blanking and pumping aperture 2709.

FIG. 28A shows a close-up of the blanker/aligner assembly from FIG. 27 comprising: the source plate 2704, upper blanker 2706, alignment deflector 2707, lower blanker 2726, blanking and pumping aperture (BPA) 2709, BPA mount 2708, and beam 2714. Three cross-sections are shown: section F-F through the center of the upper blanker 2706, section G-G through the center of the alignment deflector 2707, and section H-H through the center of the lower blanker 2726. The profile of beam 2714 shows the absence of any crossovers within the blanker/aligner assembly, in contrast to the crossover 701 at the center of blanker 506 in the first embodiment (see FIG. 9A). Depending on the voltage applied to the source lens electrode 2703 (see FIG. 27), electrons with maximum initial half-angles from 0.8° to 2.0° will pass through the BDA 2705, mounted in the source plate 2704. Electrons passing through the BDA 2705 enter the blanker/aligner assembly.

FIG. 28B is a view in cross-section F-F through the middle of the upper blanker 2706. To unblank the beam, the voltages on electrodes 2821 and 2822 would both be at +20 kV relative to the source tip 2701. To blank the beam, the voltage on electrode 2821 would be increased by 45 V and the voltage on electrode 2822 would be decreased by 45 V, thereby generating a transverse electric field which deflects the beam 2714 off the optical axis.

FIG. 28C is a view in cross-section G-G through the middle of the alignment deflector 2707. The eight octupole electrodes 2851-2858 are shown, along with a cross-section of the beam 2714. To deflect the beam 2714 for alignment purposes, a rotatable electrostatic dipole excitation is applied to the electrodes 2851-2858. For example, to deflect the beam 2714 to the right in FIG. 28C, Table VII shows the voltages that could be applied to the alignment deflector electrodes 2851-2858:

TABLE VII

Alignment Deflector Voltages (relative to source tip 2701).

| Electrode Number in Alignment Deflector 2707 | Voltage on Electrode |
|---|---|
| Electrode 2851 | 20000 + 10 |
| Electrode 2852 | 20000 + 10 ($\sqrt{2}$ − 1) = 20000 + 4.14214 |
| Electrode 2853 | 20000 − 10 ($\sqrt{2}$ − 1) = 20000 + 4.14214 |
| Electrode 2854 | 20000 − 10 |
| Electrode 2855 | 20000 − 10 |
| Electrode 2856 | 20000 − 10 ($\sqrt{2}$ − 1) = 20000 + 4.14214 |
| Electrode 2857 | 2000 + 10 ($\sqrt{2}$ − 1) = 20000 + 4.14214 |
| Electrode 2858 | 20000 + 10 |

The common mode voltage of 20 kV relative to the source tip 2701 is also shown. The deflection sensitivity of the alignment deflector 2707 at the plane of the blanking and pumping aperture 2709 is 1.13 μm/V.

FIG. 28D is a view in cross-section H-H through the middle of the lower blanker 2726. To unblank the beam, the voltages on electrodes 2841 and 2842 would both be at +20 kV relative to the source tip 2701. To blank the beam, the voltage on electrode 2841 would be decreased by 45 V and the voltage on electrode 2842 would be increased by 45 V, thereby generating a transverse electric field which deflects the beam 2714 in the opposite direction from the deflection induced by the upper blanker 2706. The net effect of the beam deflections induced by the upper and lower blankers is to restore the beam to a direction essentially parallel to the optical axis, but offset from the optical axis a sufficient distance to prevent the beam 2714 from passing through the beam blanking and pumping aperture (BPA) 2709. In order to maximize the blanking speed, the same considerations apply to the designs of the upper and lower blankers of the second embodiment as applied to the design of blanker 506 in the first embodiment of the present invention.

Figure 29:
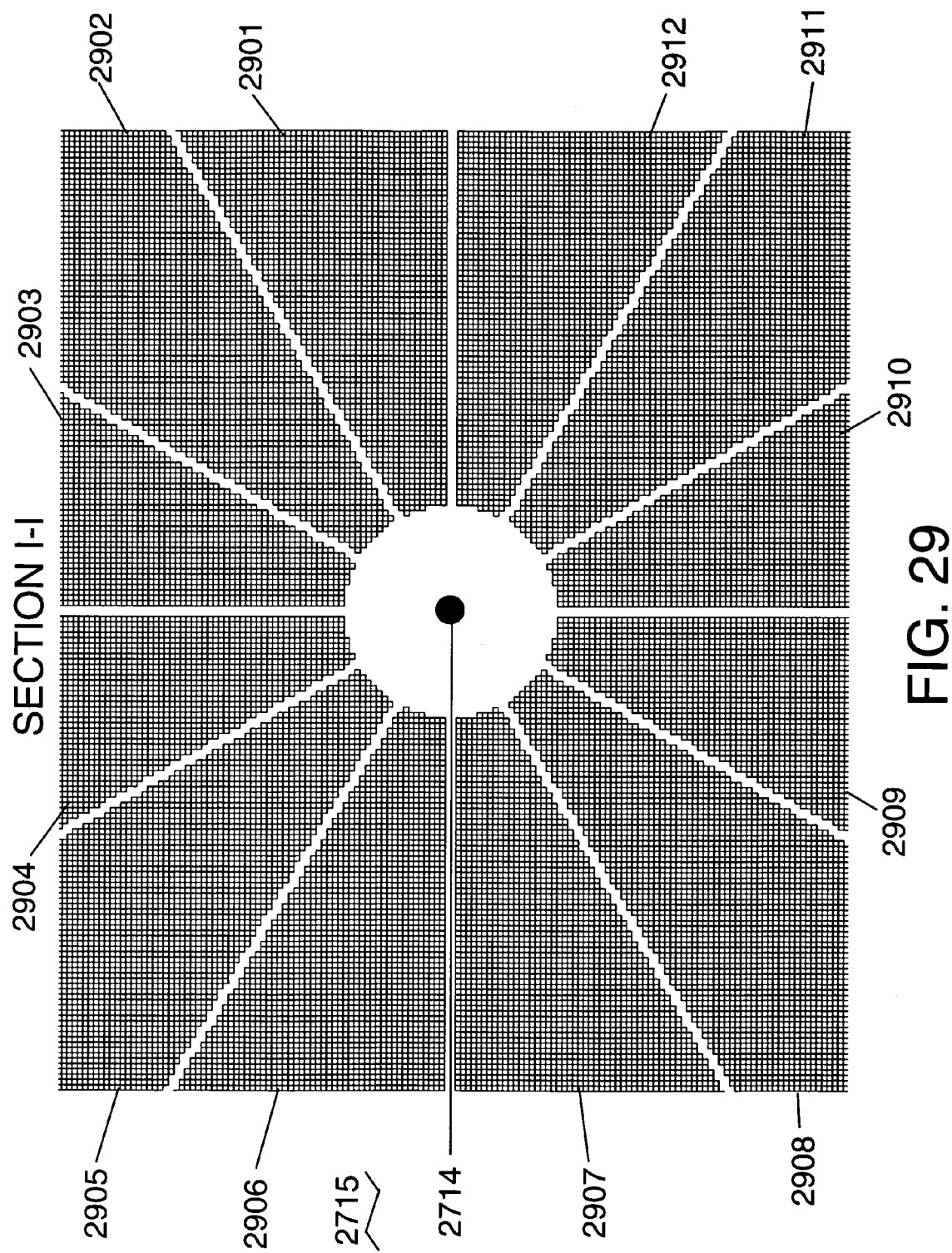
FIG. 29 shows section I-I through stigmator 2715 in FIG. 27.

FIG. 29 is a view in section I-I of FIG. 27 showing a cross-section through the stigmator 2715. The twelve dodecapole electrodes 2901-2912 are shown, along with a cross-section of the beam 2714. Due to the large beam deflections required for e-beam substrate testing, substantial amounts of astigmatism are induced in the beam. First-order astigmatism causes the beam cross-section to have a line shape, instead of round. Second-order astigmatism causes the beam to have a triangular shape. In order to preserve a round beam up to 63 mm off-axis, it may be necessary to correct both orders of astigmatism. Second-order correction requires an optical element with at least 12-fold symmetry (i.e., at least 12 electrodes mounted azimuthally around the beam passing through the center of the optical element).

To correct for first-order astigmatism in the beam 2714, a rotatable electrostatic quadrupole excitation would be applied to electrodes 2901-2912. To correct for second-order astigmatism in the beam 2714, a rotatable electrostatic hexapole excitation would be applied to electrodes 2901-2912.

Figure 30A:
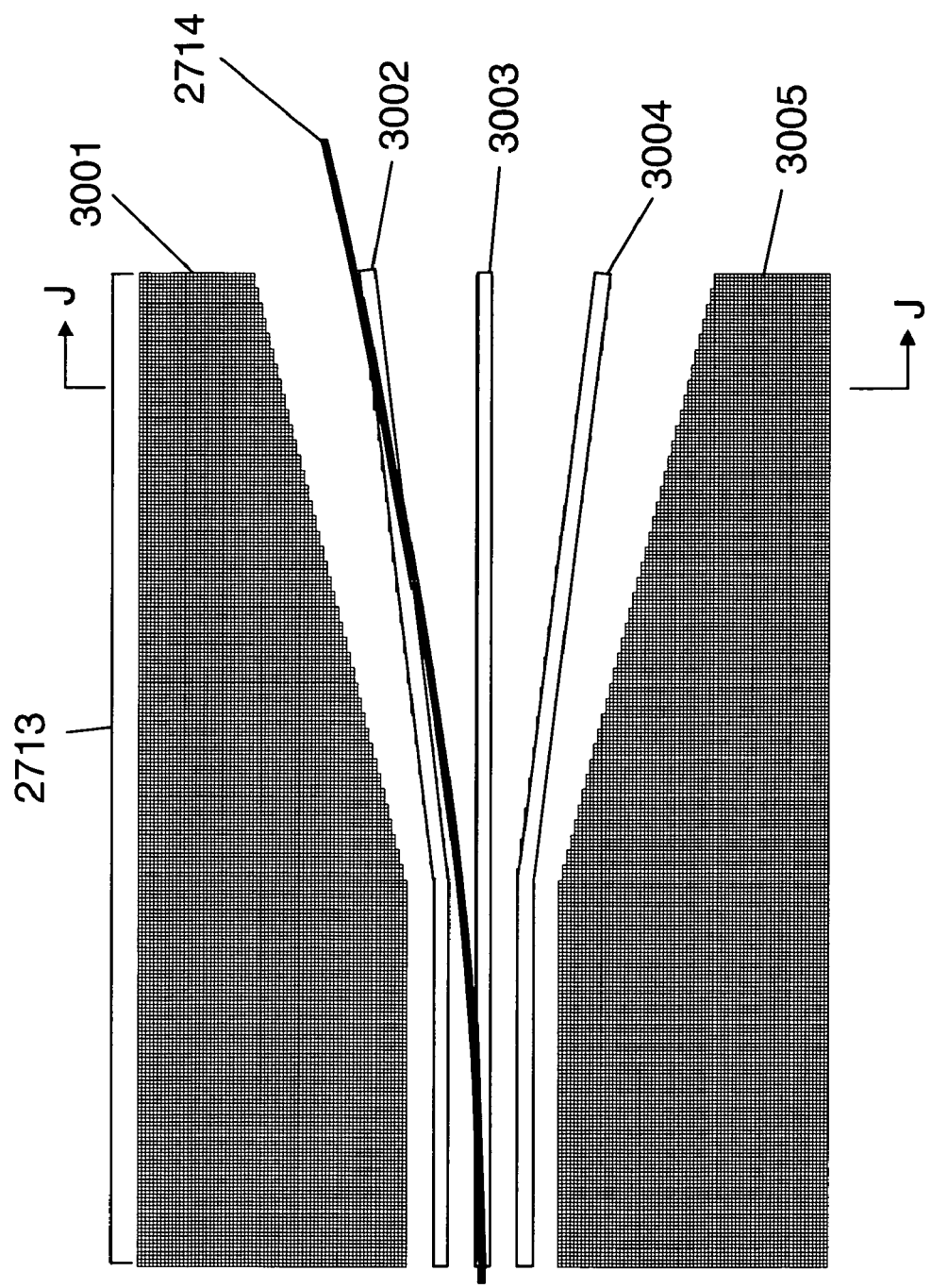
FIG. 30A is a close-up of the stigmator and deflector of FIG. 27.
Figure 30B:
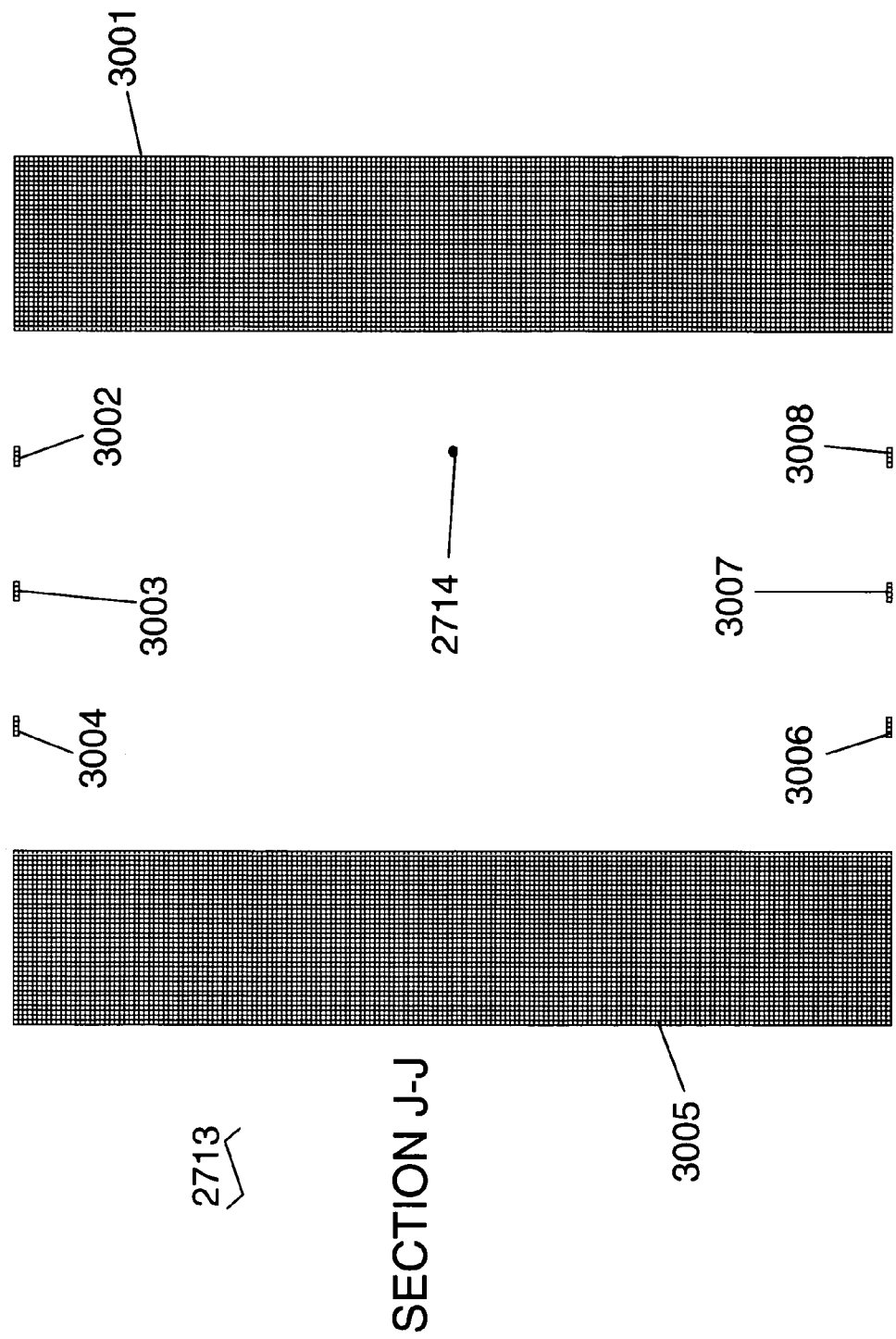
FIG. 30B shows section J-J through deflector 2713 in FIG. 30A.

FIG. 30A is a close-up cross-section of the deflector 2713 of FIG. 27 in a plane containing the main scan direction and the optical axis. FIG. 30B shows section J-J of FIG. 30A, which is a cross-section through the deflector 2713 near the lower end (end nearest the substrate 3108). The beam 2714 is being deflected towards electrode 3001 by the electric field induced by the voltages applied to the electrodes 3001-3008 of the deflector 2713. Electrodes 3002, 3004, 3006 and 3008 are straight in the upper part of deflector 2713 and are angled outwards along the main scan direction in the lower part of deflector 2713 to accommodate the displacement of the beam 2714 as shown. The lower ends of electrodes 3001 and 3005 are chamfered to accommodate the displacement of the beam 2714. Electrodes 3002-3004 and 3006-3008 are electrically conductive strips that serve to maintain the linearity of the transverse electric field, thereby improving scan uniformity.

Figure 31A:
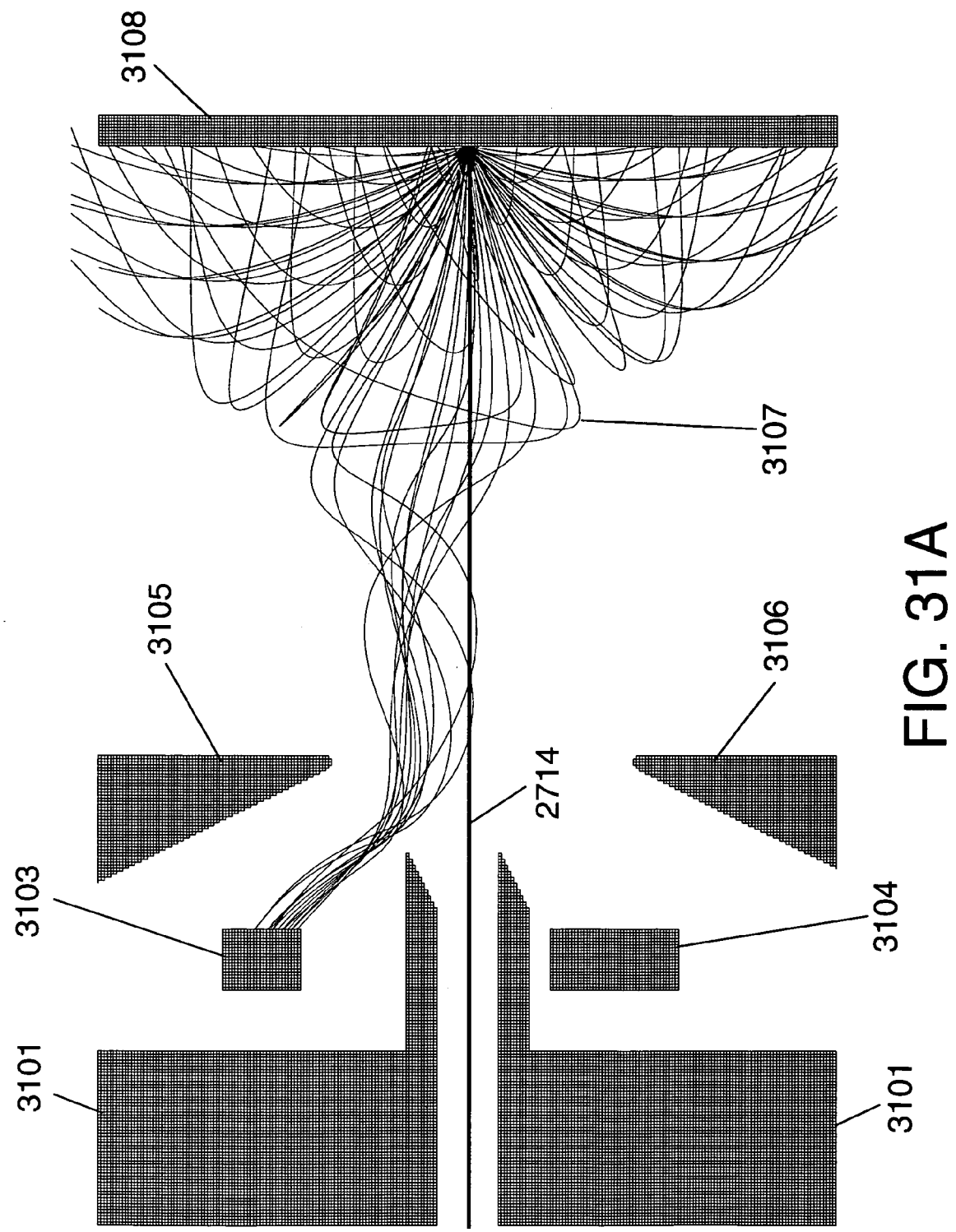
FIG. 31A is a cross-section of a second embodiment of the detector optics in a plane containing the optical axis and perpendicular to the scan axis, showing collection of secondary electrons.

FIG. 31A is a cross-section of the detector optics of the second embodiment of the invention in a plane containing the optical axis and perpendicular to the main scan axis. Due to the impact of the primary beam 2714 (at 20 keV energy) on the substrate surface 3108, secondary electrons 3107 are emitted from the substrate 3108. The figure shows the collection of secondary electrons (SEs) 3107 by the SE detector 3103. The detector optics comprises the following elements: the field-free tube (FFT) 3101, the voltage contrast electrodes (VCEs) 3105 and 3106, the SE detector 3103, and the BSE detector 3104. The FFT 3101 has two functions: (1) to shield the primary beam 2714 from the electric field induced by the bias voltage (typically +4000 V) on the SE detector 3103, and (2) to repel the secondary electrons 3107 emerging upwards from the substrate surface 3108 so that they cannot go up the column and are instead largely collected by the SE detector 3103. The VCEs 3105 and 3106 have two functions: (1) to repel the SEs 3107 emerging from the substrate 3108 and reflecting off the FFT 3101 and channel them towards the SE detector 3103, and (2) to form part of the outer wall of the lower column vacuum enclosure. The VCE 3105 has a third function of blocking BSEs from reaching the SE detector 3103. The FFT 3101 and VCEs 3105 and 3106 are typically biased −31 V relative to the substrate 3108, thus SEs 3107 emerging from the substrate 3108 with energies <30 eV cannot strike either the FFT 3101 or the VCEs 3105 and 3106. The SE detector 3103 is biased about +4000 V relative to the substrate 3108, thus SEs are strongly attracted to the SE detector 3103 as shown. The BSE detector 3104 is biased −69 V relative to the substrate 3108 to prevent any SEs from being detected on the BSE detector 3104.

Figure 31B:
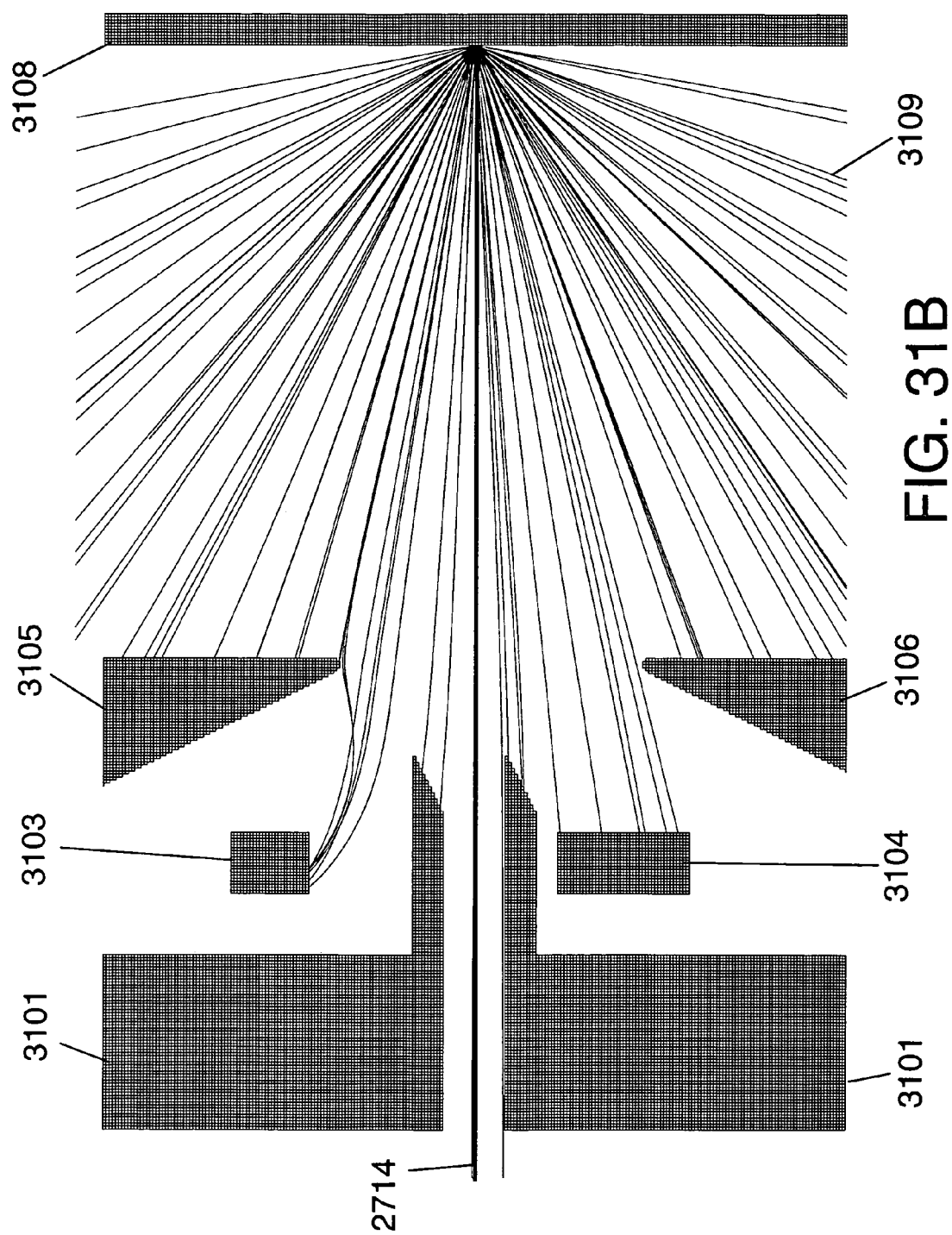
FIG. 31B shows collection of backscattered electrons by the detector optics of FIG. 31A.

FIG. 31B is the same view of the detector optics as in FIG. 31A, however in this case, only the backscattered electrons (BSEs) 3109 are visible. Since the majority of the BSEs 3109 have energies near that of the primary beam 2714 in this example, 20 keV), the trajectories of BSEs 3109 are nearly straight since all the voltages in the detector optics are <<20 kV. VCE 3105 is configured to block BSEs 3109 from being able to reach the SE detector 3103, thus preventing any BSEs 3109 from being detected on the SE detector 3103. VCE 3106 is configured to permit BSEs 3109 to strike the BSE detector 3104.

It will be understood by those skilled in the art that the foregoing descriptions are for illustrative purposes only. A number of modifications are possible within the scope of the present invention, such as:

(1) The column assembly may contain two or more parallel rows of columns, wherein each row is fabricated as described in FIGS. 4-11 or 26-31. In this implementation, a larger number of beams may be brought to bear on the substrate being inspected to enhance throughput. Alternatively, one or more rows of columns could perform a first inspection step and one or more rows could perform a second inspection step.

(2) The width of the scan field 313 may be reduced from the value of 125 mm used in the illustrative examples in the case that the substrate width is smaller and/or the required throughput is higher.

(3) The width of the scan field 313 may be increased from the value of 125 mm used in the illustrative examples in the case that the substrate width is larger and/or the required throughput is lower.

(4) The blanker 507 in the first embodiment may be implemented with a more conventional pair of flat electrodes, such as 2821 and 2822 in the second embodiment, where considerations of induced beam astigmatism are less important.

(5) The main lens 510-512 or the main lens 2710-2712 may be implemented with a different number of electrodes, and/or the lens electrodes may be shaped differently than the simple plates with cylindrical holes shown in the illustrative examples.

(6) The deflector/stigmator may be implemented with a simple cylindrical-bore octupole, instead of the combined cylindrical-conical design shown in the illustrative example—in cases of smaller scan fields, this may be a preferred implementation due to reduced complexity and cost.

Alternatively, the deflector may be implemented with greater than 8 electrodes, should more control over field uniformity be required.

(7) The electron gun may be implemented with a different number of focusing electrodes and may utilize a different type of electron source, instead of the Schottky emitter of the illustrative examples.

(8) The linear BSE detector 3104 may be divided into segments, each segment collecting BSEs for a corresponding electron beam. Furthermore, more than one BSE detector may be dedicated to each electron beam.

Although the illustrative examples refer to flat panel display substrate inspection and testing, the invention disclosed herein has potential applications in a number of fields, in particular, to those applications requiring high spatial resolution inspection, imaging or testing of a large number of locations across a large-area surface, and also to where inserting the substrate completely within a (large) high-vacuum enclosure is either undesirable or not cost-effective.

What is claimed is:

1. A charged particle optical system for the production of a charged particle beam deflectable through a large angle in the direction of a main scan axis, comprising:
   a charged particle optical assembly configured to produce a charged particle beam focused on a specimen plane; and
   an electrostatic deflector aligned on the optical axis of said optical assembly and positioned between said optical assembly and said specimen plane, said deflector having an exit aperture and an entrance aperture, said electrostatic deflector comprising:
      two parallel plates substantially perpendicular to said main scan axis and substantially parallel to said optical axis, said plates being positioned equidistant from said optical axis, said plates having chamfered inner surfaces; and
      a multiplicity of electrodes positioned peripherally in the gap between said plates, said electrodes being configured to maintain a uniform electric field transverse to said main scan axis;
   wherein said exit aperture has a larger area than said entrance aperture.

2. A charged particle optical system as in claim 1, wherein said charged particle beam is scanned across the surface of said specimen plane in the direction of said main scan axis a distance greater than 100 mm.

3. A charged particle optical system as in claim 2, wherein said charged particle beam has a focused spot size at said specimen plane of approximately 3 microns FWHM.

4. A charged particle optical system as in claim 1, wherein said charged particle optical assembly comprises:
   a charged particle source;
   a main lens; and
   an accelerating region positioned between said source and said main lens.

5. A charged particle optical system as in claim 4, further comprising a beam blanker positioned between said charged particle source and said main lens, for blanking said charged particle beam.

6. A charged particle optical system as in claim 5, wherein said beam blanker is a double-deflection beam blanker.

7. A charged particle optical system as in claim 1 wherein each of said multiplicity of electrodes is an electrically conductive strip, said strips being in planes parallel to said main scan axis and said optic axis.

8. A charged particle optical system as in claim 7 wherein some of said electrically conductive strips have angled lower ends.

9. A charged particle optical system as in claim 1 wherein said deflector has at least eight electrodes.

10. A charged particle optical system as in claim 1 further comprising a linear secondary electron detector positioned between said deflector and said specimen plane, the secondary electron detector axis being parallel to said specimen plane and parallel to and offset from said main scan axis.

11. A charged particle optical system as in claim 10 further comprising a field free tube positioned between said charged particle beam and said secondary electron detector, said field free tube being configured to shield said charged particle beam from the electric field associated with said secondary electron detector as said charged particle beam is deflected along said main scan axis.

12. A charged particle optical system as in claim 11 further comprising voltage contrast electrodes positioned between said field free tube and said specimen plane, said voltage contrast electrodes having a linear aperture, said linear aperture being aligned along said main scan axis.

13. A charged particle optical system as in claim 1 further comprising a backscattered electron detector positioned between said deflector and said specimen plane, the backscattered electron detector axis being parallel to said specimen plane and parallel to and offset from said main scan axis, wherein said charged particle beam is an electron beam.

14. A charged particle optical system as in claim 1 further comprising a dodecapole stigmator positioned between said optical assembly and said electrostatic deflector.

15. A charged particle optical system for the production of a charged particle beam deflectable through a large angle in the direction of a main scan axis comprising:
    a charged particle optical assembly configured to produce a charged particle beam focused on a specimen plane, said charged particle optical assembly comprising:
        a charged particle source;
        a main lens;
        an accelerating region positioned between said source and said main lens; and
        a beam blanker positioned between said charged particle source and said main lens, for blanking said charged particle beam, wherein said beam blanker is a double-deflection beam blanker including upper blanker plates and lower blanker plates configured to deflect said charged particle beam in opposite directions;
        wherein said charged particle optical assembly is configured to project the effective blanking plane back to the position of the virtual source, and wherein there is no charged particle beam cross-over in said beam blanker; and
    an electrostatic deflector aligned on the optical axis of said optical assembly and positioned between said optical assembly and said specimen plane, said deflector having an exit aperture and an entrance aperture, wherein said exit aperture has a larger area than said entrance aperture.

16. A charged particle optical system as in claim 15 wherein said charged particle beam is scanned across the surface of said specimen plane in the direction of said main scan axis a distance greater than 100 mm.

17. A charged particle optical system as in claim 16 wherein said charged particle beam has a focused spot size at said specimen plane of approximately 3 microns FWHM.

18. A charged particle optical system as in claim 15 wherein said electrostatic deflector has a conically shaped inner surface, said conical surface being aligned on the optical axis of said optical assembly.

19. A charged particle optical system as in claim 15 wherein said electrostatic deflector is an octupole deflector.

20. A charged particle optical system as in claim 15 wherein said electrostatic deflector comprises:
    two parallel plates substantially perpendicular to said main scan axis and substantially parallel to said optical axis, said plates being positioned equidistant from said optical axis, said plates having chamfered inner surfaces; and
    a multiplicity of electrodes positioned peripherally in the gap between said plates, said electrodes being configured to maintain a uniform electric field transverse to said main scan axis.

21. A charged particle optical system as in claim 20 wherein each of said multiplicity of electrodes is an electrically conductive strip, said strips being in planes parallel to said main scan axis and said optic axis.

22. A charged particle optical system as in claim 21 wherein some of said electrically conductive strips have angled lower ends.

23. A charged particle optical system as in claim 20 wherein said deflector has at least eight electrodes.

24. A charged particle optical system as in claim 15 further comprising a linear secondary electron detector positioned between said deflector and said specimen plane, the secondary electron detector axis being parallel to said specimen plane and parallel to and offset from said main scan axis.

25. A charged particle optical system as in claim 24 further comprising a field free tube positioned between said charged particle beam and said secondary electron detector, said field free tube being configured to shield said charged particle beam from the electric field associated with said secondary electron detector as said charged particle beam is deflected along said main scan axis.

26. A charged particle optical system as in claim 25 further comprising voltage contrast electrodes positioned between said field free tube and said specimen plane, said voltage contrast electrodes having a linear aperture, said linear aperture being aligned along said main scan axis.

27. A charged particle optical system as in claim 15 further comprising a backscattered electron detector positioned between said deflector and said specimen plane, the backscattered electron detector axis being parallel to said specimen plane and parallel to and offset from said main scan axis, wherein said charged particle beam is an electron beam.

28. A charged particle optical system as in claim 15 further comprising a dodecapole stigmator positioned between said beam blanker and said electrostatic deflector.

* * * * *